US012664326B2

(12) United States Patent
Brudy et al.

(10) Patent No.: US 12,664,326 B2
(45) Date of Patent: Jun. 23, 2026

(54) TECHNIQUES INCORPORATED INTO DESIGN SOFTWARE FOR GENERATING SUSTAINABILITY INSIGHTS

(71) Applicant: AUTODESK, INC., San Francisco, CA (US)

(72) Inventors: Frederik Brudy, Toronto (CA); Dagmara Lilianna Szkurlat, London (GB); Vikram-Jit Singh Benipal, Brampton (CA); Michael Ziye Fan, Toronto (CA); Andrew Gareth Lewis Jones, Bristol (GB); Justin Frank Matejka, Newmarket (CA); Zoé Samiha Valentine Bezpalko, Cazadero, CA (US); Lorenzo Villaggi, Brooklyn, NY (US); Fraser Anderson, Toronto (CA); George Fitzmaurice, Toronto (CA); Patrick Nadeau, Toronto (CA); Benjamin James Thompson, San Rafael, CA (US); Daniel Noviello, Melbourne (AU); Arthur Harsuvanakit, Berkeley, CA (US)

(73) Assignee: AUTODESK, INC., San Francisco, CA (US)

( * ) Notice: Subject to any disclaimer, the term of this patent is extended or adjusted under 35 U.S.C. 154(b) by 0 days.

(21) Appl. No.: 18/329,502

(22) Filed: Jun. 5, 2023

(65) Prior Publication Data

US 2024/0095414 A1     Mar. 21, 2024

Related U.S. Application Data

(60) Provisional application No. 63/375,763, filed on Sep. 15, 2022.

(51) Int. Cl.
*G06F 30/12*        (2020.01)
*G06F 3/0481*       (2022.01)
(Continued)

(52) U.S. Cl.
CPC ............ *G06F 30/12* (2020.01); *G06F 3/0481* (2013.01); *G06F 3/04842* (2013.01);
(Continued)

(58) Field of Classification Search
None
See application file for complete search history.

(56) References Cited

U.S. PATENT DOCUMENTS

| | | | | |
|---|---|---|---|---|
| 2010/0179794 A1* | 7/2010 | Shah | ........................ | G06F 30/00 |
| | | | | 703/6 |
| 2011/0015798 A1* | 1/2011 | Golden | .................. | G06Q 10/06 |
| | | | | 700/286 |

(Continued)

OTHER PUBLICATIONS

VectorWorks, "Energos", Sep. 15, 2015, YouTube, <URL: https://www.youtube.com/watch?v=unjp-WuSL20>, retrieved Feb. 20, 2025 (Year: 2015).*

(Continued)

*Primary Examiner* — Christopher J Fibbi
(74) *Attorney, Agent, or Firm* — Artegis Law Group, LLP

(57)        ABSTRACT

In various embodiments a computer-implemented method for providing sustainability insights to a user designing an object. The method includes determining a value of a sustainability metric associated with a design of an object; determining a target value for the sustainability metric; determining an amount of progress made towards achieving the target value for the sustainability metric based on the value of the sustainability metric and the target value for the sustainability metric; and displaying, via a graphical user interface (GUI), a visual indication of the amount of progress made towards achieving the target value for the sustainability metric.

19 Claims, 31 Drawing Sheets

(51) Int. Cl.

| | |
|---|---|
| *G06F 3/04842* | (2022.01) |
| *G06F 30/20* | (2020.01) |
| *G06T 3/40* | (2006.01) |
| *G06T 11/00* | (2006.01) |

(52) U.S. Cl.
CPC ................ *G06F 30/20* (2020.01); *G06T 3/40* (2013.01); *G06T 11/00* (2013.01); *G06T 2200/24* (2013.01)

(56) References Cited

U.S. PATENT DOCUMENTS

| | | | | |
|---|---|---|---|---|
| 2011/0095897 | A1* | 4/2011 | Sutrave | G06Q 10/00 340/635 |
| 2011/0246381 | A1* | 10/2011 | Fitch | G06Q 50/06 703/2 |
| 2012/0323382 | A1* | 12/2012 | Kamel | G06Q 50/06 700/286 |
| 2013/0246010 | A1* | 9/2013 | Dershowitz | H02S 50/00 703/1 |
| 2014/0358293 | A1* | 12/2014 | Fadell | F24F 11/523 700/276 |
| 2015/0234944 | A1* | 8/2015 | Marceau | G06F 30/23 703/1 |
| 2019/0310667 | A1* | 10/2019 | Brown | G08B 21/18 |
| 2022/0011731 | A1 | 1/2022 | Risbeck et al. | |
| 2022/0214666 | A1 | 7/2022 | King et al. | |
| 2022/0269838 | A1* | 8/2022 | Degen | G06F 40/30 |
| 2023/0152763 | A1* | 5/2023 | Davis | G05B 15/02 700/275 |
| 2023/0350387 | A1* | 11/2023 | Davis | G05B 19/4155 |

OTHER PUBLICATIONS

MasterAnalytics, "How to Create Diverging Bar Chart in Tableau", Apr. 18, 2020, YouTube, <URL: https://www.youtube.com/watch?v=H9uggTwnfcY>, retrieved Jun. 25, 2025 (Year: 2020).*
Extended European Search Report for Application No. 23197639.0 dated Feb. 8, 2024.
Extended European Search Report for Application No. 23197640.8 dated Feb. 13, 2024.

* cited by examiner

700

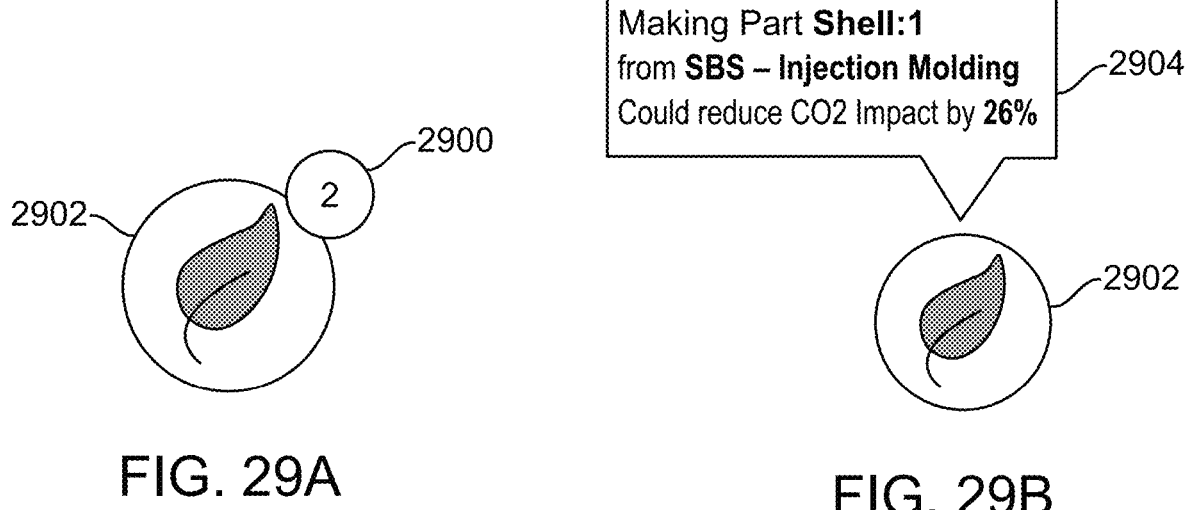
FIG. 29A
FIG. 29B
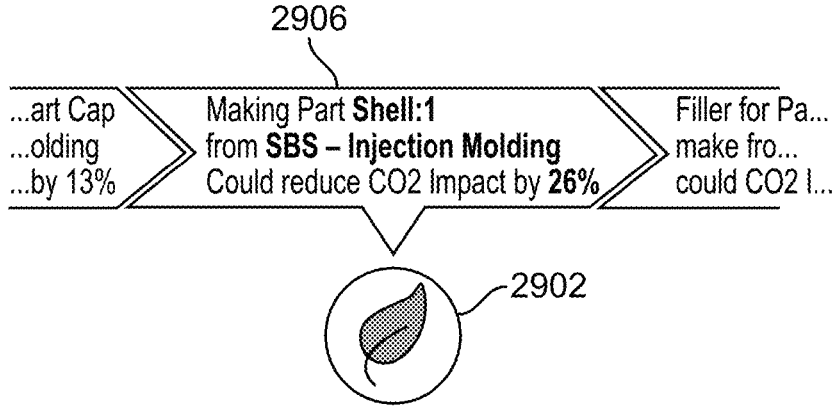
FIG. 29C

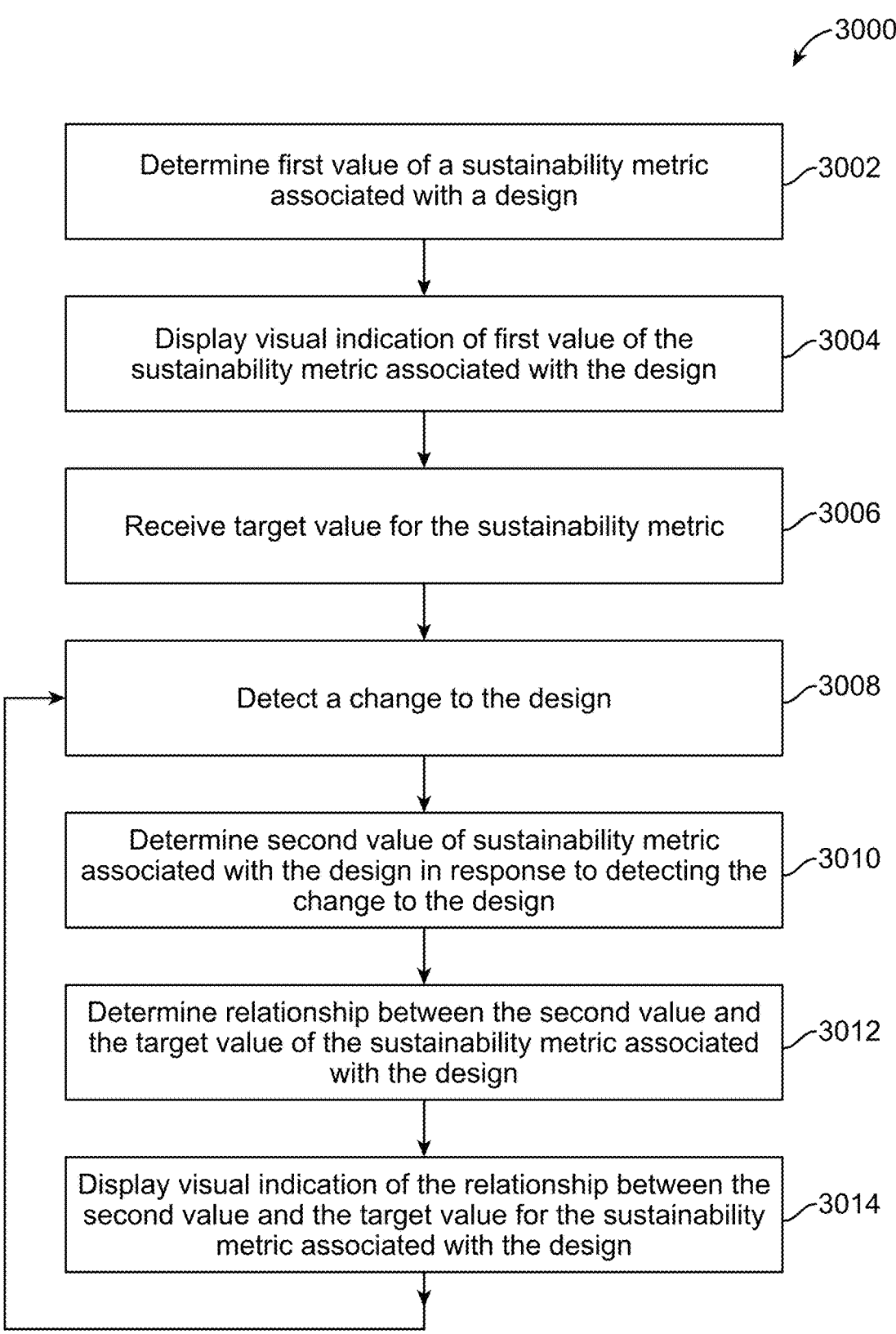

3000

Determine first value of a sustainability metric associated with a design — 3002

Display visual indication of first value of the sustainability metric associated with the design — 3004

Receive target value for the sustainability metric — 3006

Detect a change to the design — 3008

Determine second value of sustainability metric associated with the design in response to detecting the change to the design — 3010

Determine relationship between the second value and the target value of the sustainability metric associated with the design — 3012

Display visual indication of the relationship between the second value and the target value for the sustainability metric associated with the design — 3014

FIG. 30

TECHNIQUES INCORPORATED INTO DESIGN SOFTWARE FOR GENERATING SUSTAINABILITY INSIGHTS

CROSS-REFERENCE TO RELATED APPLICATIONS

This application claims priority benefit of the U.S. Provisional Patent Application titled, "TECHNIQUES INCORPORATED INTO DESIGN SOFTWARE FOR GENERATING SUSTAINABILITY INSIGHTS," filed on Sep. 15, 2022 and having Ser. No. 63/375,763. The subject matter of this related application is hereby incorporated herein by reference.

BACKGROUND

Technical Field

Embodiments of the present disclosure relate generally to computer aided design and, more specifically, to providing sustainability insights during a computer aided design process.

Description of the Related Art

When designing an object, designers, such as engineers or architects, might desire to create an object that is environmentally sustainable. An object might be considered environmentally sustainable if the object has minimal, or reduced, negative impacts on the environment over the life-cycle of the object. Various sustainability metrics associated with the manufacturing and/or usage of an object can be used to quantify, or measure, the sustainability of an object. Some non-limiting examples of sustainability metrics associated with an object can include carbon emissions of the object, energy efficiency during manufacturing and/or use of the object, natural resource consumption required to manufacture and/or operate the object, etc. Accordingly, when designing a sustainable object, designers attempt to improve the sustainability metrics associated with the design of the object (e.g., reduce carbon emissions of the object, improve energy efficiency of the object, etc.) and/or attempt to achieve one or more target sustainability metrics associated with the design of the object.

In conventional design systems, when designing an object, determining the sustainability impact of a change to the design, such as the addition of a new component to the object, is typically a deliberate and involved process. The process often requires repeated switching between lookup tables, external Life Cycle Assessment (LCA) software, spreadsheets, and computer aided design (CAD) software. Further, given the inconveniences associated with evaluating the sustainability metrics of a design, the design process in most scenarios proceeds without any evaluation of sustainability until the design is finalized.

One drawback to conventional design systems is that designers are unable to integrate the sustainability analysis during the design phase of an object and wait until much of the environmental performance of the design has been established and is difficult and/or costly to change. As a result, the final design of an object often includes design choices that are non-optimal from a sustainability perspective. In certain scenarios, the design system's deficiency in tracking sustainability metrics during the conceptual and detailed phases of designing the object, leads to designs that entirely fail to achieve a final object design that satisfies target sustainability metrics. This requires the design process to restart, which is computationally inefficient and wasteful.

As the foregoing illustrates, what is needed in the art are more effective techniques for providing sustainability insights to designers throughout the process of designing an object.

SUMMARY

One embodiment sets forth a computer-implemented method for providing sustainability insights to a user designing an object. The method includes determining a value of a sustainability metric associated with a design of an object; determining a target value for the sustainability metric; determining an amount of progress made towards achieving the target value for the sustainability metric based on the value of the sustainability metric and the target value for the sustainability metric; and displaying, via a graphical user interface (GUI), a visual indication of the amount of progress made towards achieving the target value for the sustainability metric.

At least one technical advantage of the disclosed techniques relative to the prior art is that, in the disclosed techniques, sustainability goals for the design of an object can be more easily achieved when designing the object. In particular, in the disclosed techniques, visual indications of the impact on one or more sustainability metrics associated with the object design are presented to a designer in real-time as the designer makes changes to the design. In this regard, designers can readily determine the sustainability impact on the design that is caused by a change, such as adding a component to the object or changing a material included in the object. Thus, in response to determining that a design change has a negative impact on the sustainability metrics associated with the object design, a designer can identify and implement alternative options for changing the design that improve the sustainability metrics before the design of the object is finalized. At least another technical advantage of the disclosed techniques relative to the prior art is that, in the disclosed techniques, the time taken to evaluate a change in sustainability metrics associated with a design change can be greatly reduced. In particular, in the disclosed techniques, calculations for determining changes in the sustainability metrics associated with a design change can be offloaded to and performed by one or more backend services that have access to a repository of sustainability metrics associated with various material types. In this regard, evaluating the sustainability metrics associated with a design change, such as an addition of a component to an object and/or a change in material choice of component in the object, can be achieved without switching between lookup tables, external Life Cycle Assessment (LCA) software, spreadsheets, and CAD software.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 29A-29C illustrate example visual indications of suggestions for improving one or more sustainability metrics, according to various embodiments of the present disclosure.

FIG. 30 illustrates an example process for generating sustainability insights, according to various embodiments of the present disclosure.

DETAILED DESCRIPTION

In the following description, numerous specific details are set forth to provide a more thorough understanding of the embodiments of the present invention. However, it will be apparent to one of skill in the art that the embodiments of the present invention may be practiced without one or more of these specific details.

System Overview

Figure 1:
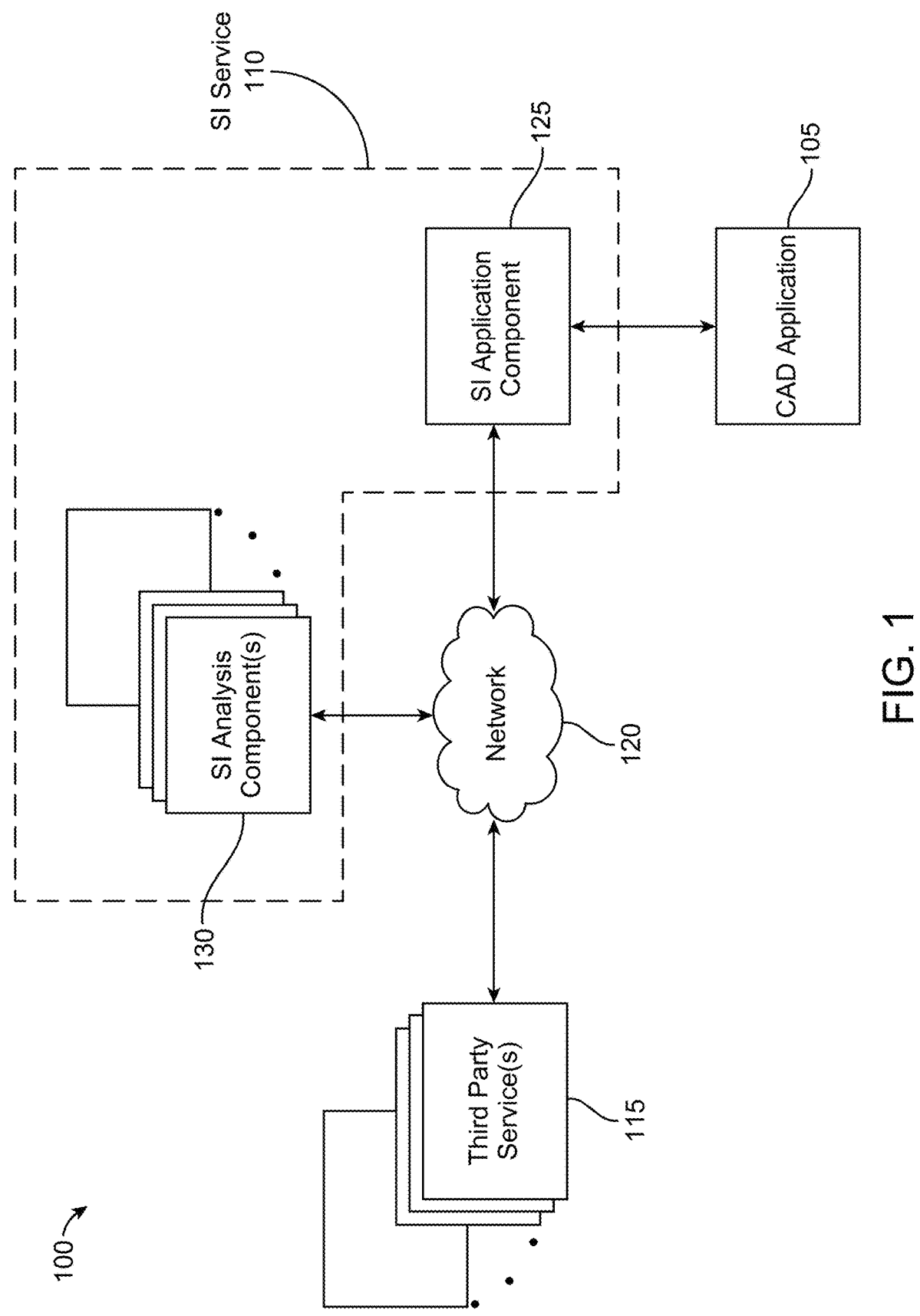
FIG. 1 illustrates a CAD environment for generating sustainability insights during a design process, according to various embodiments of the invention.

FIG. 1 is a block diagram illustrating a system 100 for generating sustainability insights during a design process, according to various embodiments of the invention. As shown, the system 100 includes a computer aided design (CAD) application 105, a sustainability insights (SI) service 110, third party services 115, and a communication network 120 that connects one or more components of the system 100. The SI service 110 includes an SI application component 125 and SI analysis components 130. In the following description, third party services 115 can be referred to individually as third party service 115 and SI analysis components 130 can be referred to individually as SI analysis component 130.

As will be described in more detail below, the SI service 110 provides sustainability insights associated with a design (e.g., 3D model) of an object that is generated and edited using the CAD application 105. The CAD application 105 can comprise any type of design and/or engineering-based applications, such as a CAD application, a computer-aided engineering (CAE) application, a modeler application, a geometry generator application, a software engineering suite, or the like. In some embodiments, CAD application 105 is stored and executed locally on a client computing device, such as a desktop computer, a laptop computer, a mobile device, or any other type of computing device suitable for practicing various embodiments. In other embodiments, CAD application 105 is executed remotely on a server. In such instances, a client computing device accesses, via a network (e.g., network 120), CAD application 105 to generate and edit a design of an object.

In operation, a user interacting with a graphical user interface (GUI) of a computing device executing the CAD application 105 can edit, or make changes to, the design of an object. For example, making changes to the design of the object using CAD application 105 can include, without limitation, adding a component to the design, changing the shape of the design, changing a material included in the design, changing a manufacturing method of the design, or changing some other relevant manufacturing and/or object properties associated with the design. When a user makes a change to the design of the object using CAD application 105, SI service 110 determines in real-time how the change to the design affects one or more sustainability metrics associated with the design. Sustainability metrics associated with the design of the object are indicative of the environmental sustainability of the design and can include, without limitation, a price of manufacturing the design, carbon emissions associated with the design, energy efficiency associated with operating the design, the recyclability of the design, water toxicity associated with the design, or some other metric associated with the environmental sustainability of the design. In other words, a sustainability metric quantifies, or is a measure of, a particular aspect associated with the sustainability of the design of an object. Furthermore, the SI service 110 displays in real-time, via the GUI of the computing device on which CAD application 105 is executing, a visual indication as to how the change to the design affects one or more sustainability metrics associated with the design of the object. For example, the SI service 110 displays, on the same GUI on which a user edits the design (e.g., 3D model) of the object, a widget that indicates in real-time the impact of a change to the design on one or more sustainability metrics associated with the design. In some embodiments, the SI service 110 displays the widget on a secondary display device that is different than the display device on which the GUI with which the user edits the design of the object is displayed. For example, the SI service

110 displays the widget on a display of a secondary device such as secondary monitor, a phone, a tablet, or some other display device.

As shown in FIG. 1, the SI service 110 includes an SI application component 125 and SI analysis components 130. In the following description, actions described as being performed by the SI application component 125 or the SI analysis components 130 can also be collectively referred to as actions performed by the SI service 110. In some embodiments, the SI application component 125 is implemented as a plug-in or extension to the CAD application 105. In such embodiments, SI application component 125 is executed locally along with the CAD application 105 on a computing device. In other embodiments, the SI application component 125 is implemented remotely on a server. In such embodiments, SI application component 125 connects to the CAD application 105 via a network, such as network 120.

In some embodiments, the SI application component 125 is implemented by a first computing device and the one or more SI analysis components 130 are implemented by one or more other computing devices. In one example, the SI application component 125 is implemented by the computing device executing the CAD application 105 and the SI analysis components 130 are implemented by one or more servers connected to system 100. In such embodiments, the SI application component 125 connects to the SI analysis components 130 via a network, such as network 120, to share information associated with the design of the object being modelled with CAD application 105. In other embodiments, the SI application component 125 and the SI analysis components 130 are implemented by the same computing device, such as the computing device implementing CAD application 105 or a server connected to the computing device implementing CAD application 105. In some embodiments, the SI application component 125 and the SI analysis components 130 are implemented as a single component.

In operation, the SI application component 125 captures, or determines, design data associated with the design when a user makes a change to the design with CAD application 105. In various embodiments, the SI application component 125 captures, or determines, the design data in real-time as the changes are made to the object design. For example, the SI application component 125 captures the design data in response to detecting a change to the design. The captured design data can include, without limitation, one or more physical properties, such as dimensions, material types, weights, etc., of the design of the object at the time a change is made to the design. The SI application component 125 then provides, for example via network 120, the design data to the one or more SI analysis components 130.

Based on the design data received from the SI application component 125, the one or more SI analysis components 130 calculate one or more sustainability metrics associated with the design of the object based on the received design data. Calculating one or more sustainability metrics associated with the design of the object can include, without limitation, calculating new values of one or more sustainability metrics associated with the design, updating existing values of one or more sustainability metrics associated with the design, determining differences between old values and updated values of one or more sustainability metrics associated with the design, determining how to improve one or more sustainability metrics associated with the design, and/or determining other information associated with sustainability metrics of the design. The SI analysis components 130 then transmit the calculated sustainability metric(s) back to SI application component 125, which displays a visual indication of the sustainability metrics associated with the design of the object in real-time as a user edits the design in CAD application 105.

In various embodiments, the SI application component 125 displays a visual indication of the sustainability metrics within a periphery of the workspace of CAD application 105 as a user edits the design. As will be described in more detail below, a visual indication of the sustainability metrics can include one or more of an indication as to how a recent change to the design affects one or more sustainability metrics associated with the design, an indication as to how an individual component of the design contributes to one or more sustainability metrics associated with the design, a suggestion for improving one or more sustainability metrics associated with the design, a timeline view indicative of how sustainability metrices associated with the design have changed over time, and/or other information indicative of sustainability metrics associated with the design. In some embodiments, the SI application component 125 displays the visual indication of the sustainability metrics on a secondary display device that is different that the display device on which the on which the user edits the design of the object with CAD application 105. For example, the SI application component 125 displays the widget on a display of a secondary device such as secondary monitor, a phone, a tablet, or some other display device.

In some embodiments, a respective SI analysis component 130 calculates a single sustainability metric associated with the design of the object based on the received design data. In such embodiments, a different SI analysis component 130 is used to calculate each respective sustainability metric associated with the design of the object. As an example, a first SI analysis component 130 calculates a first sustainability metric (e.g., price) associated with the design of the object, a second SI analysis component 130 calculates a second sustainability metric (e.g., carbon emissions) associated with the design of the object, and a third SI analysis component 130 calculates a third sustainability metric (e.g., energy efficiency) associated with the design of the object. In other embodiments, a single SI analysis component 130 can calculate more than one sustainability metric and/or all sustainability metrics associated with the design of the object.

In some instances, an SI analysis component 130 calculates a sustainability metric associated with the design of the object locally. That is, an SI analysis component 130 can calculate, based on the design data received from SI application component 125, a sustainability metric associated with the design using data that is stored locally within the SI service 110 and is associated with one or more of the pricing of the materials included in the design of the object, sustainability parameters (e.g., carbon emissions, energy efficiency, toxins, etc.) of the materials included in the design of the object, and/or information associated with the sustainability of the object design. As an example, if a user changes the object design by adding a steel beam to the object, SI analysis component 130 can use data stored locally within the SI service 110 that is associated with the pricing and/or sustainability parameters associated with steel when calculating a sustainability metric associated with the design of the object. Data is considered to be stored locally within the SI service 110 when the data is stored on a computing device used to implement one or more of the SI application component 125 or the SI analysis components 130.

However, in some instances, data necessary for calculating a sustainability metric might not be stored locally within the SI service 110. For example, a user might change the object design by adding a component made of a particular material to the design, but pricing and/or sustainability data associated with that particular material might not be stored locally within the SI service 110. In such instances, the SI analysis component 130 can access, via network 120, one or more third party services 115 to acquire data associated with the particular material of the component that was added to the object. In some instances, the SI analysis component 130 requests and receives data associated with the particular material of the component from the one or more third party services 115. In such instances, SI analysis component 130 then calculates the sustainability metric associated with the design of the object based on the particular material data received from the third party services 115 and the design data received from the SI application component 125. In other instances, SI analysis component sends the design data received from the SI application component 125 to the one or more third party services 115. In such instances, the one or more third party services then calculate one or more sustainability metric associated with the design of the object based on the particular material data stored externally at the one or more third party services 115 and the design data received from the SI analysis component 130. Furthermore, in such instances, the one or more third party services 115 then transmit the calculated sustainability metrics associated with the design of the object to the SI analysis component 130, which then sends the calculated sustainability metric to the SI application component 125 to be displayed in real-time within the workspace of CAD application 105.

Figure 2:
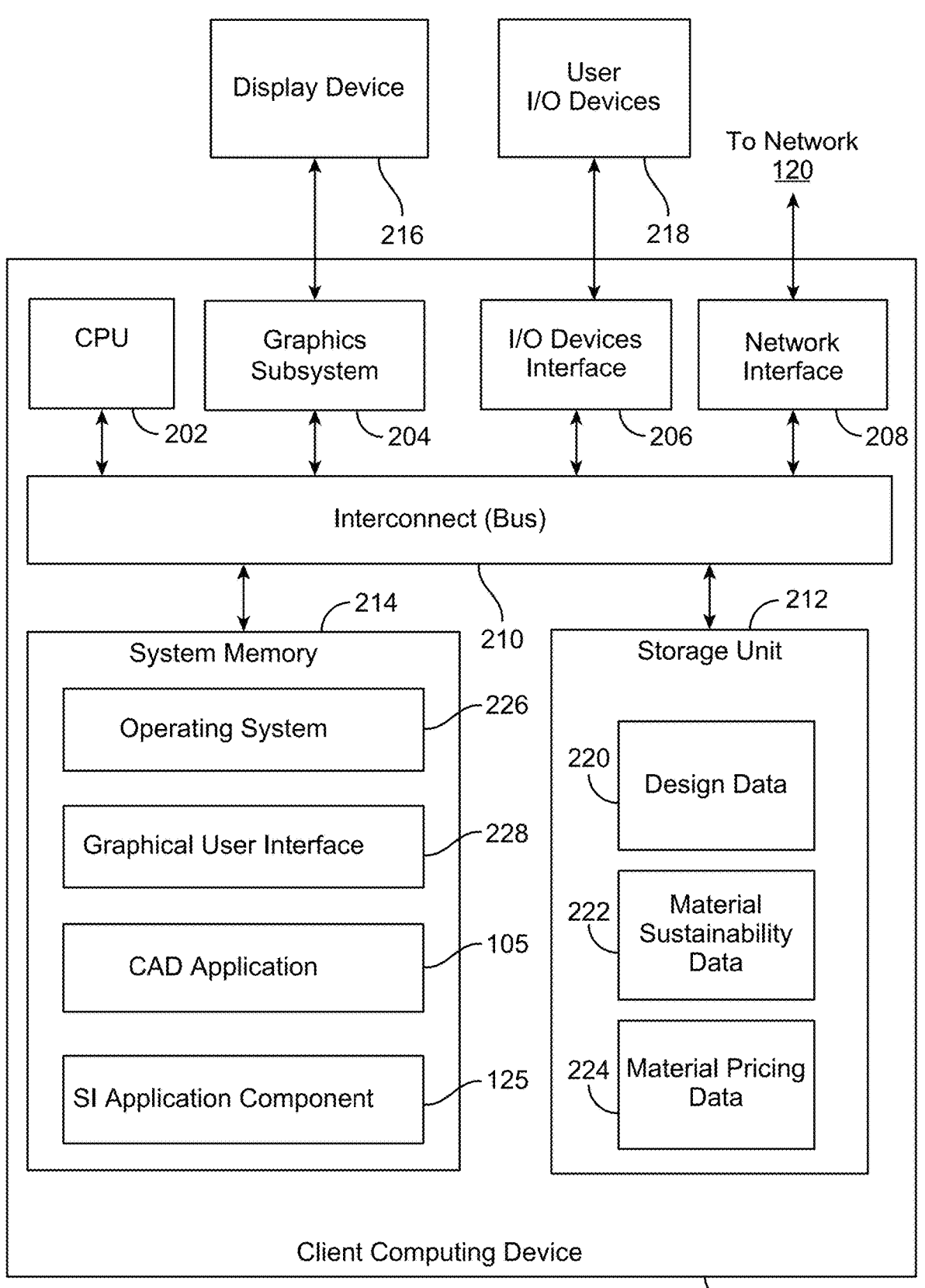
FIG. 2 is a block diagram of a client device that implements the CAD application of FIG. 1, according to various embodiments of the present invention.

FIG. 2 is a block diagram of an example client computing device 200 that can be used to implement the CAD application 105 and/or the SI application component 125 in conjunction with the system 100 of FIG. 1, according to various embodiments of the present invention. The client computing device 200 can be implemented as, without limitation, a desktop computer, a laptop computer, a mobile device, or any other type of computing device suitable for practicing various embodiments. As shown, the client computing device 200 can include, without limitation, a CPU 202, a graphics subsystem 204, an I/O device interface 206, a network interface 208, an interconnect 210, a storage unit 212, and a system memory 214.

In some embodiments, the CPU 202 is configured to retrieve and execute programming instructions, such as CAD application 105 and/or SI application component, stored in the system memory 214. Similarly, the CPU 202 is configured to store and retrieve application data (e.g., software libraries) residing in the system memory 214. The interconnect 210 is configured to facilitate transmission of data, such as programming instructions and application data, between the CPU 202, graphics subsystem 204, I/O devices interface 206, network interface 208, storage unit 212, and system memory 214.

In some embodiments, the graphics subsystem 204 is configured to generate frames of image and/or video data and transmit the frames of image and/or video data to display device 216. In some embodiments, the graphics subsystem 204 can be integrated into an integrated circuit, along with the CPU 202. The display device 216 can comprise any technically feasible means for generating an image for display. For example, the display device 216 can be fabricated using liquid crystal display (LCD) technology, cathode-ray technology, and light-emitting diode (LED) display technology. An input/output (I/O) device interface 206 is configured to receive input data from user I/O devices 218 and transmit the input data to the CPU 202 via the interconnect 210. For example, user I/O devices 218 can comprise one of more buttons, a keyboard, and a mouse or other pointing device. The I/O device interface 206 also includes an audio output unit configured to generate an electrical audio output signal.

The network interface 208 is configured to transmit and receive data associated with the design of the object via the network 120. For example, the network interface 208 is used to transmit design data from the CAD application 105 and/or the SI application component 125 to the SI analysis components 130 and/or third party services 115. As another example, the network interface 208 is used to receive information associated with one or more sustainability metrics from the SI analysis components 130 and/or third party services 115. In some embodiments, the network interface 208 is configured to communicate using the well-known Ethernet standard. The network interface 208 is coupled to the CPU 202 via the interconnect 210.

A storage unit 212, such as a hard disk drive or flash memory storage drive, is configured to store non-volatile data. For example, the storage unit 212 can store one or more of design data 220 associated with the design of the object, material sustainability data 222 associated with sustainability parameters for various materials that can be used to create and/or edit the design of an object in CAD application 105, material pricing data 224 associated with pricing for various materials that can be used to create and/or edit the design of an object in CAD application 105, and/or other data. The design data 220 can include data associated with the design of the object that SI application component 125 sends to SI analysis components 130 for determining one or more sustainability metrics associated with the design of the object. For example, the design data 220 includes one or more physical properties, such as dimensions, material types, weights, etc., associated with the design of the object. In some embodiments, the storage unit 212 does not store data associated with sustainability parameters and/or pricing for materials. In some embodiments, the design data 220 can further include sustainability metrics associated with previous versions of the designs and/or sustainability metrics associated with the design before one or more changes were made to the design.

The system memory 214 includes programming instructions and application data that comprise an operating system 226, a graphical user interface (GUI) 228, the CAD application 105 and/or the SI application component 125. The operating system 226 performs system management functions such as managing hardware devices including the graphics subsystem 204, I/O devices interface 206, network interface 208, and storage unit 212. The operating system 226 also provides process and memory management models for the GUI 228, the CAD application 105, and/or the SI application component 125. The GUI 228, such as a window and object metaphor, provides a mechanism for user interaction with the client computing device 200. Moreover, the GUI 228 provides a mechanism for user interaction with the CAD application 105 and/or an instance of CAD application 105 executing on the client computing device 200. Persons skilled in the art will recognize the various operating systems and user interfaces that are well-known in the art and suitable for incorporation into the client computing device 200.

In the illustrated embodiment of FIG. 2, the CAD application 105 and the SI application component 125 are shown and described as being stored in system memory 214 of the client computing device 200. However, as described above, persons skilled in the art will understand that the CAD application 105 and/or the SI application component 125 can be executed on other types of computing devices, separate computing devices, and/or remotely on one or more servers. For example, as described above, in some embodiments the CAD application 105 is executed remotely on a server. In such embodiments, a compute instance executing on client computing device 200 accesses, via a network (e.g., network 120), the CAD application 105 executing on the server such that a user of client computing device 200 can interact with the CAD application 105 using GUI 228. Furthermore, as described above, in some embodiments the SI application component 125 executes remotely on a server while CAD application 105 executes on client computing device 200. In such embodiments, the SI application component 125 connects to the CAD application 105 via a network, such as network 120. In some embodiments, the SI application component 125 is integrated within CAD application 105. In such embodiments, the CAD application 105 performs one or more of the functions described herein as being performed by the SI application component 125 and/or the SI service 110.

Figure 3:
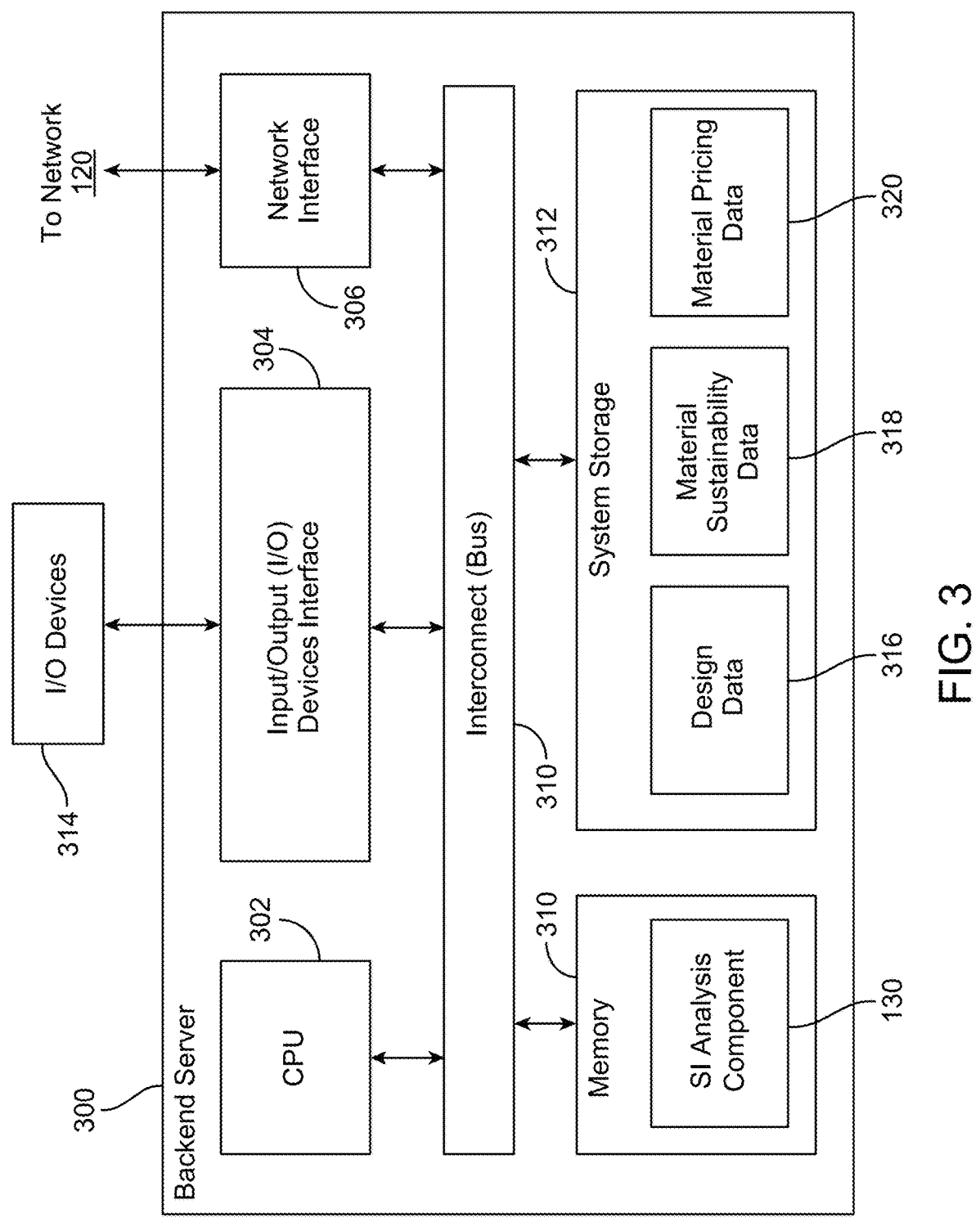
FIG. 3 is a block diagram of a backend server that implements the analysis service(s) of FIG. 1, according to various embodiments of the present invention.

FIG. 3 is a block diagram of a backend server 300 that can be used to implement one or more SI analysis components 130 in conjunction with the system 100 of FIG. 1, according to various embodiments of the present invention. The backend server 300 can be implemented as, without limitation, a server, a desktop computer, a laptop computer, a mobile device, or any other type of computing device suitable for practicing various embodiments. As shown in FIG. 3, the backend server 300 includes, without limitation, a central processing unit (CPU) 302, an input/output (I/O) devices interface 304, a network interface 306, an interconnect 308, a system memory 310, and system storage 312.

In some embodiments, the CPU 302 is configured to retrieve and execute programming instructions, such as SI analysis component 130, stored in the system memory 310. Similarly, the CPU 302 is configured to store application data (e.g., software libraries) and retrieve application data from the system memory 310. The interconnect 308 is configured to facilitate transmission of data, such as programming instructions and application data, between the CPU 302, the I/O devices interface 304, the network interface 306, the system memory 310, and the system storage 312. The I/O devices interface 304 is configured to receive input data from I/O devices 314 and transmit the input data to the CPU 302 via the interconnect 308. For example, I/O devices 314 can include one or more buttons, a keyboard, a mouse, and/or other input devices. The I/O devices interface 304 is further configured to receive output data from the CPU 302 via the interconnect 308 and transmit the output data to the I/O devices 314.

The system storage 312 can include one or more hard disk drives, solid state storage devices, or similar storage devices. The system storage 312 is configured to store non-volatile data such as files (e.g., audio files, video files, subtitles, application files, software libraries, etc.). For example, the system storage 312 is configured to store one or more of design data 316, material sustainability data 318, material pricing data 320, and/or other data associated with the design of the object. The design data 316 can include data associated with one or more object designs that were created and/or edited using the CAD application 105. For example, the design data 316 includes one or more physical properties, such as dimensions, material types, weights, etc., associated with the designs of objects. Moreover, the design data 316 can include information associated with previous and current versions of an object designed using the CAD application 105. For example, the design data 316 can include data indicative of sustainability metrics associated with previous versions of the design and/or a current version of the design. In some embodiments, the design data 316 can include a timeline, or history, indicative of how sustainability metrics associated with a design as the design changed over time. The design data 316 can also include information associated with object design benchmarks and/or other goals associated with designing the object. In some embodiments, the design data 220 received, via network 120, from the CAD application 105 and/or the SI application component 125 can be stored in the system storage 312 as design data 316.

The material sustainability data 318 includes information associated with sustainability parameters for a wide range of materials that can be used to create and/or edit the design of an object in the CAD application 105. As an example, the material sustainability data 318 can be implemented as one or more network-connected catalogs and/or tables of material data sheets that include information associated with sustainability parameters, such as carbon emissions, energy efficiency, embodied carbon, weights, etc., used by the SI analysis component 130 to calculate one or more sustainability metrics associated with an object design. The material sustainability data 318 can be updated periodically or on an ad-hoc basis. Similarly, the material pricing data 320 includes information associated with pricing for a wide range of materials that can be used to create and/or edit the design of an object in the CAD application 105. For example, the material pricing data 320 can be implemented as one or more network-connected catalogs and/or tables of material data sheets that include pricing information used by SI analysis component 130 to calculate one or more sustainability metrics associated with an object design. The material pricing data 320 can be updated periodically or on an ad-hoc basis. In some embodiments, the material sustainability data 318 and the material pricing data 320 are combined into the same one or more catalogs and/or tables. The material sustainability data 318 and the material pricing data 320 can be updated with new data received, via network 120, from one or more third party services 115.

The system memory 310 includes one or more SI analysis components 130 that calculate sustainability metrics associated with the design of an object. As described above, an SI analysis component 130 receives design data associated with an object design from the CAD application 105 and/or the SI application component 125 to the SI analysis components 130 and/or third party services 115. Based on the received design data and one or more of the design data 316, the material sustainability data 318, and/or the material pricing data 320, an SI analysis component 130 calculates one or more sustainability metrics associated with the design in-real time as a user edits the design of the object. The SI analysis component 130 then transmits the one or more sustainability metrics to CAD application 105 and/or the SI application component 125 to be displayed for providing, in real-time, one or more sustainability insights associated with the design of the object to the user designing the object.

In some instances, an SI analysis component 130 needs data that is not stored in the system storage 312 (e.g., data not included in design data 316, material sustainability data 318, or material pricing data 320) to calculate one or more sustainability metrics associated with the design of the object. In such instances, the SI analysis component can request one or more third party services 115 to assist with calculating the one or more sustainability metrics associated with the design of the object. In some embodiments, requesting assistance from one or more third party services 115 includes requesting the one or more third party services 115 to provide the data, such as material pricing data and/or material sustainability data, needed to calculate the one or more sustainability metrics. In such embodiments, in response to receiving the requested data from one or more third party services 115, an SI analysis component 130 calculates the one or more sustainability metrics using the data received from the one or more third party services 115. In some embodiments, requesting assistance from one or more third party services 115 includes requesting the one or more third party services 115 to calculate the one or more sustainability metrics associated with the design. In such embodiments, an SI analysis component 130 transmits design data associated with the design to the one or more third party services 115, and the one or more third party services 115 calculate the one or more sustainability metrics associated with the design and transmit the one or more sustainability metrics to the SI analysis component 130. In some embodiments, the one or more third party services 115 are implemented by one or more computing devices that are similar in architecture to the backend server 300. However, persons skilled in the art will understand that the one or more third party services 115 can be implemented by any type of computing device suitable for practicing various embodiments.

In some embodiments, only a single SI analysis component 130 is executed on a single backend server 300. In such embodiments, multiple backend servers 300 are connected to system 100, where each backend server 300 executes a respective SI analysis component 130. In other embodiments, multiple SI analysis components 130 are executed on a single backend server 300. In some embodiments, the SI application component 125 is also executed on backend server 300. Thus, in such embodiments, the SI service 110 is implemented remotely by one or more backend servers 300. Moreover, in such embodiments, the SI service 110 connects to the CAD application 105 via network 120. In some embodiments, an SI analysis component 130 is executed on the same computing device on which the CAD application 105 and/or the SI application component 125 are executed. For example, in some embodiments, an SI analysis component 130 is executed on client computing device 200.

Figure 4:
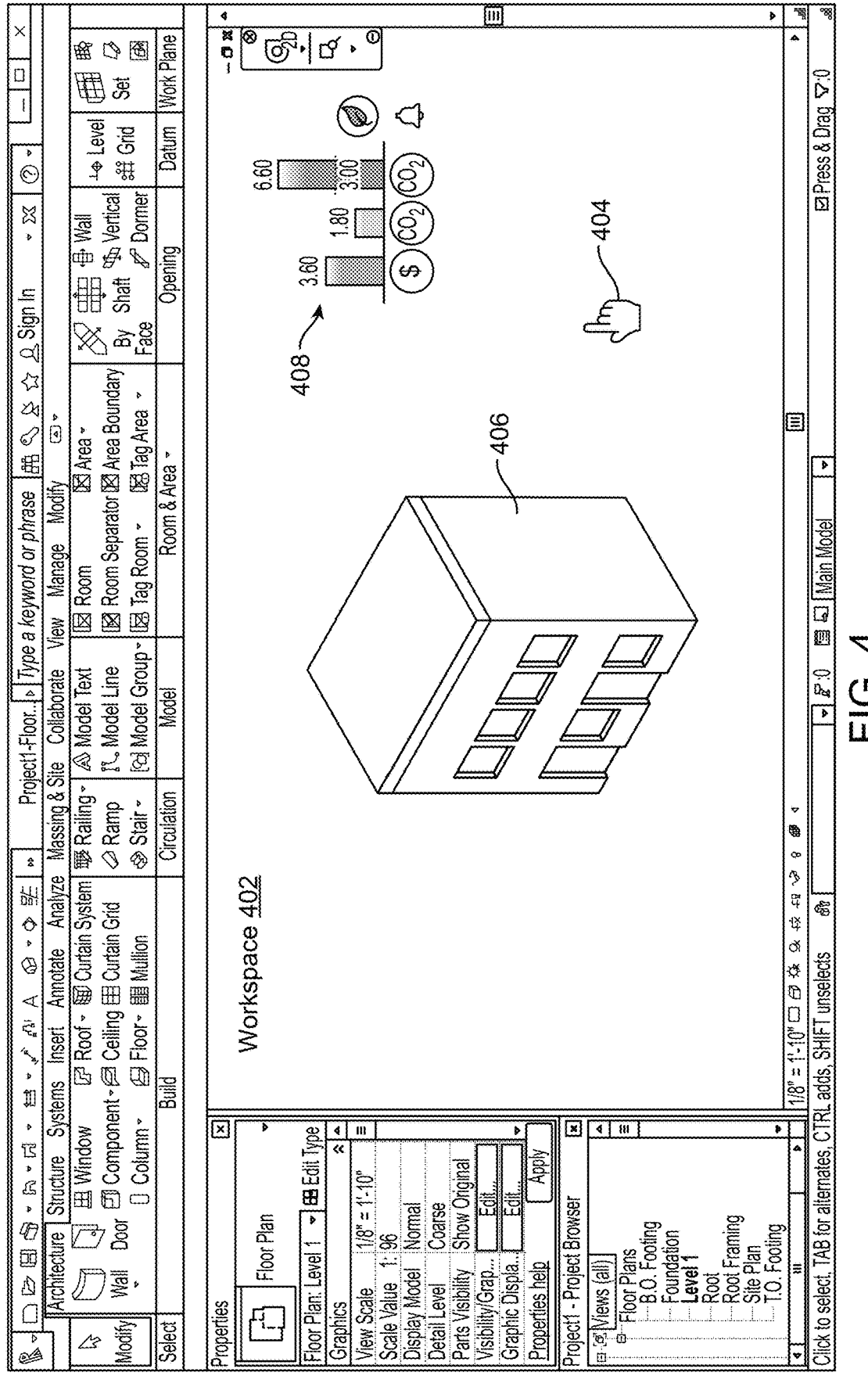
FIG. 4 illustrates a graphical user interface for the CAD application of FIG. 1, according to various embodiments of the present invention.

FIG. 4 is an example screenshot of a GUI 400 with which a user can interact with the CAD application 105 to create and/or edit the design of an object. For example, the GUI 400 can be implemented as GUI 228 of the client computing device 200. As shown, the GUI 400 includes a workspace 402 for the CAD application 105. Within the workspace 402, a user can interact, for example using cursor 404, with a model, or design, of an object 406. That is, using the cursor 404, a user can edit the design of the object 406 (e.g., add components to, remove components from, change materials of components, etc.) by interacting with a model of the object 406 in CAD application 105. In the illustrated example, the object 406 being designed is a building, and thus, a model of the building is displayed within the workspace 402 of the GUI 400.

As further shown in FIG. 4, a sustainability widget 408 is displayed within the periphery of the CAD application 105. In the illustrated example, sustainability widget is displayed in the upper right-hand corner of the workspace 402 of GUI 400. Although shown as being located in the upper right-hand corner of GUI 400, persons skilled in the art will understand that sustainability widget can be positioned at any suitable location within the GUI 400. For example, the sustainability widget 408 can be displayed at the bottom of the GUI 400, at the top of the GUI 400, at the left side of the GUI 400, at the right side of the GUI 400, within the workspace 402, outside of the workspace 402, and/or at some other location on GUI 400.

The sustainability widget 408 provides a visual indication of one or more sustainability metrics associated with the design of the object 406. For example, the sustainability widget 408 displays values and/or other indicators associated with the sustainability metrics associated with the design of the object 406. As described, in operation, the sustainability widget 408 is updated in real-time by the SI service 110 to provide sustainability insights to a user as the user makes changes to the design of the object 406 in the CAD application 105. For example, when a user makes a change to the design of the object 406, the SI service 110 detects the change to the design of the object and determines, in real-time, how the change to the design of the object 406 affects one or more sustainability metrics associated with the design of the object 406. Moreover, after determining how the sustainability metrics are affected by the changes to the design, the SI service 110 updates the display of sustainability widget 408 to reflect the updated values of the one or more sustainability metrics. That is, the SI service 110 causes the sustainability widget 408 to display a visual indication of the updated values of the one or more sustainability metrics in response to detecting a change to the design of the object 406. Accordingly, the sustainability widget 408 provides sustainability insights in real-time to a user as the user changes the design of the object 406 in the CAD application 105.

As will be described in more detail below, the sustainability widget 408 can visualize the sustainability metrics associated with the design of the object 406 in various manners. For example, in the illustrated embodiment of FIG. 4, the sustainability widget 408 is implemented as a bar graph that displays information associated with a plurality of sustainability metrics of the design of the object 406. In some embodiments, the sustainability widget 408 is implemented as a different type of graph, such as a circular bar graph, a horizontal bar graph, or a timeline view, that displays information associated with one or more sustainability metrics of the design of the object 406. In some embodiments, the sustainability widget 408 displays a visual indication of one or more sustainability metrics associated with a single component included in the design of the object 406. In some embodiments, the sustainability widget 408 displays a visual indication of one or more sustainability metrics associated with more than one component included in and/or the entire design of the object 406. In some embodiments, the sustainability widget 408 can provide suggestions regarding how to improve one or more of the sustainability metrics associated with the design of the object 406.

In some embodiments, the sustainability widget 408 can display a visual indication of a comparison between a current value of a sustainability metric associated with the design of the object 406 and a target or benchmark value for the sustainability metric. The target and/or benchmark values for a sustainability metric can be determined based on a user input, values of a sustainability metric associated with a previous version of the design, values of a sustainability metric associated with a competitor design, and/or some other parameter associated with the design of the object 406. As an example, it will be assumed that a price associated with the design of the object 406 is the first sustainability metric displayed by sustainability widget 408. In such an example, the sustainability widget 408 can display a visual indication of the comparison between a price of the current design of the object 406 and a target or benchmark price for the design of the object 406. Moreover, in such an example, the sustainability widget display a visual indication of an amount of progress made towards achieving a target price for the design of the object.

In some embodiments, the one or more sustainability metrics displayed by the sustainability widget 408 can be determined based on a user input. For example, a user can choose to display, via the sustainability widget 408, a visual indication of a first sustainability metric associated with the design of the object 406. As another example, a user can choose to display, via the sustainability widget 408, a visual indication of first and second sustainability metrics associated with the design of the object 406. As another example, a user can choose to display, via the sustainability widget 408, a visual indication of first, second, and third sustainability metrics associated with the design of the object 406. Persons skilled in the art will understand that the sustainability widget 408 can display visual indications for any suitable combination of sustainability metrics associated with the design of the object 406 as desired by a user.

In some instances, when the sustainability widget 408 displays a visual indication of multiple sustainability metrics associated with the design of the object 406, the SI service 110 can take a different amount of time when calculating updated values for each sustainability metric in response to a change to the design of the object 406. In such instances, the SI service 110 can update a visual indication for a respective sustainability metric as the updated value is calculated, even if the SI service 110 has not finished calculating updated values for the other sustainability metrics. For example, if the SI service 110 finishes calculating an updated value of a first sustainability metric before calculating an updated value of a second sustainability metric, the SI service 110 can cause the sustainability widget 408 to update the visual indication of the first sustainability metric without updating the visual indication of the second sustainability metric. In some instances, the SI service 110 causes the sustainability widget 408 to apply a visual effect, such as fade or gray out, to the visual indication of a sustainability metric for which the SI service 110 has not finished calculating an updated value. In other instances, the SI service 110 does not update the visual representation of a respective sustainability metric until the SI service 110 has finished calculating updated values for each of the sustainability metrics being displayed by the sustainability widget 408.

In some embodiments, the information displayed by the sustainability widget 408 is dependent on an operating mode of the SI service 110 and/or CAD application 105. In such embodiments, the sustainability widget 408 can display a first type of a visual indication of one or more sustainability metrics associated with the design of the object 406 when the SI service 110 is operating in a first operating mode and can display a second type of a visual indication of one or more sustainability metrics associated with the design of the object 406 when the SI service 110 is operating in a second operating mode. In such embodiments, the operating mode of SI service 110 can be determined based on one or more of a user input, a predetermined user preference, a type of the object being designed, a type of sustainability metric(s) being displayed by the sustainability widget 408, and/or some other parameter of the design of the object 406.

Figure 5:
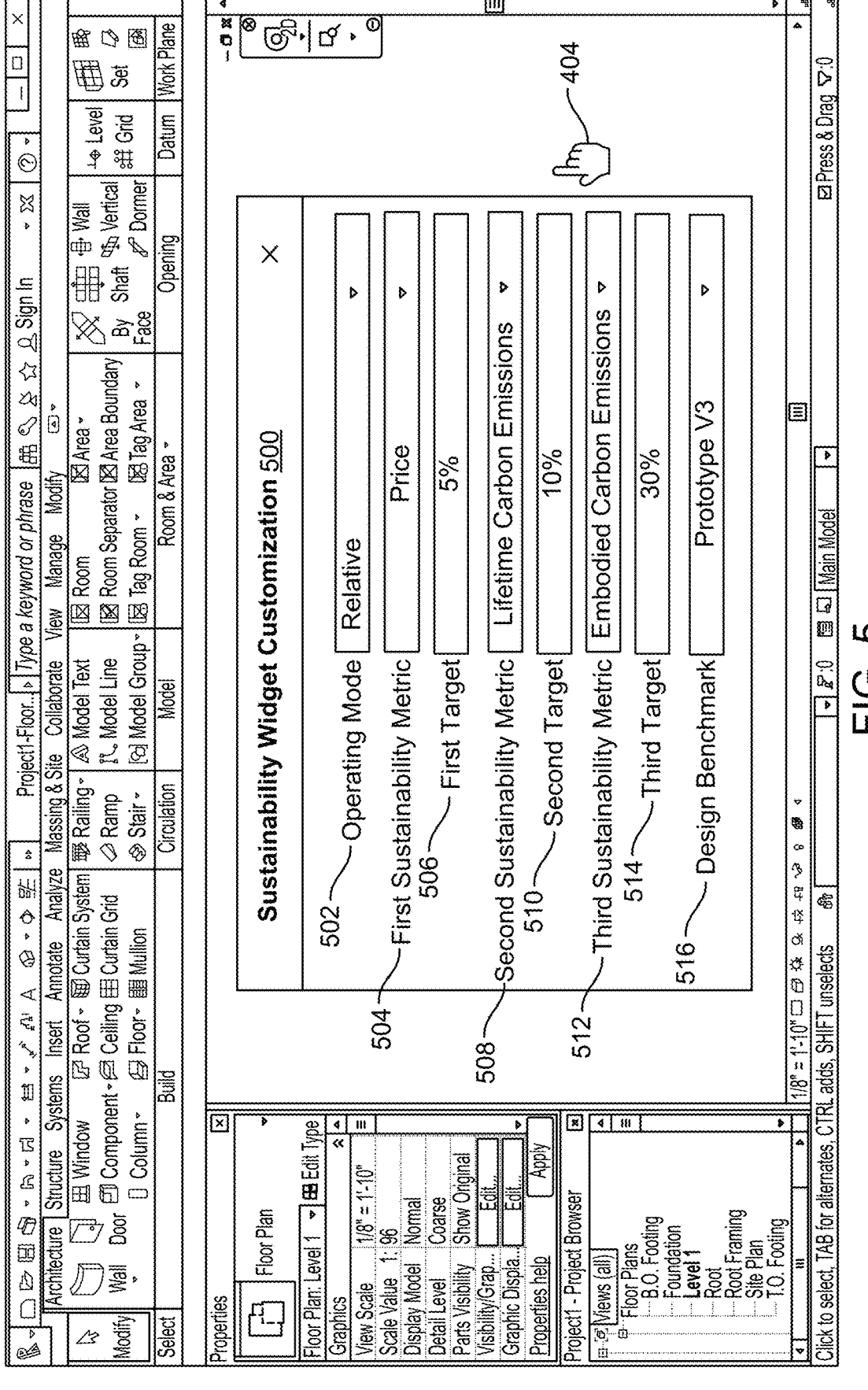
FIG. 5 illustrates a window for customizing a widget displayed by the graphical user interface of FIG. 4, according to various embodiments of the present disclosure.

FIG. 5 illustrates an example customization window 500 with which a user can customize the sustainability widget 408 displayed by GUI 400. That is, using the cursor 404 and/or other input devices for interacting with CAD application 105 and SI service 110, a user can customize which sustainability information is displayed by the sustainability widget 408 and/or how the sustainability information is displayed by the sustainability widget 408. Accordingly, the SI service 110 can provide, based on user inputs to the customization window 500, customized sustainability insights associated with the design of the object 406 to the user in real-time as the user edits the design of the object 406 in the CAD application 105.

In the illustrated example of FIG. 5, the customization window 500 allows a user to select one or more of an operating mode 502 of the SI service 110, a first sustainability metric 504 (e.g., price) associated with the design of the object 406 that is to be determined by the SI service 110 and displayed via the sustainability widget 408, a first target 506 for the first sustainability metric 504, a second sustainability metric 508 (e.g., lifetime carbon emissions) associated with the design of the object 406 that is to be determined by the SI service 110 and displayed via the sustainability widget 408, a second target 510 for the second sustainability metric 508, a third sustainability metric 512 (e.g., embodied carbon emissions) associated with the design of the object 406 that is to be determined by the SI service 110 and displayed via the sustainability widget 408, a third target 514 for the third sustainability metric 512, and a design benchmark 516. Persons skilled in the art will understand the selectable options included in the customization window 500 of FIG. 5 are provided merely as examples and do not limit implementation of the customization window 500. Moreover, persons skilled in the art will understand that the customization window 500 can include more or fewer selectable options than what is illustrated in FIG. 5. For example, in some embodiments, more or fewer than three sustainability metrics associated with design of the object 406 can be selected via the customization window 500. Moreover, sustainability metrics other than the ones shown in FIG. 5 can be selected by a user via the customization window 500.

In some embodiments, user selectable options for the operating mode 502 of the SI service 110 include an absolute operating mode and a relative operating mode. Persons skilled in the art will understand that the absolute and relative operating modes are just two examples of possible operating modes of the SI service 110. Moreover, persons skilled in the art will understand that the SI service 110 can operate in additional operating modes.

A user can select the absolute operating mode when designing the object 406 from scratch and/or when there are no targets for the sustainability metrics associated with the design of the object 406. When operating in the absolute operating mode, the SI service 110 determines and displays, via the sustainability widget 408, visual indications of raw values for one or more sustainability metrics associated with the design of the object 406. However, when operating in the absolute operating mode, the SI service 110 does not display, via the sustainability widget 408, comparisons between current values and respective target values of one or more sustainability metrics associated with the design of the object 406.

Figure 6:
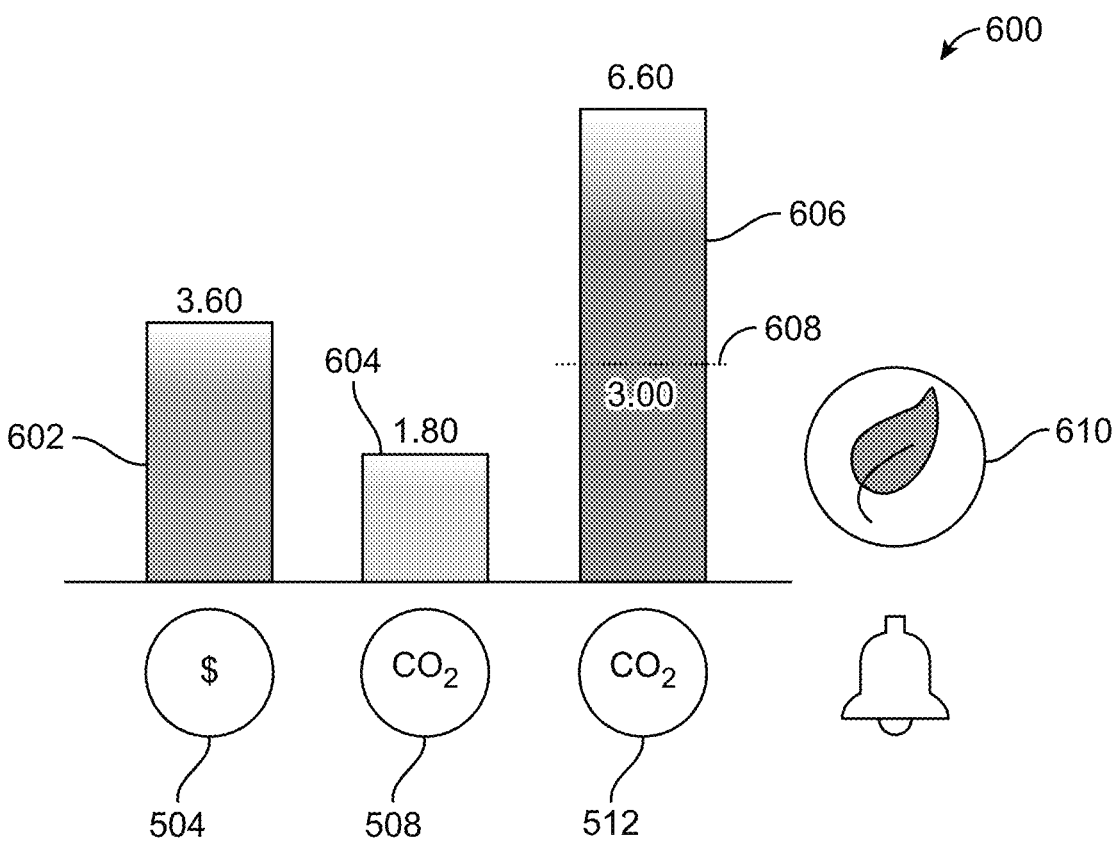
FIG. 6 illustrates an example widget that displays a visual indication of one or more sustainability metrics for an absolute mode of operation, according to various embodiments.

FIG. 6 illustrates an example of a sustainability widget 600 that is displayed, for example via the GUI 400, to a user when the SI service 110 is operating in the absolute operating mode. The sustainability widget 600 can be, for example, implemented as the sustainability widget 408 shown in FIG. 4. In the illustrated example of FIG. 6, the sustainability widget 600 is implemented as a bar graph. However, persons skilled in the art will understand that a bar graph is just one non-limiting example that can be used to implement the sustainability widget 600.

As shown, the sustainability widget 600 displays a first visual indication 602 of the first sustainability metric 504 (e.g., price) associated with the design of an object, a second visual indication 604 of the second sustainability metric 508 (e.g., lifetime carbon emissions) associated with the design of an object, and a third visual indication 606 of the third sustainability metric 512 (e.g., embodied carbon emissions) associated with the design of an object. The visual indications 602, 604, and 606 of the sustainability metrics are shown as respective bars in the bar graph. For example, the first visual indication 602 is implemented as a first bar that displays a value of the first sustainability metric 504 (e.g., price) associated with the design of the object. In some embodiments, the first visual indication 602 further includes a numerical value indicative of the current value of the first sustainability metric 504 (e.g., price). In the illustrated example, the numerical value of 3.60 is positioned at the top of the bar of the first visual indication 602 to indicate that the current value of the first sustainability metric 504 (e.g., price) is 3.60. Moreover, in the illustrated example, the numerical value of 1.80 is positioned at the top of the bar of the second visual indication 604 to indicate that the current value of the second sustainability metric 508 (e.g., lifetime carbon emissions) is 1.80, and the numerical value of 6.60 is positioned at the top of the bar of the third visual indication 606 to indicate that the current value of the third sustainability metric 512 (e.g., embodied carbon emissions) is 6.60.

In some embodiments, different styles (e.g., colors, gradients, markings, etc.) are used to shade and/or fill in the visual indications 602, 604, and 606. For example, a first style can be used to fill in the first visual indication 602 and a second style can be used to fill in the second visual indication 604. In some embodiments, the style of a particular visual indication changes as the value of the sustainability metric associated with the visual indication changes. For example, the style of the first visual indication 602 might change as the value of the first sustainability metric 504 changes. In one particular example, the color of the first visual indication 602 progressively changes from a first color (e.g., blue) to a second color (e.g., red) as the first sustainability metric 504 increases from a low value to a high value.

While the SI service 110 is operating in the absolute operating mode, the SI service 110 determines, in real-time, updated values for the sustainability metrics 504, 508, and 512 displayed by the sustainability widget 600 as a user of the CAD application 105 makes a change to the design of the object. Moreover, the SI service 110 causes the sustainability widget 600 to display, in real-time, the updated values of the sustainability metrics 504, 508, and 512 such that a user can see the impact that the change to the design of the object has on one or more of the sustainability metrics 504, 508, and 512 associated with the design of the object. For example, when a user adds a component, such as a steel beam, to the design of an object, the SI service 110 determines updated values of the sustainability metrics 504, 508, and 512 based on the component added to the design of the object and causes the sustainability widget 600 to display, in real-time, the updated values of the sustainability metrics 504, 508, and 512.

In some embodiments, the SI service 110 causes the sustainability widget 600 to display a previous value of a sustainability metric and a current value of a sustainability metric associated with the design of the object such that a user can more easily see the impact that a change to the design of the object has on a sustainability metric. In such embodiments, the previous value of the sustainability metric is a value of the sustainability metric before a change to the design of the object was made and the current value of the sustainability metric is a value of the sustainability metric after the change to the design of the object was made. In the illustrated example of FIG. 6, an indicator, such as a dashed line 608, is included in the third visual indication 606 of the third sustainability metric 512 (e.g., embodied carbon emissions) to indicate the previous value of the third sustainability metric 512 before a change was made to the design of the object. Accordingly, a user can easily determine the impact of a change to the design of the object on the third sustainability metric 512 by looking at the difference between the dashed line 608 and the top of the bar of the third visual indication 606. Moreover, in the illustrated example of FIG. 6, the sustainability widget 600 also displays the numerical value, 3.00, of the previous value of the third sustainability metric 512. Accordingly, the user can easily determine that the change to the design of the object caused the third sustainability metric 512 to increase from a value of 3.00 to a value of 6.60. Although the above description of displaying previous values of sustainability metrics was provided with respect to the third sustainability metric 512, persons skilled in the art will understand that the above description is equally applicable to displaying previous and current values of other sustainability metrics, such as the first and second sustainability metrics 504, 508, associated with the design of the object.

In some embodiments, when the SI service 110 updates the values of the sustainability metrics displayed by the sustainability widget 600, the SI service 110 applies a temporary visual effect to the sustainability widget 600 to indicate to the user that a change to the sustainability widget 600 has been made. For example, the SI service 110 can cause the sustainability widget 600 to blink, change colors, enlarge, and/or exhibit some other visual effect for a brief period of time when the sustainability widget 600 is updated in view of a change to the design of the object.

In some embodiments, the sustainability widget 600 further includes a sustainability icon 610. In such embodiments, when selected by a user, the sustainability icon 610 provides a menu of options to a user. In one example, selecting the sustainability icon 610 causes the customization window 500 to be presented to a user. In other examples, selecting the sustainability icon 610 causes other information and/or selectable options associated with the sustainability widget 600 to be presented to a user.

Referring back to FIG. 5, in some instances, the relative operating mode is selected as the operating mode 502 for the SI service 110. A user can select the relative operating mode when a user has one or more targets in mind for the sustainability metrics associated with the design of the object. For example, a user can select the relative operating mode when the user desires to improve and/or track one or more sustainability metrics associated with the design of an object relative to a design benchmark, such as previous version of the design and/or a competitor design. When operating in the relative operating mode, SI service 110 determines and displays, via the sustainability widget 408, visual indications of comparisons between one or more sustainability metrics associated with the current design of the object 406 and one or more sustainability metrics associated with a design benchmark. For example, the SI service 110 determines a difference between a first sustainability metric associated with the current design of the object 406 and a first sustainability metric associated with a design benchmark and then displays, via the sustainability widget 408, a visual indication of the difference. In some embodiments, when operating in a relative mode, the SI service 110 determines an amount of progress made towards achieving a target value for a sustainability metric relative to the design benchmark and displays, via the sustainability widget 408, a visual indication of the progress made towards achieving the target value relative to the design benchmark. For example, the SI service 110 determines an amount of progress made towards achieving a target value for a first sustainability metric associated with the current design of the object relative to the first sustainability metric of a benchmark design and displays, via the sustainability widget 408, a visual indication of the progress.

With respect to FIG. 5, a user can define values of the targets 506, 510, and 514 for the sustainability metrics associated with the design of the object 406 relative to a design benchmark 516. The design benchmark 516 can include one or more of sustainability metric values associated with a previous version of the design of the object, sustainability metric values associated with a competitor design of an object, and/or sustainability metric values associated with some other design of an object to which a user desires to compare the current design of the object. In some embodiments, the design benchmark 516 is determined manually by a user. In such embodiments, a user manually defines benchmark values for one or more sustainability metrics associated with the current design of the object. For example, a user might define a benchmark value for the first sustainability metric (e.g., price) to be $10.00, which means the user desires to keep the price of the current design of the object under $10.00. As another example, a user might define a benchmark value for the second sustainability metric (e.g., lifetime carbon emissions) to be 10 kg, which means the user desires to keep the lifetime carbon emissions of the current design of the object under 10 kg.

In some embodiments, such as in the illustrated example of FIG. 5, the sustainability metric targets 506, 510, and 514 are defined by a user as percentage values. In such embodiments, the percentage value for a respective target is indicative of the percentage by which a user desires to improve upon a sustainability metric relative to the design benchmark 516. For example, the first target 506 has a value of 5%, which means that a user desires to improve the first sustainability metric 504 (e.g., price) associated with the current design of the object by 5% when compared to the first sustainability metric of the design benchmark 516. Improving the price metric associated with the current design of the object by 5% would include decreasing the price of the current design of the object by 5% relative to the price of the design benchmark 516. As another example, the second target 510 has a value of 10%, which means that a user desires to improve the second sustainability metric 508 (e.g., lifetime carbon emissions) associated with the current design of the object by 10% when compared to the second sustainability metric of the design benchmark 516. Improving the lifetime carbon emissions metric associated with the current design of the object by 10% would include decreasing the lifetime carbon emissions of the current design of the object by 10% relative to the lifetime carbon emissions of the design benchmark 516.

In some embodiments, the sustainability metric targets 506, 510, and 514 are defined by a user as absolute values. In such embodiments, the absolute value for a respective target is indicative of an absolute amount by which a user desires to improve upon a sustainability metric in the design benchmark 516. For example, a user can define the first target 506 to have a value of $5.00, which means that a user desires to improve the first sustainability metric 504 (e.g., price) associated with the current design of the object by $5.00 when compared to the first sustainability metric of the design benchmark 516. Improving the price metric associated with the current design of the object by $5.00 would include decreasing the price of the current design of the object by $5.00 relative to the price of the design benchmark 516. As another example, a user can define the second target 510 to have a value of 2.00 kg, which means that a user desires to improve the second sustainability metric 508 (e.g., lifetime carbon emissions) associated with the current design of the object by 2.00 kg when compared to the second sustainability metric of the design benchmark 516. Improving the lifetime carbon emissions metric associated with the current design of the object by 2.00 kg would include decreasing the lifetime carbon emissions of the current design of the object by 2.00 kg relative to the lifetime carbon emissions of the design benchmark 516.

Figure 7:
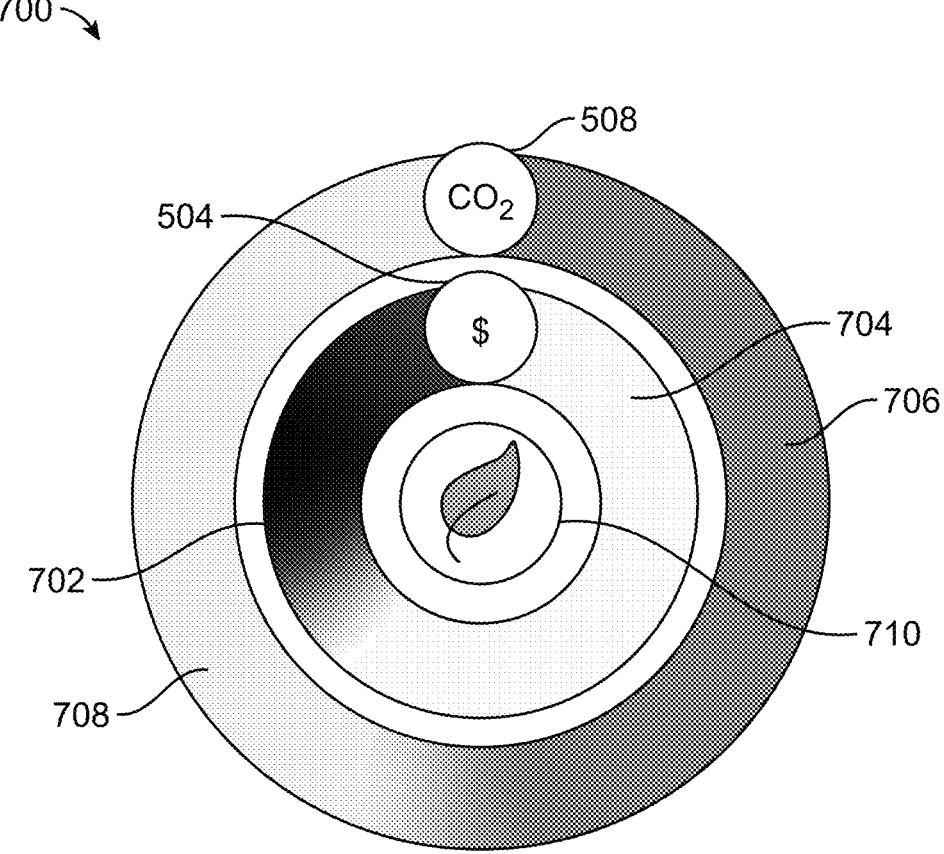
FIG. 7 illustrates an example widget that displays a visual indication of one or more sustainability metrics for a relative mode of operation, according to various embodiments of the present disclosure.

FIG. 7 illustrates an example of a sustainability widget 700 that is displayed, for example via the GUI 400, to a user when the SI service 110 is operating in the relative operating mode. The sustainability widget 700 can be, for example, implemented as the sustainability widget 408 shown in FIG. 4. In the illustrated example of FIG. 7, the sustainability widget 700 is implemented as a circular bar graph. Persons skilled in the art will understand that a circular bar graph is just one non-limiting example that can be used to implement sustainability widget 700.

As shown, the sustainability widget 700 displays visual indications of first and second sustainability metrics 504, 508 associated with the design of an object. The visual indication of the first sustainability metric 504 (e.g., price) includes a first shaded portion 702 of a first circular bar, or ring, 704. The visual indication of the second sustainability metric 508 (e.g., lifetime carbon emissions) includes a second shaded portion 706 of a second circular bar, or ring, 708. The sustainability widget 700 also includes a sustainability icon 710, which is similar to the sustainability icon 610 described above.

The amount, or size, of a shaded portion (e.g., 702 or 706) included in a visual indication of a sustainability metric corresponds to an amount of progress made towards achieving a target for the sustainability metric (e.g., 504 or 508) relative to a design benchmark. Furthermore, the direction in which a shaded portion fills in a respective ring (e.g., 704 or 708) corresponds to whether the sustainability metric is improving or worsening. For example, when a shaded portion fills in a respective ring in a first direction (e.g., clockwise), the sustainability metric is improving, or making progress, towards the target relative to the design benchmark. In contrast, when a shaded portion fills in a respective ring in a second direction (e.g., counterclockwise), the sustainability metric is worsening relative to the design benchmark. Thus, for example, if a shaded portion included in a visual indication of a sustainability metric fills in 50% of a ring in the clockwise direction, the sustainability metric has achieved 50% of the target relative to the sustainability metric of the design benchmark. Similarly, as another example, if a shaded portion included in a visual indication of a sustainability metric fills in 25% of a ring in the counterclockwise direction, the sustainability metric has worsened by 25% relative to the sustainability metric of the design benchmark.

In some embodiments, a first color (e.g., green) and/or a first style (e.g., gradient, marking, etc.) is used to fill in a shaded portion when the sustainability metric is improving, or making progress, relative to a design benchmark. Thus, in such embodiments, the shaded portion is displayed with a first color or style when the shaded portion fills in a respective ring in the clockwise direction. Similarly, in such embodiments, a second color (e.g., red) and/or a second style is used to fill in a shaded portion when the sustainability metric is worsening relative to a design benchmark. Thus, in such embodiments, the shaded portion is displayed with a second color and/or second style when the shaded portion fills in a respective ring in the counterclockwise direction.

With respect to illustrated example of FIG. 7, the first shaded portion 702 included in the visual indication of the first sustainability metric 504 (e.g., price) has filled in approximately 33% of the first ring 704 in the counterclockwise direction. Thus, when a user views the sustainability widget 700, the user can determine that a current value of the first sustainability metric 504 has worsened, or increased in price, by 33% relative to the design benchmark. Furthermore, the second shaded portion 706 included in the visual indication of the second sustainability metric 508 (e.g., lifetime carbon emissions) has filled in approximately 50% of the second ring 708 in the clockwise direction. Thus, when a user views the sustainability widget 700, the user can determine that a current value of the second sustainability metric 508 has achieved 50% of the target reduction in lifetime carbon emissions relative to the design benchmark.

Similar to the sustainability widgets 408 and 600 described above, the SI service 110 determines, in real-time, updated values for the sustainability metrics 504 and 508 displayed by sustainability widget 700 as a user of the CAD application 105 makes a change to the design of the object. Moreover, the SI service 110 causes the sustainability widget 700 to display, in real-time, visual indications of the updated values for the sustainability metrics 504 and 508 such that a user can see the impact that the change to the design of the object has on achieving one or more of the sustainability metric targets relative to the design benchmark. For example, when a user adds a component, such as a steel beam, to the design of an object, the SI service 110 determines updated values of the sustainability metrics 504 and 508 based on the component added to the design of the object and causes the sustainability widget 700 to display, in real-time, the updated values of the sustainability metrics 504 and 508 caused by the change to the design of the object.

Displaying a visual indication of an updated value of a sustainability metric caused by a design change can include increasing or decreasing a size of the shaded portion included in the visual indication of a sustainability metric in a first or second direction around a ring. As an example, it will be assumed that the SI service 110 determines that adding a component to the design of the object reduces the second sustainability metric 508 (e.g., lifetime carbon emissions) by 2% relative to the design benchmark. Continuing with this same example, it will be assumed that the second target 510 for the second sustainability metric 508 was defined by a user as decreasing the lifetime carbon emissions relative to the design benchmark by 10%. Accordingly, in this example, the SI service 110 determines in real-time that the 2% reduction in lifetime carbon emissions caused by adding the component to the design of the object results in progressing towards the second target 510 for the second sustainability metric 508 by 20%. Thus, the SI service 110 updates, in real-time, the display of sustainability widget 700 by increasing the size of the second shaded portion 706 by 20% in the clockwise direction around the second ring 708.

As another example, it will be assumed that the SI service 110 determines that adding a component to the design of the object increases the first sustainability metric 504 (e.g., price) by 1% relative to the design benchmark. Continuing with this same example, it will be assumed that the first target 506 for the first sustainability metric 504 was defined by a user as decreasing price relative to the design benchmark by 10%. Accordingly, in this example, the SI service 110 determines in real-time that the 1% increase in price caused by adding the component to the design of the object results in reversing the progress towards the first target 506 for the first sustainability metric 504 by 10%. Thus, the SI service 110 updates, in real-time, the display of sustainability widget 700 by increasing the size of the first shaded portion 702 by 10% in the counterclockwise direction around the first ring 704.

In some embodiments, when the SI service 110 updates the values of the sustainability metrics displayed by the sustainability widget 700, the SI service 110 applies a temporary visual effect to the sustainability widget 700 to indicate to the user that a change to the sustainability widget 700 has been made. For example, the SI service 110 can cause the sustainability widget 700 to blink, change colors, enlarge, and/or exhibit some other visual effect for a brief period of time when the sustainability widget 700 is updated in view of a change to the design of the object.

Although the sustainability widget 700 is described above with respect to percentage values, persons skilled in the art will understand that the above description is also applicable for scenarios in which sustainability metric targets (e.g., target 506, 510, 514, etc.) and/or sustainability metrics associated with a design benchmark (e.g., design benchmark 516) are defined as absolute values. Moreover, although the sustainability widget 700 is shown and described above as a circle bar graph, persons skilled in the art will understand that the above description of the sustainability widget 700 is also applicable to other types of graphs that can be used to implement the sustainability widget 700. For example, if the sustainability widget 700 is instead implemented using vertical bar graphs, a visual indication corresponding to a sustainability metric can shade in a first amount of the vertical bar graph in a first direction (e.g., upwards) when the sustainability metric improves, or progresses towards a first target, relative to the design benchmark by the first amount. Similarly, if the sustainability widget 700 is implemented using vertical bar graphs, a visual indication corresponding to a sustainability metric can decrease the shading of the vertical bar graph in a second direction (e.g., downwards) by an amount that corresponds to an amount by which the sustainability metric has worsened relative to a design benchmark.

Furthermore, although the circular bar graph implementation of sustainability widget 700 is described above with respect to the relative operating mode of the SI service 110, persons skilled in the art will understand that circular bar graphs can also be used to implement a sustainability widget when the SI service 110 operates in the absolute operating mode. Moreover, although the sustainability widget 700 is used to display visual indications of two sustainability metrics associated with the design of the object, persons skilled in the art will understand that sustainability widget

700 can display visual indications of more than or fewer than two sustainability metrics associated with the design of the object.

Figure 8:
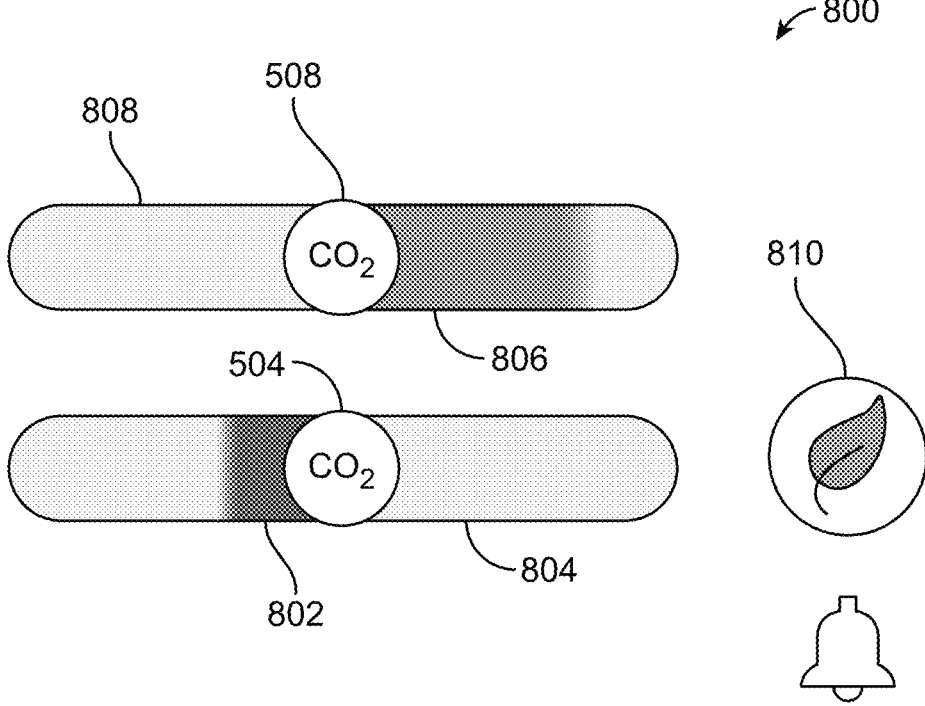
FIG. 8 illustrates an example widget that displays a visual indication of one or more sustainability metrics for a relative mode of operation, according to various embodiments of the present disclosure.

FIG. 8 illustrates another example of a sustainability widget 800 that is displayed, for example via the GUI 400, to a user when the SI service 110 is operating in the relative operating mode. The sustainability widget 800 can be, for example, implemented as the sustainability widget 408 shown in FIG. 4. In the illustrated example of FIG. 8, the sustainability widget 800 is a horizontal bar graph. As a user edits the design of an object in the CAD application 105, the SI service 110 updates, in real-time, the display of the sustainability widget 800 to indicate how changes to the design impact the sustainability metrics associated with the design of the object.

As shown, the sustainability widget 800 displays visual indications of first and second sustainability metrics 504, 508 associated with the design of an object. The visual indication of the first sustainability metric 504 (e.g., price) includes a first shaded portion 802 of a first horizontal bar 804. The visual indication of the second sustainability metric 508 (e.g., lifetime carbon emissions) includes a second shaded portion 806 of a second horizontal bar 808. The sustainability widget 800 also includes a sustainability icon 810, which is similar to the sustainability icon 610 described above.

Similar to the sustainability widget 700, the amount, or size, of a shaded portion (e.g., 802 or 806) included in a visual indication of a sustainability metric (e.g., 504 or 508) corresponds to an amount of progress made towards achieving a target for the sustainability metric relative to a design benchmark. Furthermore, the direction in which a shaded portion fills in a respective horizontal bar (e.g., 804 or 808) corresponds to whether the sustainability metric is improving or worsening. For example, when a shaded portion fills in a respective horizontal bar in a first direction (e.g., to the right) relative to the center of the horizontal bar, the sustainability metric is improving, or making progress, towards the target relative to the design benchmark. In contrast, when a shaded portion fills in a respective horizontal bar in a second direction (e.g., to the left) relative to the center of the horizontal bar, the sustainability metric is worsening relative to the design benchmark. Thus, for example, if a shaded portion included in a visual indication of a sustainability metric fills in 50% of a horizontal bar in the direction right of center, the sustainability metric has achieved 50% of the target relative to the sustainability metric of the design benchmark. Similarly, as another example, if a shaded portion included in a visual indication of a sustainability metric fills in 25% of a horizontal bar in the direction left of center, the sustainability metric has worsened by 25% relative to the sustainability metric of the design benchmark.

As described above, in some embodiments, a first color (e.g., green) and/or a first style (e.g., gradient, marking, etc.) is used to fill in a shaded portion when the sustainability metric is improving, or making progress, relative to a design benchmark. Thus, in such embodiments, the shaded portion is displayed with a first color and/or first style when the shaded portion fills in a respective horizontal bar in the direction right of center. Similarly, in such embodiments, a second color (e.g., red) and/or a second style is used to fill in a shaded portion when the sustainability metric is worsening relative to a design benchmark. Thus, in such embodiments, the shaded portion is displayed with a second color and/or second style when the shaded portion fills in a respective horizontal bar in the direction left of center.

Further, the SI service 110 determines, in real-time, updated values for the sustainability metrics 504 and 508 displayed by the sustainability widget 800 as a user of the CAD application 105 makes a change to the design of the object. Moreover, the SI service 110 causes the sustainability widget 800 to display, in real-time, visual indications of the updated values of the sustainability metrics 504 and 508 such that a user can see the impact that the change to the design of the object has on achieving one or more of the sustainability metric targets relative to the design benchmark. With respect to the illustrated example of FIG. 8, displaying an updated value of a sustainability metric caused by a design change can include increasing or decreasing a size of the shaded portion in a first or second direction relative to the center of a horizontal bar.

As an example, it will be assumed that the SI service 110 determines that adding a component to the design of the object reduces the second sustainability metric 508 (e.g., lifetime carbon emissions) by 2% relative to the design benchmark. Continuing with this same example, it will be assumed that the second target 510 for the second sustainability metric 508 was defined by a user as decreasing lifetime carbon emissions relative to the design benchmark by 10%. Accordingly, in this example, the SI service 110 determines in real-time that the 2% reduction in lifetime carbon emissions caused by adding the component to the design of the object results in progressing towards the second target 510 for the second sustainability metric by 20%. Thus, the SI service 110 updates, in real-time, the display of sustainability widget 800 by increasing the second shaded portion 806 by 20% in the direction right of center of the second horizontal bar 808.

Although the horizontal bar graph implementation of sustainability widget 800 is described above with respect to the relative operating mode of SI service 110, persons skilled in the art will understand that horizontal bar graphs can also be used to implement a sustainability widget when the SI service 110 operates in the absolute operating mode. Moreover, although the sustainability widget 800 is used to display visual indications of two sustainability metrics associated with the design of the object, persons skilled in the art will understand that sustainability widget 800 can display visual indications of more than or fewer than two sustainability metrics associated with the design of the object.

FIGS. 9A-9D illustrate various examples of sustainability widgets 900A-900D that can be displayed, for example via the GUI 400, to a user when the SI service 110 is operating in the relative operating mode. The sustainability widgets 900A-900D can be, for example, implemented as the sustainability widget 408 shown in FIG. 4. As a user edits the design of an object in the CAD application 105, the SI service 110 updates, in real-time, the display of the sustainability widgets 900A-900D to indicate how changes to the design of the object impact the sustainability metrics associated with the design of the object.

Each of the sustainability widgets 900A-900D displays visual indications of first and second sustainability metrics 504, 508 associated with the design of an object. The visual indications of the first sustainability metric 504 (e.g., price) include a first shaded portion 902 of a first bar 904 (e.g., a ring, a semi-circular bar, an arc-shaped bar, etc.). The visual indications of the second sustainability metric 508 (e.g., lifetime carbon emissions) include a second shaded portion 906 of a second bar 908 (e.g., a ring, a semi-circular bar, an arc-shaped bar, etc.). The sustainability widgets 900A-900D also include a sustainability icon 910, which is similar to the sustainability icon 610 described above.

Similar to the sustainability widgets described above, in sustainability widgets 900A-900D, the amount, or size, of a shaded portion (e.g., 902 or 906) included in a visual indication of a sustainability metric (e.g., 504 or 508) corresponds to an amount of progress made towards achieving a target for the sustainability metric relative to a design benchmark. In addition, in the sustainability widgets 900A-900D, a shaded portion (e.g., 902 or 906) included in a visual indication of a sustainability metric (e.g., 504 or 508) is filled in with a gradient pattern that further corresponds to an amount of progress made towards achieving a target for the sustainability metric (e.g., 504 or 508) relative to a design benchmark. For example, as a sustainability metric gets closer to achieving a target relative to a design benchmark, the shaded portion is filled in with a first color gradient pattern that progresses from a first color (e.g., blue) to a second color (e.g., green). As another example, as a sustainability metric worsens and gets further from achieving a target relative to a design benchmark, the shaded portion is filled in with a second color gradient pattern that progresses from a third color (e.g., orange) to a fourth color (e.g., red).

Furthermore, similar to the sustainability widgets described above, the direction in which a shaded portion (e.g., 902 or 906) fills in a respective bar (e.g., 904 or 908) corresponds to whether the sustainability metric is improving or worsening. With respect to sustainability widgets 900A, 900C, and 900D, when a sustainability metric (e.g., the second sustainability metric 508) is improving relative to the design benchmark, the shaded portion (e.g., 902 or 906) included in a visual indication of the sustainability metric fills in a respective bar (e.g., 904 or 908) in the counterclockwise direction. In contrast, when a sustainability metric is worsening relative to the design benchmark, the shaded portion (e.g., 902 or 906) included in a visual indication of the sustainability metric fills in a respective bar (e.g., 904 or 908) in the clockwise direction.

Figures 9A, 9B, 9C, 9D:
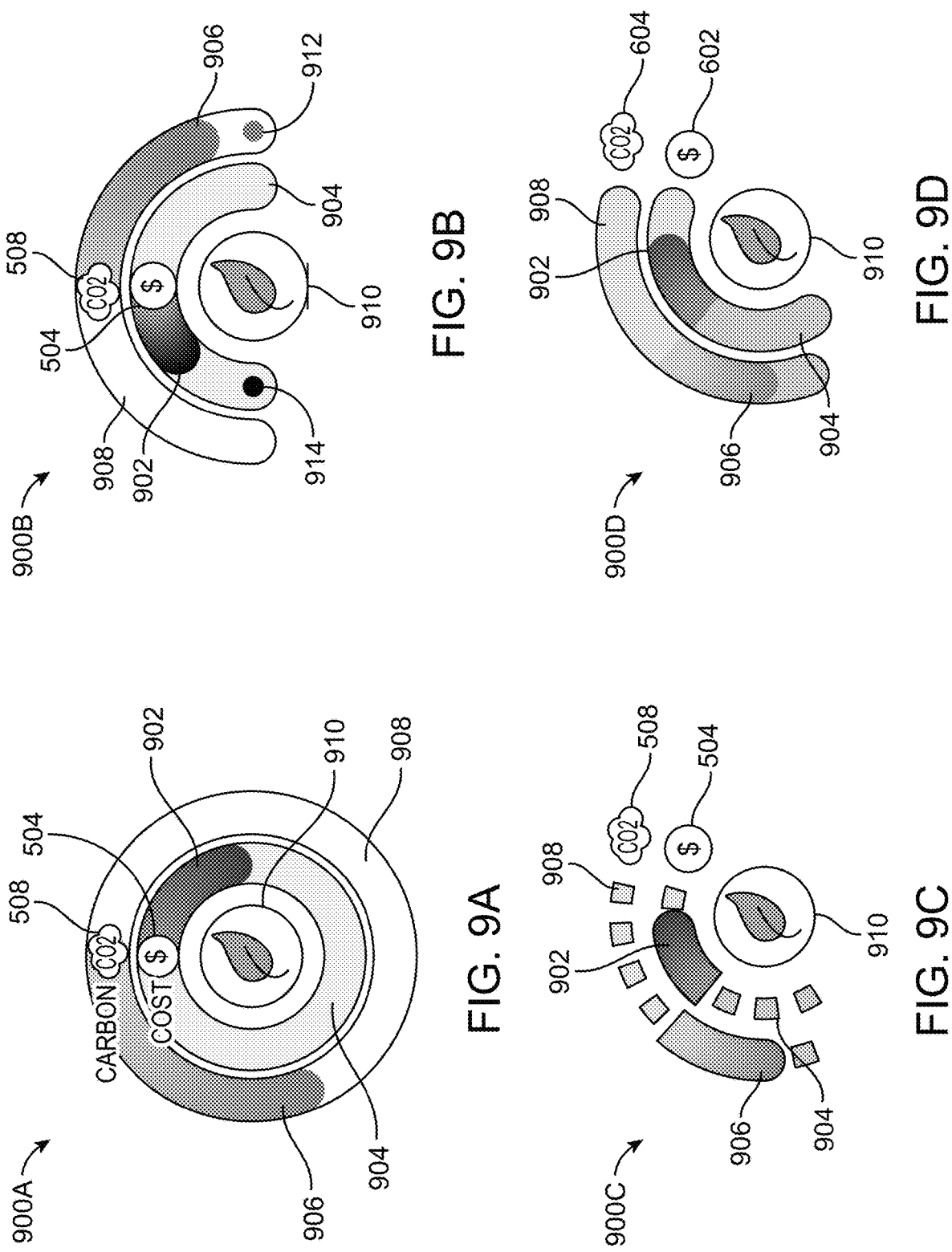
FIGS. 9A-9D illustrate example widgets that display a visual indication of one or more sustainability metrics for a relative mode of operation, according to various embodiments of the present disclosure.

As shown in FIG. 9A, the sustainability widget 900A includes first and second bars 904, 908 that are implemented as rings. As shown in FIG. 9C, the sustainability widget 900C includes first and second bars 904, 908 that are implemented as dashed arc-shaped bars. Portions of the dashed arc-shaped bars 904, 908 in sustainability widget 900C are filled in with respective colors that correspond to whether a sustainability metric is worsening or improving. For example, the portions of the dashed arc-shaped bars 904, 908 that extend in the counterclockwise direction relative to the centers of the dashed arc-shaped bars 904, 908 are filled in with a first color (e.g., green) to indicate to a user that a sustainability metric moving in the counterclockwise direction is improving relative to a design benchmark. Similarly, the portions of the dashed arc-shaped bars 904, 908 that extend in the clockwise direction relative to the centers of the dashed arc-shaped bars 904, 908 are filled in with a second color (e.g., red) to indicate to a user that a sustainability metric moving in the clockwise direction is worsening relative to a design benchmark. As shown in FIG. 9D, the sustainability widget 900D includes first and second bars 904, 908 that are implemented as arc-shaped bars and are filled in with first and second colors in a manner similar to that described above with respect to the sustainability widget 900C.

With respect to sustainability widget 900B shown in FIG. 9B, when a sustainability metric is improving relative to the design benchmark, the shaded portion (e.g., 902 or 906) included in a visual indication of the sustainability metric fills in a respective bar (e.g., 904 or 908) in the clockwise direction. In contrast, when a sustainability metric is worsening relative to the design benchmark, the shaded portion (e.g., 902 or 906) included in a visual indication of the sustainability metric fills in a respective bar (e.g., 904 or 908) in the counterclockwise direction. As shown, the sustainability widget 900B includes first and second bars 904, 908 that are implemented as semi-circular bars. As further shown, the sustainability widget 900B includes a first dot 912 that gets added to the end of the first bar 904 to indicate when an initial target for the second sustainability metric 508 has been achieved. Moreover, the sustainability widget 900B includes a second dot 914 that gets added to the end of the second bar 908 to indicate that the first sustainability metric 504 has worsened relative to the design benchmark by a particular amount.

Although the implementations of sustainability widgets 900A-900D are described above with respect to the relative operating mode of the SI service 110, persons skilled in the art will understand that these implementations can also be used to implement a sustainability widget when the SI service 110 operates in the absolute operating mode. Moreover, although the sustainability widgets 900A-900D are used to display visual indications of two sustainability metrics associated with the design of the object, persons skilled in the art will understand that sustainability widgets 900A-900D can display visual indications of more than or fewer than two sustainability metrics associated with the design of the object.

Figure 10:
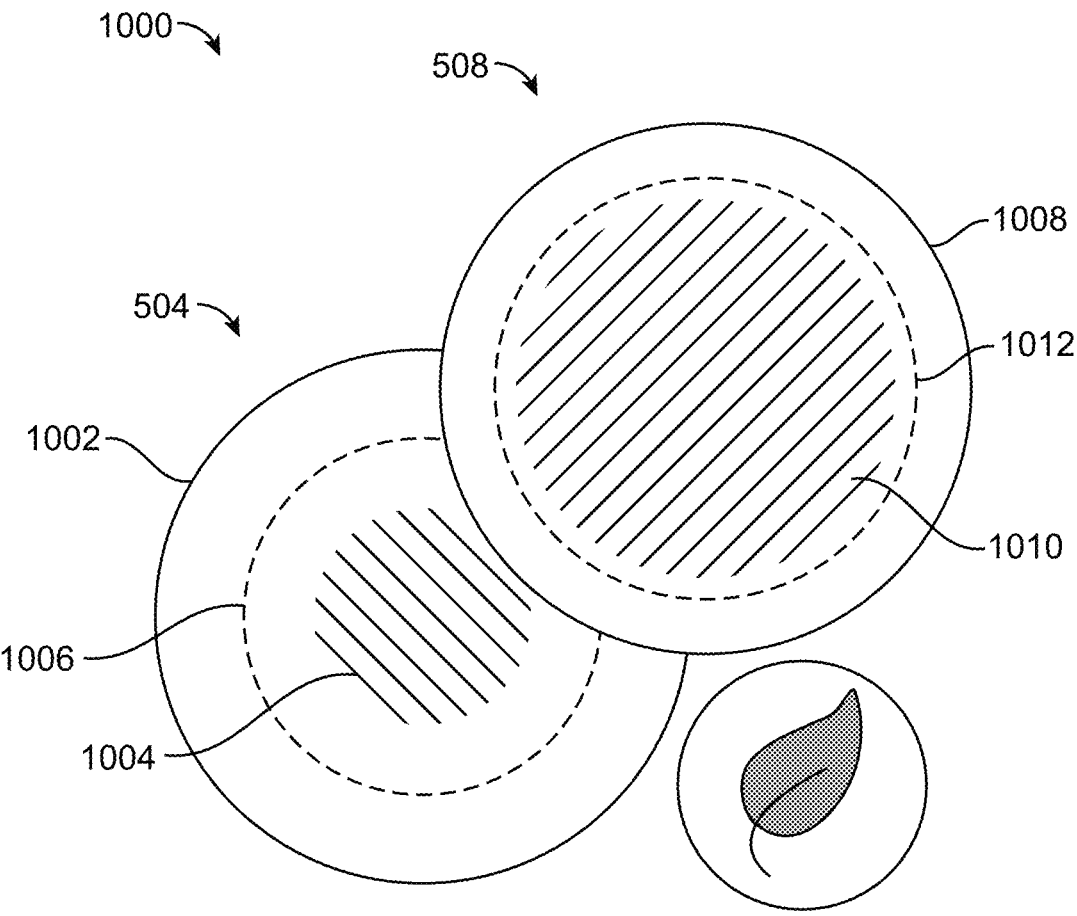
FIG. 10 illustrates an example widget that displays a visual indication of one or more sustainability metrics for a relative mode of operation, according to various embodiments of the present disclosure.

FIG. 10 illustrates another example of a sustainability widget 1000 that is displayed, for example via the GUI 400, to a user when the SI service 110 is operating in the relative operating mode. The sustainability widget 1000 can be, for example, implemented as the sustainability widget 408 shown in FIG. 4. As a user edits the design of an object in the CAD application 105, the SI service 110 updates, in real-time, the display of the sustainability widget 1000 to indicate how changes to the design impact the sustainability metrics associated with the design of the object.

As shown, the sustainability widget 1000 displays visual indications of first and second sustainability metrics 504, 508 associated with the design of an object. The visual indication associated with the first sustainability metric 504 (e.g., price) includes a first area 1002, a first shaded portion 1004, and a first circle 1006 disposed within the first area 1002. The size of the first shaded portion 1004 corresponds to a current amount, or value, of the first sustainability metric 504 and the first circle 1006 corresponds to a target for the first sustainability metric 504. When the first sustainability metric 504 progresses towards the target relative to the design benchmark, the SI service 110 reduces the size of the first shaded portion 1004 relative to the first area 1002. In contrast, when the first sustainability metric 504 worsens relative to the design benchmark, the SI service 110 increases the size of the first shaded portion 1004 relative to the first area 1002. When the first shaded portion 1004 lies within the first circle 1006, the target for the first sustainability metric 504 relative to the design benchmark has been achieved. When the first shaded portion 1004 lies outside, or exceeds the bounds, of the first circle 1006, the target for the first sustainability metric 504 relative to the design benchmark has not been achieved.

Similarly, the visual indication associated with the second sustainability metric 508 (e.g., lifetime carbon emissions) includes a second area 1008, a second shaded portion 1010, and a second circle 1012 disposed within the second area 1008. The size of the second shaded portion 1010 corresponds to a current amount, or value, associated with the second sustainability metric 508 and the second circle 1012 corresponds to a target for the second sustainability metric 508. When the second sustainability metric 508 progresses towards the target relative to the design benchmark, the SI service 110 reduces the size of the second shaded portion 1010 relative to the second area 1008. In contrast, when the second sustainability metric 504 worsens relative to the design benchmark, the SI service 110 increases the size of the second shaded portion 1010 relative to the second area 1008. When the second shaded portion 1010 lies within the second circle 1012, the target for the second sustainability metric 508 relative to the design benchmark has been achieved. When the second shaded portion 1010 lies outside, or exceeds the bounds, of the second circle 1012, the target for the second sustainability metric 508 relative to the design benchmark has not been achieved.

Although the sustainability widget 1000 is used to display visual indications of two sustainability metrics associated with the design of the object, persons skilled in the art will understand that sustainability widget 1000 can display visual indications of more than or fewer than two sustainability metrics associated with the design of the object.

Figure 11:
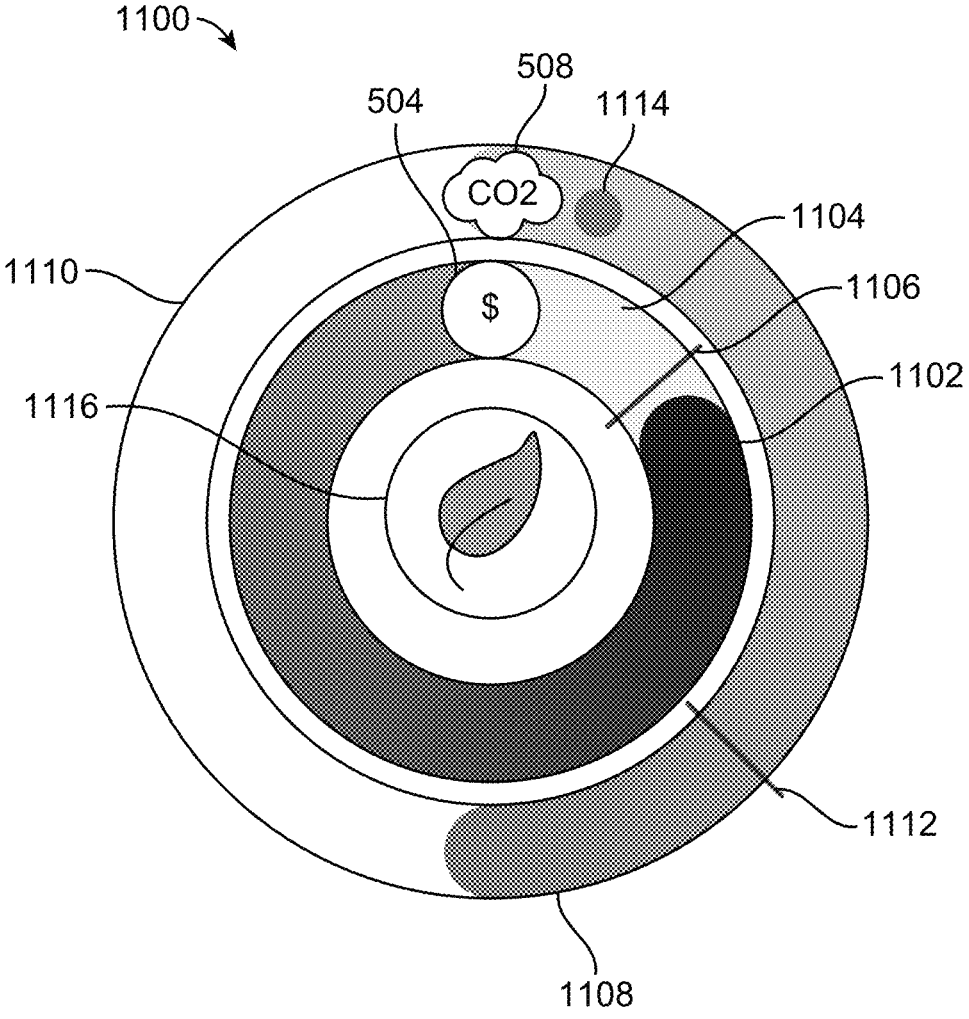
FIG. 11 illustrates an example widget that displays a visual indication of one or more sustainability metrics for a relative mode of operation, according to various embodiments of the present disclosure.

FIG. 11 illustrates another example of a sustainability widget 1100 that is displayed, for example via the GUI 400, to a user when the SI service 110 is operating in the relative operating mode. The sustainability widget 1100 can be, for example, implemented as the sustainability widget 408 shown in FIG. 4. The sustainability widget 1100 is similar in implementation to the sustainability widget 700 described above. However, the sustainability widget 1100 includes some additional display elements that provide further sustainability insights to a user designing an object in the CAD application 105. As a user edits the design of an object in the CAD application 105, the SI service 110 updates, in real-time, the display of the sustainability widget 1100 to indicate how changes to the design impact the sustainability metrics associated with the design of the object.

As shown, the sustainability widget 1100 displays visual indications of first and second sustainability metrics 504, 508 associated with the design of an object. The visual indication the first sustainability metric 504 (e.g., price) includes a first shaded portion 1102 of a first circular bar, or ring, 1104. Furthermore, the visual indication of the first sustainability metric 504 includes a first target line 1106 indicative of a target for the first sustainability metric 504 relative to a design benchmark. The visual indication of the second sustainability metric 508 (e.g., lifetime carbon emissions) includes a second shaded portion 1108 of a second circular bar, or ring, 1110. Furthermore, the visual indication of the second sustainability metric 508 includes a second target line 1112 indicative of a target for the second sustainability metric 504 relative to a design benchmark and a target dot 1114. The sustainability widget 1100 also includes a sustainability icon 1116, which is similar to the sustainability icon 610 described above.13

With respect to the visual indication of the second sustainability metric 508, the SI service 110 added the target dot 1114 to the second ring 1110 to indicate that a target for the second sustainability metric 508 relative to a design benchmark has been achieved once. For example, if it is assumed that a user defined a target for the second sustainability metric 508 to decrease by 10% relative to the design benchmark, the SI service 110 adds target dot 1114 to the visual indication of the second sustainability metric 508 in response to determining that a current value of the second sustainability metric 508 has decreased by 10% relative to the design benchmark a single time. Continuing with this example, if the SI service 110 determines, after the target for the second sustainability metric 508 relative to the design benchmark has been achieved a first time, that the second sustainability metric 508 has decreased by another 10% relative to the design benchmark, the SI service 110 updates the sustainability widget 1100 by adding a second target dot 1114 to the visual indication of the second sustainability metric 508. Moreover, for each time the second sustainability metric 508 achieves the target improvement relative to the design benchmark, the SI service 110 adds an additional target dot 1114 to the visual indication of the second sustainability metric 508 displayed by the sustainability widget 1100. Although the above description of target dots is provided with respect to the visual indication of second sustainability metric 508, persons skilled in the art will understand the description is equally applicably to adding target dots to the visual indications of the first sustainability metric 504 or some other sustainability metric displayed by the sustainability widget 1100.

As described above, the visual indication of the second sustainability metric 508 further includes a second target line 1112 indicative of a target for the second sustainability metric 504. In some embodiments, the second target line 1112 is indicative of an intermediate, or sub, target for the second sustainability metric 508. For example, the SI service 110 can adjust and/or define, in real-time, intermediate targets for further improving the second sustainability metric 508 and display, in real-time, the second target line 1112 on the visual indication of the second sustainability metric 508. Accordingly, while editing the design in the CAD application 105, a user can track progress towards achieving the intermediate target for second sustainability metric 508 by viewing the position, or end portion, of the second shaded portion 1108 relative to the second target line 1112. For example, if the second shaded portion 1108 increases past the second target line 1112, a user can determine that an intermediate target for the second sustainability metric 508 has been met.

Although the above description of target lines is provided with respect to the visual indication of second sustainability metric 508, persons skilled in the art will understand the description is equally applicably to visual indications of the first sustainability metric 504 or some other sustainability metric displayed by the sustainability widget 1100. Furthermore, although the sustainability widget 1100 is used to display visual indications of two sustainability metrics associated with the design of the object, persons skilled in the art will understand that sustainability widget 1100 can display visual indications of more than or fewer than two sustainability metrics associated with the design of the object.

Figure 12:
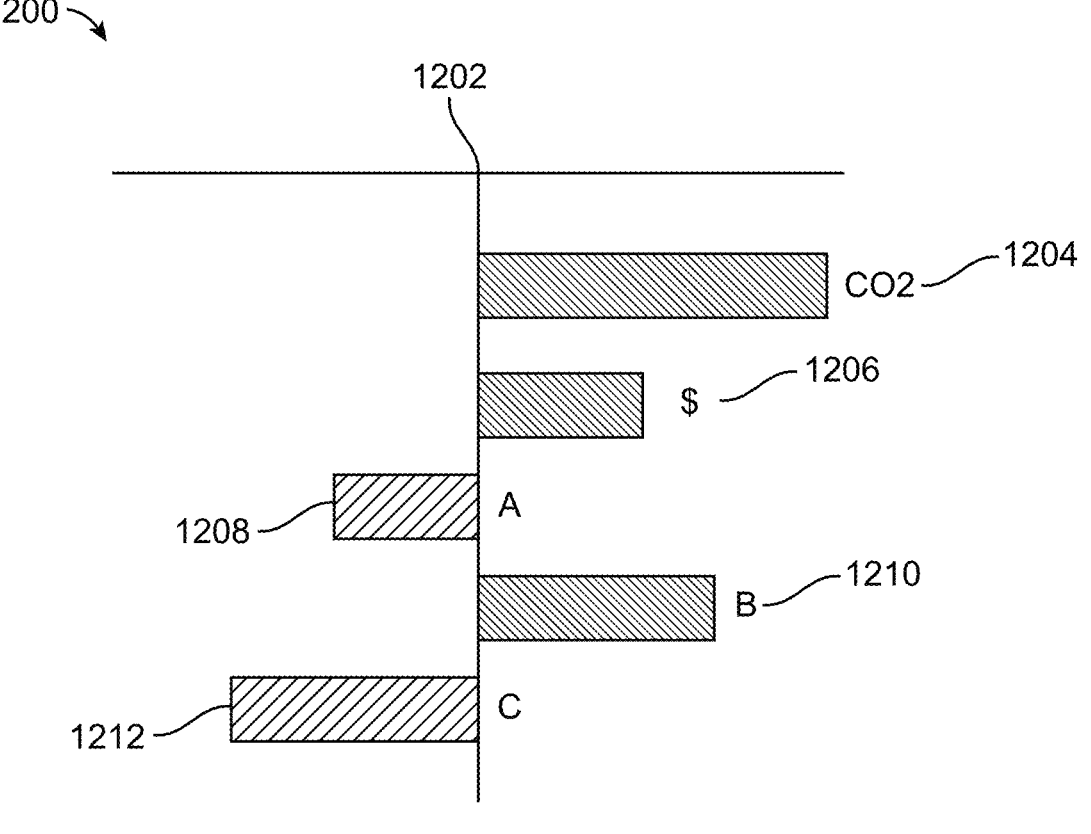
FIG. 12 illustrates an example widget that displays a visual indication of one or more sustainability metrics for a relative mode of operation, according to various embodiments of the present disclosure.
Figures 13A, 13B, 13C, 13D:
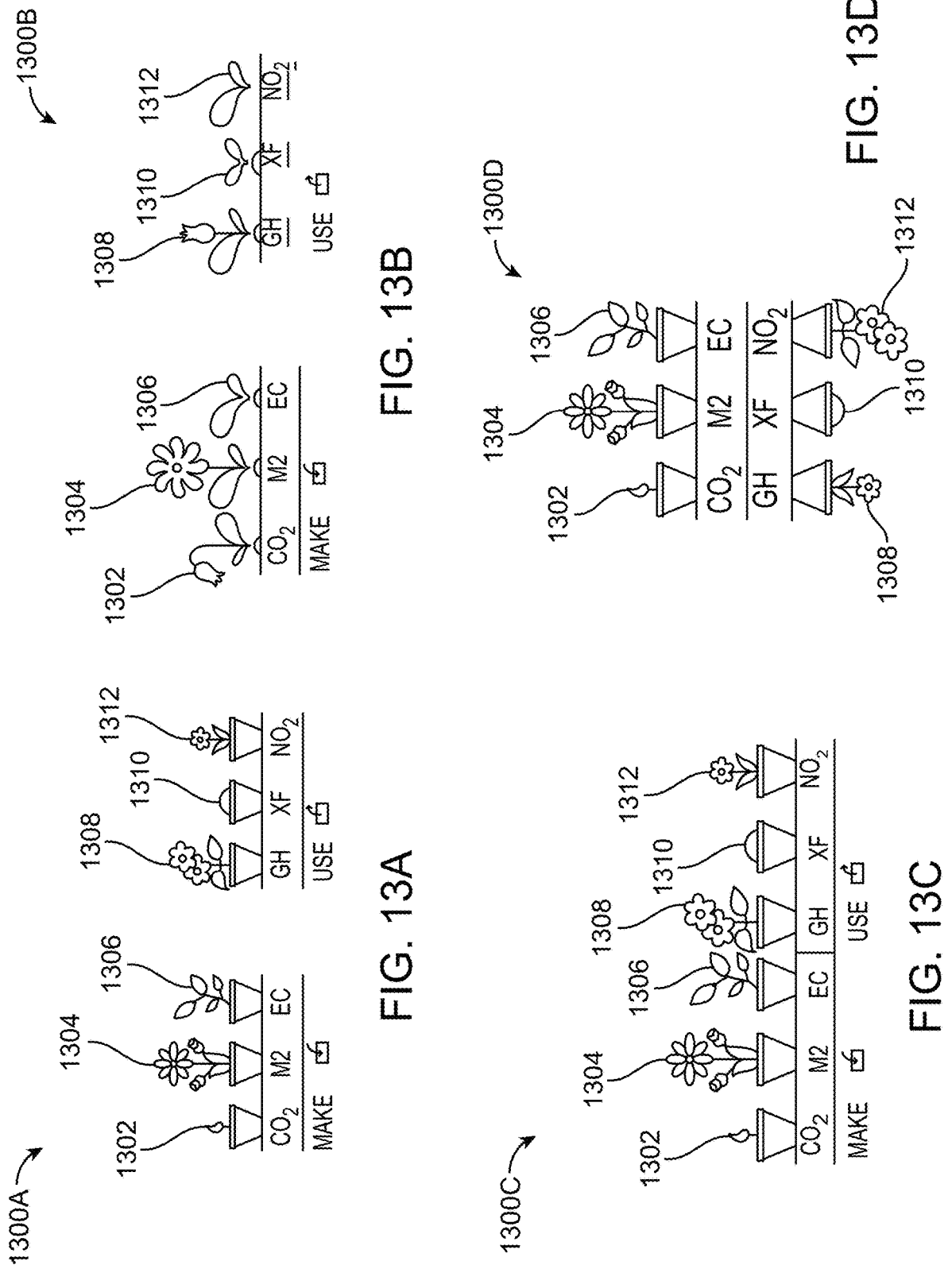
FIGS. 13A-13D illustrate example widgets that display a visual indication of one or more sustainability metrics for a relative mode of operation, according to various embodiments of the present disclosure.

FIG. 12 illustrates another example of a sustainability widget 1200 that is displayed, for example via the GUI 400, to a user when the SI service 110 is operating in the relative operating mode. The sustainability widget 1200 can be, for example, implemented as the sustainability widget 408 shown in FIG. 4. As a user edits the design of an object in CAD application 105, the SI service 110 updates, in real-time, the display of the sustainability widget 1200 to indicate how changes to the design impact the sustainability metrics associated with the design of the object.

The sustainability widget 1200 includes visual indications for a plurality of sustainability metrics relative to a design benchmark. For example, the sustainability widget 1200 is implemented as a divergent bar graph centered at a design benchmark origin 1202. When a respective sustainability metric improves relative to a corresponding design benchmark, the SI service 110 increases the size of the visual indication, or bar, associated with the sustainability metric in the direction to the right of the design benchmark origin 1202. In contrast, when a respective sustainability metric worsens relative to a corresponding design benchmark, the SI service 110 increases the size of the visual indication, or bar, associated with the sustainability metric in the direction to the left of the design benchmark origin 1202.

In the illustrated example, the sustainability widget 1200 displays visual indications of five different sustainability metrics associated with the design of an object. For example, sustainability widget 1200 displays a visual indication of a first sustainability metric 1204 (e.g., carbon emissions), a visual indication of a second sustainability metric 1206 (e.g., price), a visual indication of a third sustainability metric 1208 (e.g., metric A), a visual indication of a fourth sustainability metric 1210 (e.g., metric B), and a visual indication of a fifth sustainability metric 1212 (e.g., metric C). Although the sustainability widget 1200 is used to display visual indications of five sustainability metrics associated with the design of the object, persons skilled in the art will understand that sustainability widget 1200 can display visual indications of more than or fewer than five sustainability metrics associated with the design of the object.

FIGS. 13A-13D illustrate various examples of sustainability widgets 1300A-1300D that can be displayed, for example via the GUI 400, to a user when the SI service 110 is operating in the relative operating mode. Each of the sustainability widgets 1300A-1300D can be, for example, implemented as the sustainability widget 408 shown in FIG. 4. As a user edits the design of an object in the CAD application 105, the SI service 110 updates, in real-time, the display of a respective one of the sustainability widgets 1300A-1300D to indicate how changes to the design impact the sustainability metrics associated with the design of the object.

Each sustainability widget 1300A-1300D displays visual indications for a plurality of sustainability metrics associated with the design of an object relative to a corresponding design benchmark. In particular, each sustainability widget 1300A-1300D displays the visual indication of a sustainability metric as a growth level of a plant. The growth level of a plant included in the visual indication of a sustainability metric corresponds to an amount of progress that the sustainability metric has made towards achieving a target relative to a design benchmark. For example, a plant of a relatively high growth level would be included in the visual indication of a sustainability metric that is close to achieving a target relative to the design benchmark. Likewise, a plant of a relatively low growth level would be included in the visual indication of a sustainability metric that is far from achieving a target relative to the design benchmark.

In the illustrated examples of FIGS. 13A-13D, the sustainability widgets 1300A-1300D each display, using plant growth levels, visual indications of six different sustainability metrics relative to corresponding design benchmarks. For example, each sustainability widget 1300A-1300D displays a visual indication of a first sustainability metric 1302 (e.g., carbon emissions), a visual indication of a second sustainability metric 1304 (e.g., M2), a visual indication of a third sustainability metric 1306 (e.g., EC), a visual indication of a fourth sustainability metric 1308 (e.g., GH), a visual indication of a fifth sustainability metric 1310 (e.g., XF), and a visual indication of a sixth sustainability metric 1312 (e.g., nitrogen dioxide). Although the sustainability widgets 1300A-1300D are used to display visual indications of six sustainability metrics associated with the design of the object, persons skilled in the art will understand that sustainability widgets 1300A-1300D can display visual indications of more than or fewer than six sustainability metrics associated with the design of the object.

Figures 14A, 14B:
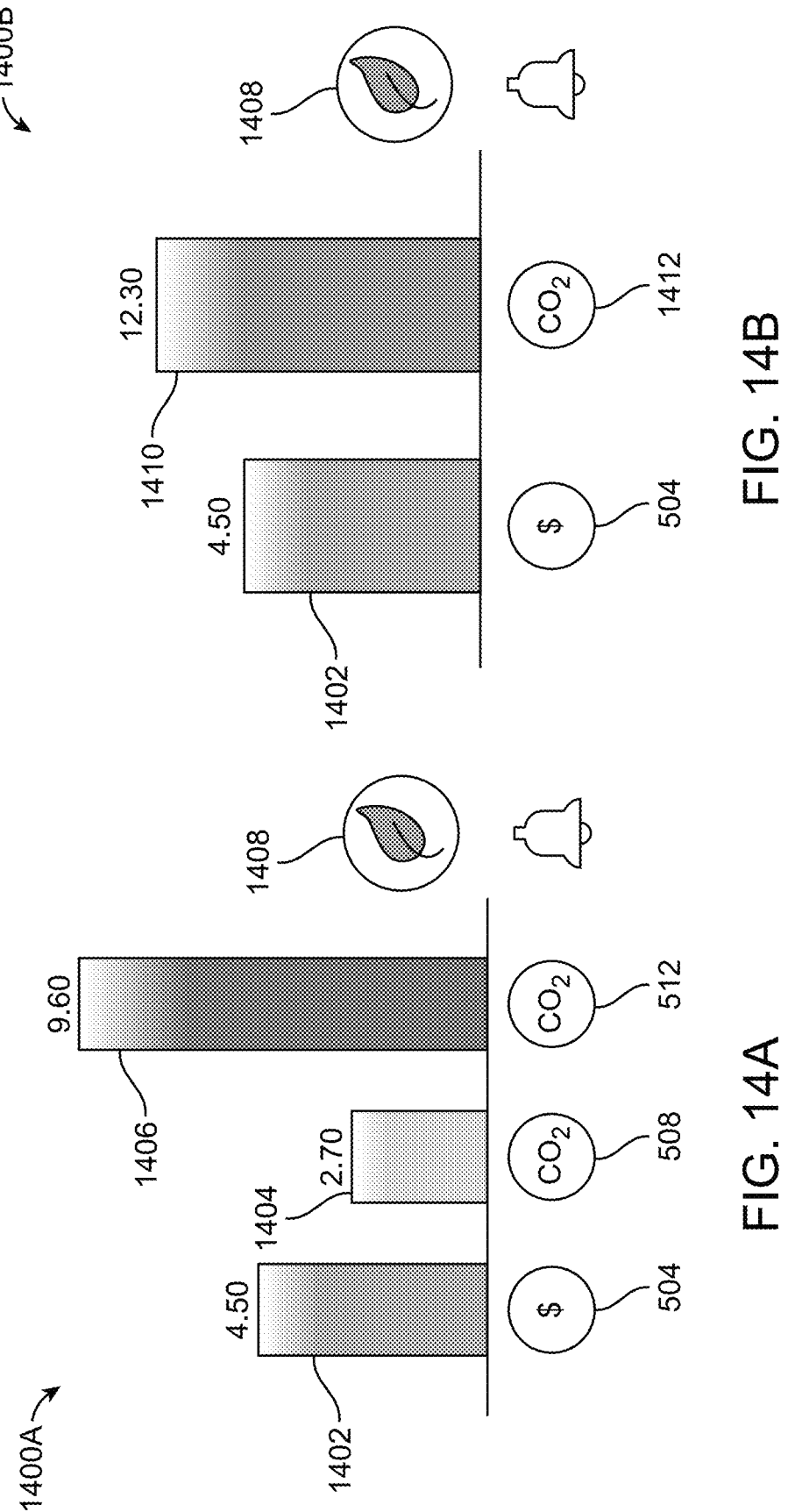
FIG. 14A illustrates an example widget that displays a visual indication of multiple sustainability metrics for an absolute mode of operation, according to various embodiments of the present disclosure.
FIG. 14B illustrates an example widget that displays a visual indication of a combination of the multiple sustainability metrics displayed by the widget of FIG. 14A, according to various embodiments of the present disclosure.

FIGS. 14A and 14B illustrate various examples of sustainability widgets 1400A and 1400B that can be displayed, for example via the GUI 400, to a user when the SI service 110 is operating in an absolute operating mode. Each of the sustainability widgets 1400A and 1400B can be, for example, implemented as the sustainability widget 408 shown in FIG. 4. As a user edits the design of an object in CAD application 105, the SI service 110 updates, in real-time, the display of a respective one of the sustainability widgets 1400A and 1400B to indicate how changes to the design impact the sustainability metrics associated with the design of the object.

The sustainability widget 1400A is similar to the sustainability widget 600 described above with respect to FIG. 6. As shown, the sustainability widget 1400A displays a first visual indication 1402 of the first sustainability metric 504 (e.g., price) associated with the design of an object, a second visual indication 1404 of the second sustainability metric 508 (e.g., lifetime carbon emissions) associated with the design of an object, and a third visual indication 1406 of the third sustainability metric 512 (e.g., embodied carbon emissions) associated with the design of an object. The visual indications 1402, 1404, and 1406 of the sustainability metrics are shown as respective bars in the bar graph. The sustainability widget 1400A also includes a sustainability icon 1408, which is similar to the sustainability icon 610 described above.

However, in some instances, a user might desire to combine the visual indications of similar and/or related sustainability metrics associated with the design of the object into a single visual indication. For example, as it pertains to the design of the object, a user might consider that the second sustainability metric 508 (e.g., lifetime carbon emissions) is similar, or related to, the third sustainability metric 512 (e.g., embodied carbon emissions). Thus, to reduce the amount of information displayed by the sustainability widget 1400A, the user might desire to combine second visual indication 1404 of the second sustainability metric 508 (e.g., lifetime carbon emissions) and the third visual indication 1406 of the third sustainability metric 512 (e.g., embodied carbon emissions) into a single visual indication of a combined carbon emissions sustainability metric.

As shown in FIG. 14B, the sustainability widget 1400B displays a single visual indication 1410 of a combined carbon emissions sustainability metric 1412. That is, the single visual indication 1410 is the combination of the second visual indication 1404 of the second sustainability metric 508 (e.g., lifetime carbon emissions) and the third visual indication 1406 of the third sustainability metric 512 (e.g., embodied carbon emissions). While working within the CAD application 105, a user can toggle back and forth, for example using the cursor 404, between display of the sustainability widget 1400A and display of the sustainability widget 1400B.

Although the sustainability widgets 1400A and 1400B are shown and described above with respect to the absolute operating mode of SI service 110, persons skilled in the art will understand that SI service 110 can also combine visual indications of sustainability metrics displayed by a sustainability widget while the SI service 110 is operating in the relative operating mode. Furthermore, although the sustainability widget 1400B is described as combining two visual indications of sustainability metrics into a single visual indication of a combined sustainability metric, persons skilled in the art will understand that more than two visual indications of sustainability metrics can be combined into a single sustainability metric.

In some instances, when the SI service 110 determines an updated value of a sustainability metric associated with the design of an object, the SI service 110 is unable to determine with absolute certainty an exact value of the sustainability metric. In such instances, the SI service 110 determines an approximate updated value of the sustainability metric that includes a degree of uncertainty. That is, the SI service 110 might determine that an approximate value of a sustainability metric that lies within a range, or tolerance, of possible values. As an example, in response to a user changing the design of the object, the SI service 110 might determine that an updated price of the design of the object has a value between $10.00 and $11.00.

Accordingly, when the SI service 110 is uncertain of an exact value of a sustainability metric and instead determines an approximate value of a sustainability metric, the SI service 110 can apply a visual effect to the visual indication of the sustainability metric to indicate a degree of uncertainty associated with the determined value of the sustainability metric. As an example, if a sustainability widget is implemented as a bar graph, the SI service 110 can apply a visual effect to the end of a bar included in the visual indication of a sustainability metric to indicate a degree of uncertainty associated with the value of the sustainability metric determined by the SI service 110. Persons skilled in the art will understand that the SI service 110 can apply an uncertainty visual effect to any type of visual indication of a sustainability metric, not just a bar in a bar graph, displayed by a sustainability widget.

Figure 15:
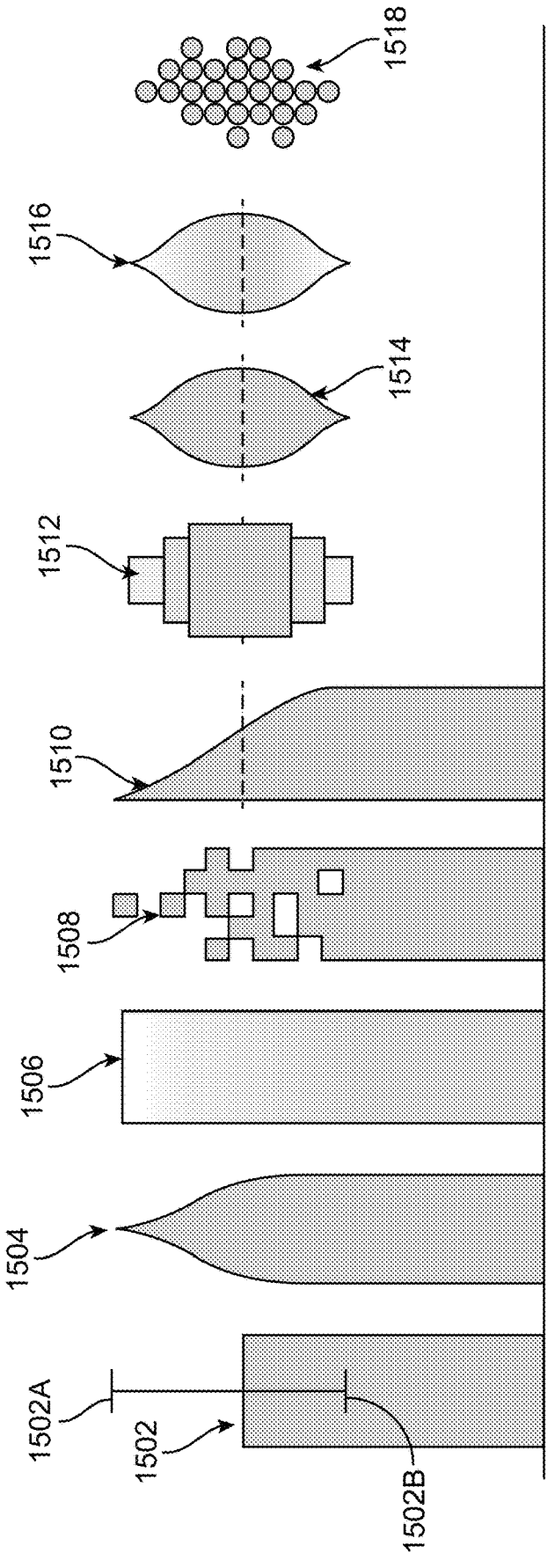
FIG. 15 illustrates various examples of visual effects that can be applied to a visual indication of a sustainability metric, according to various embodiments of the present disclosure.

FIG. 15 illustrates various examples of uncertainty visual effects that can be applied to a visual indication of a sustainability metric displayed by a sustainability widget. As shown, a first uncertainty visual effect 1502 includes a first dash 1502A that indicates a maximum possible value of the sustainability metric and a second dash 15028 that indicates a minimum possible value of the sustainability metric. A second uncertainty visual effect 1504 gradually narrows the visual indication of a sustainability metric from a minimum possible value of the sustainability metric to a point indicative of a maximum possible value of the sustainability metric. A third uncertainty visual effect 1506 applies a gradient affect to the visual indication of a sustainability metric, where the visual indication gradually fades in color from a minimum possible value of the sustainability metric to a maximum possible value of the sustainability metric. Visual uncertainty effects 1508, 1510, 1512, 1514, 1516, and 1518 are other examples of visual effects that can be applied to visual indications of sustainability metrics displayed by a sustainability widget. As shown, visual uncertainty effects 1510, 1512, 1514, 1516 display a midpoint in a range of possible values of a sustainability metric.

In some instances, a user might desire to view additional information, or details, associated with a sustainability metric of a design that is not displayed by a sustainability widget. Accordingly, in some embodiments, a user can interact with a sustainability widget to view additional information associated with a sustainability metric of a design. In such embodiments, in response to detecting a user interaction with the sustainability widget, the SI service 110 generates a pop-up that displays additional information associated with one or more sustainability metrics of the design. As an example, when designing an object in the CAD application 105, a user can interact with, for example using cursor 404, a sustainability widget (e.g., one or more of the sustainability widgets described herein) displayed by the GUI 400. Continuing with this example, the SI service 110 detects the user interaction with the sustainability widget and, in response, generates a pop-up that displays additional information associated with the one or more sustainability metrics of the design of the object. User interaction with the sustainability metric can include, without limitation, hovering over the sustainability widget with the cursor 404, clicking on the sustainability widget with the cursor 404, hovering over a visual indication of a particular sustainability metric displayed by the sustainability widget with the cursor 404, or clicking on a visual indication of a particular sustainability metric displayed by the sustainability widget with the cursor 404.

Figure 16B:
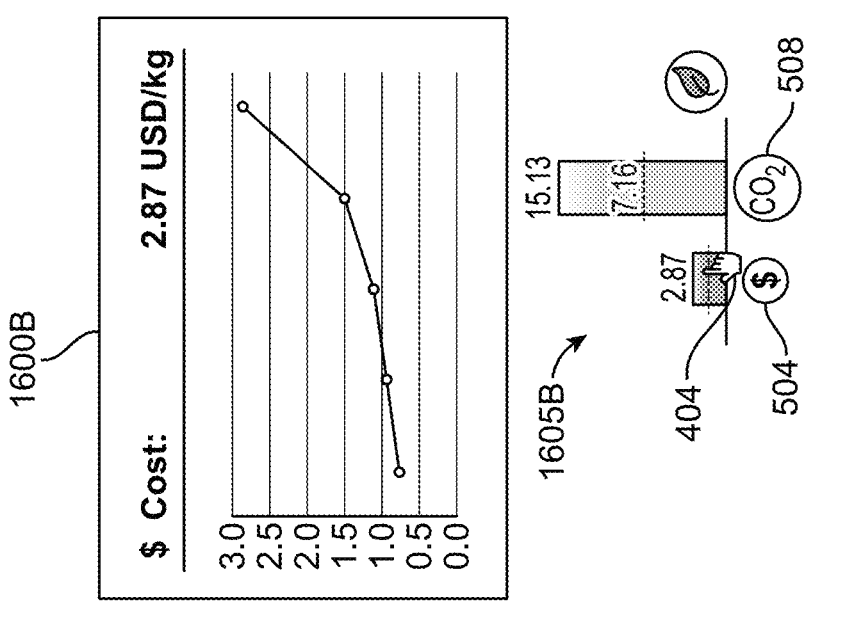
FIGS. 16A and 16B illustrate example pop-ups associated with one or more sustainability metrics, according to various embodiments of the present disclosure.
Figure 16A:
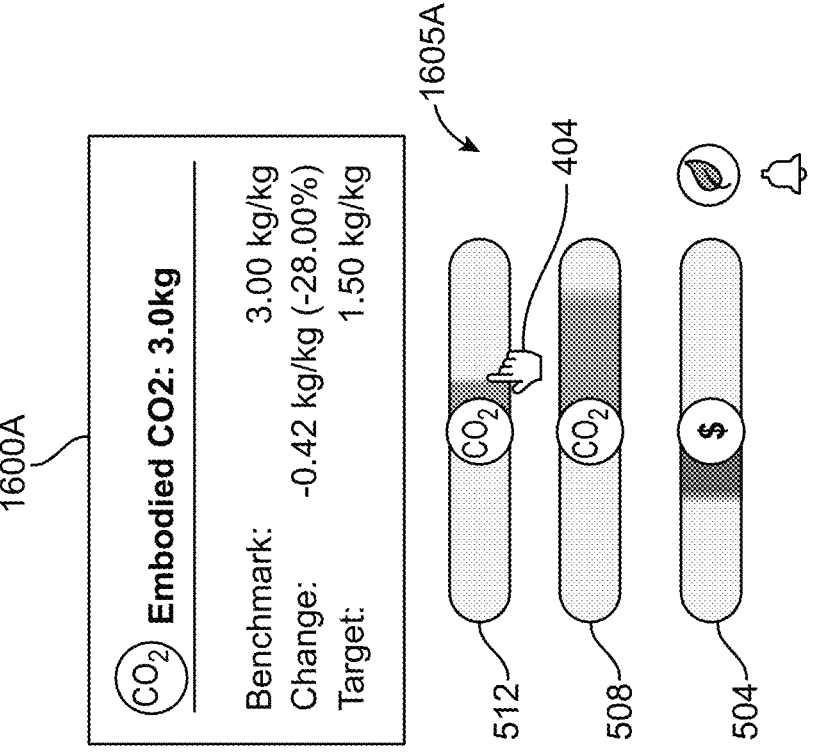

FIG. 16A illustrates an example pop-up 1600A that is generated by the SI service 110 and displayed to a user when the user interacts with sustainability widget 1605A. The SI service 110 can display the pop-up 1600A, without limitation, near the sustainability widget 1605A, overlapping with the sustainability widget 1605A, near the model of the object in CAD application 105, and/or in some other location within the periphery of CAD application 105. As shown, the sustainability widget 1605A displays a visual indication of the first sustainability metric 504 (e.g., price), a visual indication of the second sustainability metric 508 (e.g., lifetime carbon emissions), and a visual indication of the third sustainability metric 512 (e.g., embodied carbon emissions). When a user of the CAD application 105 interacts, for example using cursor 404, with the visual indication of the third sustainability metric 512, the SI service 110 generates and displays the pop-up 1600A that includes additional details associated with the third sustainability metric 512. As shown, the pop-up 1600A displays additional details associated with a benchmark value for the third sustainability metric 512, a change in the third sustainability metric 512 of the current design relative to the design benchmark, and a target value for the third sustainability metric 512. Persons skilled in the art will understand that the information displayed by the pop-up 1600A is provided as an example, and that additional information or details associated with a sustainability metric can be displayed by the pop-up 1600A. Moreover, although the pop-up 1600A is described with respect to the third sustainability metric 512, persons skilled in the art will understand that the description of pop-up 1600A is also applicable to pop-ups associated with other sustainability metrics of the design.

FIG. 16B illustrates an example pop-up 1600B that is generated by the SI service 110 and displayed to a user when the user interacts with the sustainability widget 1605B. For example, the SI service 110 can display the pop-up 1600B, without limitation, near the sustainability widget 1605B, overlapping with the sustainability widget 1605B, near the model of the object in the CAD application 105, and/or at some other location within the periphery of the CAD application 105. As shown, the sustainability widget 1605B displays a visual indication of the first sustainability metric 504 (e.g., price) and a visual indication of the second sustainability metric 508 (e.g., lifetime carbon emissions). When a user of the CAD application 105 interacts, for example using cursor 404, with the visual indication of the first sustainability metric 504, the SI service 110 generates and displays the pop-up 1600B that includes additional details associated with the first sustainability metric 504. As shown, the pop-up 1600B displays a timeline view that indicates how the first sustainability metric 504 of the design of the object has changed over time as the user has made changes to the design object. Persons skilled in the art will understand that the information displayed by pop-up 1600B is provided as an example, and that additional information or details associated with a sustainability metric can be displayed by the pop-up 1600B. Moreover, although the pop-up 1600B is described with respect to the first sustainability metric 504, persons skilled in the art will understand that the description of pop-up 1600B is also applicable to pop-ups associated with other sustainability metrics of the design of the object.

In some instances, a user might desire to understand how one or more components included in the design of the object contribute to a sustainability metric associated with the design of the object. For example, when a user desires to improve a particular sustainability metric associated with the design of the object, it could be useful for the user to understand which components contribute to worsening a sustainability metric associated with the design of the object and/or which components contribute to improving a sustainability metric associated with the design of the object. Accordingly, the SI service 110 can generate and display additional information indicative of a contribution of an individual component included in the design of the object to one or more sustainability metrics associated with the design of the object.

In some embodiments, the SI service 110 uses techniques described above with respect to FIGS. 1-3 to determine a contribution of a component to a sustainability metric associated with the design of an object. For example, the SI service 110 determines a contribution of a component to a sustainability metric based on one or more of data included in the design data 316 that is associated with the component (e.g., data indicative of one or more physical parameters of the component), data in the material sustainability data 318 that is associated with the component (e.g., sustainability data associated with the material(s) used to construct the component), and/or data in the material pricing data 320 that is associated with the component (e.g., data associated with the price of materials used to construct the component). In some embodiments, the SI service 110 displays information indicative of component contributions to a particular sustainability metric associated with the design of the object in response to a user request and/or action. For example, the SI service 110 can generate a pop-up including the information indicative of the component contributions to a particular sustainability metric associated with the design of the object in response to detecting a user interaction with a sustainability widget being displayed to a user.

Figures 17A, 17B:
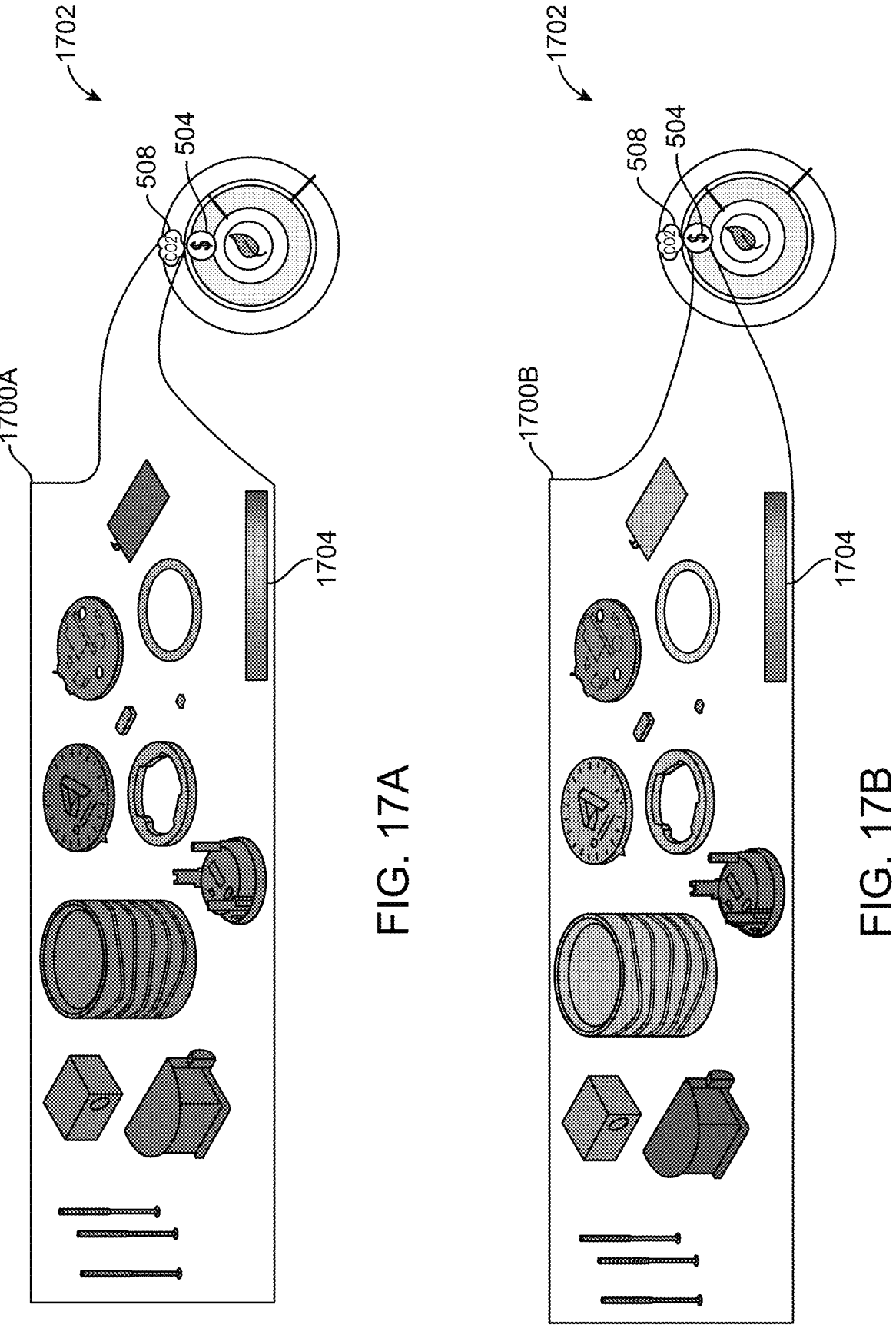
FIGS. 17A and 17B illustrate example component heat maps associated with one or more sustainability metrics, according to various embodiments of the present disclosure.

FIG. 17A illustrates an example pop-up 1700A that is generated by the SI service 110 and displayed to a user when the user interacts with the sustainability widget 1702. The SI service 110 can display the pop-up 1700A, without limitation, near the sustainability widget 1702, overlapping with the sustainability widget 1702, near the model of the object in CAD application 105, and/or in some other location within the periphery of CAD application 105. As shown, the sustainability widget 1702 displays a visual indication of the first sustainability metric 504 (e.g., price) associated with the design of the object and a visual indication of the second sustainability metric 508 (e.g., lifetime carbon emissions) associated with the design of the object. When a user of the CAD application 105 interacts, for example using cursor 404, with the visual indication of the second sustainability metric 508, the SI service 110 generates and displays the pop-up 1700A that includes details associated with the respective contributions of design components to the second sustainability metric 508. For example, the SI service 110 determines a value, or amount, of a contribution to the second sustainability metric 508 of one or more components included in the design of the object and displays, via pop-up 1700A, information associated with the respective contributions of the one or more components included in the design of the object to the second sustainability metric 508.

In the illustrated example of FIG. 17A, the pop-up 1700A displays a heatmap that colorizes a respective visual indication, or rendering, of each component included in the design of the object based on the respective contributions of the components to the second sustainability metric 508. For example, the heat map includes a gradient scale 1704 that gradually changes from a first color (e.g., blue) on the left-side of the scale 1704 to a second color (e.g., red) on the right-side of the scale 1704. The first color on the left-side of the scale 1704 is indicative of the smallest contribution by a component to the second sustainability metric 508 and the second color on the right-side of the scale 1704 is indicative of the largest contribution by a component to the second sustainability metric 508. Moreover, as the color of the scale 1704 changes in the left-to-right direction along the scale 1704, the left-to-right changing color of the scale 1704 indicates an increasing amount of contribution to the second sustainability metric 508. Accordingly, when a rendering of a first component included in the design of the object is displayed in the pop-up 1700A with a color on the left-side of the scale 1704, a user can determine that the first component has a smaller contribution to the second sustainability metric 508 than a second component included in the design of the object for which a rendering of the second component that is displayed in the pop-up 1700A with a color from the right-side of the scale 1704. The SI service 110 can determine the respective contributions of components included in the design of the object to the second sustainability metric 508 and display, via the pop-up 1700A in real-time, colorized renderings of each component included in the design of the object based on the respective contributions of the components to the second sustainability metric 508. Similarly, FIG. 17B illustrates an example pop-up 1700B that is generated by the SI service 110 and displayed to a user in the form of a colorized heat map to indicate the respective contributions of components included in the design of the object to the first sustainability metric 504.

Although colorized heat maps are used in the illustrated examples of FIGS. 17A and 17B, persons skilled in the art will understand that pop-ups can indicate the respective contributions of components included in the design of the object to a sustainability metric associated with the design of the object in other ways. For example, in some embodiments, the SI service 110 generates and displays a pop-up that includes respective numerical values and/or percentages associated with the respective contributions of components included in the design of the object to a sustainability metric associated with the design of the object. In some embodiments, the SI service 110 generates and displays a pop-up that includes a sorted list of the components included in the design of the object, where the list is sorted in descending or ascending order according to the sizes of the respective contributions of components included in the design of the object to a sustainability metric associated with the design of the object.

Figure 18:
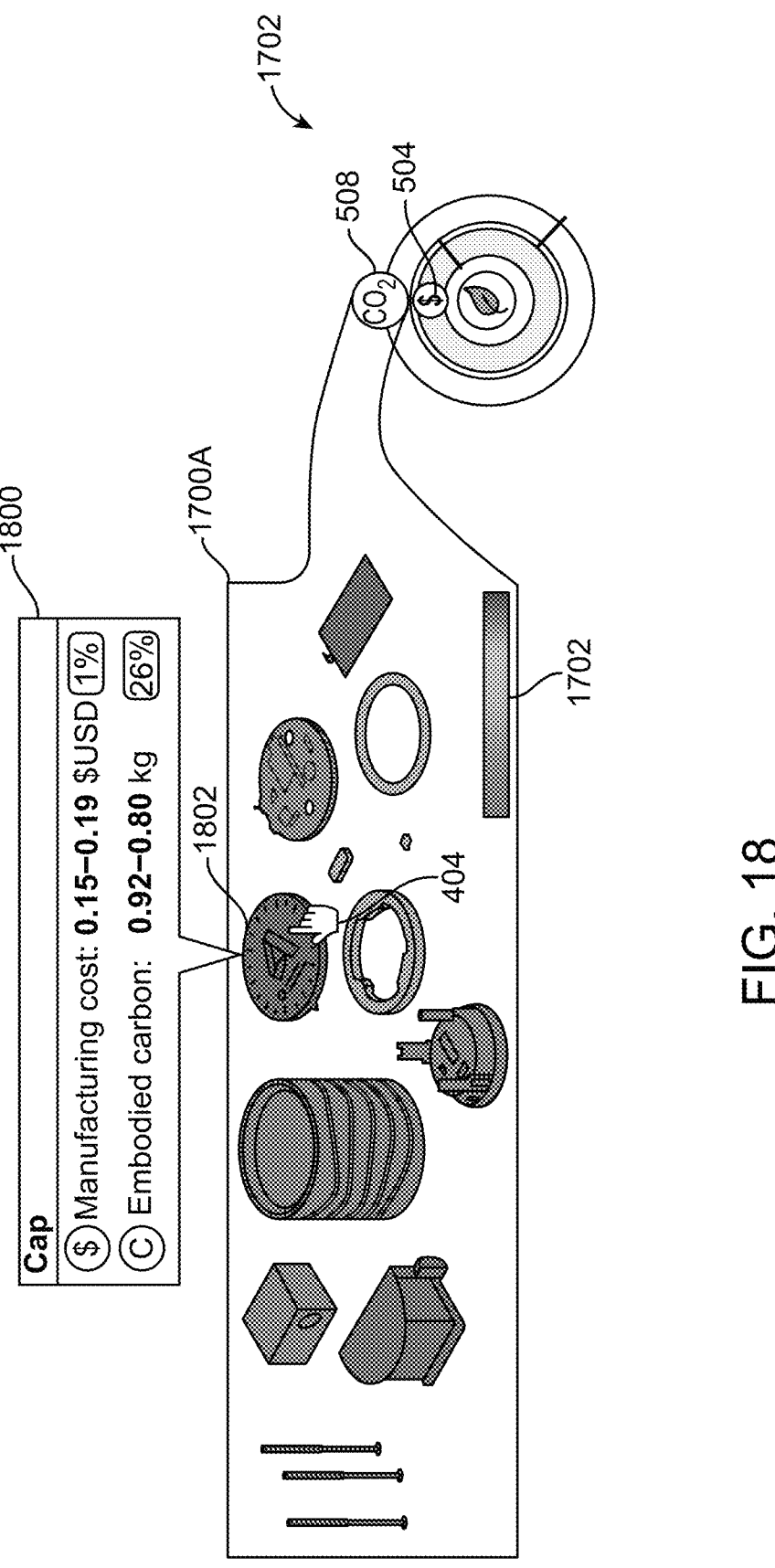
FIG. 18 illustrates an example pop-up associated with component of the heat map of FIG. 17A, according to various embodiments of the present disclosure.

In some instances, a user might desire to view additional information associated with an individual component for which a rendering is displayed in a pop-up, such as pop-up 1700A and/or pop-up 1700B. Accordingly, in some embodiments, a user can interact with the rendering of a component displayed in a pop-up to view additional information associated with the contribution of that component to one or more sustainability metrics associated with the design of the object. As shown in the illustrated example of FIG. 18, when the pop-up 1700A is displayed to a user, the user can interact with the pop-up 1700A to display a second pop-up 1800 that displays additional information associated with a first component 1802 included in the design. For example, using the cursor 404, a user can interact with the rendering of the first component 1802 (e.g., by clicking on and/or hovering over with cursor 404) displayed in the pop-up 1700A. In response to detecting the user interaction with the rendering of the first component 1802 displayed in the pop-up 1700A, the SI service 110 generates and displays the second pop-up 1800.

As shown, the second pop-up includes additional information associated with the contribution of the first component 1802 to a plurality of sustainability metrics associated with the design of the object. For example, as indicated by the second pop-up 1800, the first component 1802 contributes to 1% of the first sustainability metric 504 (e.g., price) and contributes to 26% to the second sustainability metric 508 (e.g., lifetime carbon emissions). Persons skilled in the art will understand that the information displayed by the second pop-up 1800 is provided as an example, and that additional information or details associated with a component included in the design of the object can be displayed by the second pop-up 1800. Moreover, although the pop-up 1800 is described with respect to the first component 1802 included in the design of the object, persons skilled in the art will understand that the description of the second pop-up 1800 is also applicable to pop-ups associated with other components of the design.

In some instances, a user might desire to understand how a component included in the design of an object contributes to a sustainability metric associated with the design of the object without being presented with additional pop-ups, such as the heat map pop-ups 1700A, 1700B described above and shown in FIGS. 17A-17B. Accordingly, the SI service 110 can generate and display a sustainability widget that provides a visual indication of the contribution of a component included in the design of the object to one or more sustainability metrics associated with the design of the object.

In some embodiments, the SI service 110 generates and displays such a sustainability widget in response to receiving a user input that indicates for which component included in the design of the object that a user desires to view a visual indication of the contribution of the component to one or more sustainability metrics associated with the design of the object. For example, a user of the CAD application 105 can interact, using cursor 404, with the design of the object (e.g., 3D model) to select or otherwise indicate to the SI service 110 for which component or grouping of components the user desires to view a visual indication of the contribution to one or more sustainability metrics associated with the design. In some examples, within the CAD application 105, the user selects the component(s) included the design by interacting with an exploded view of the design of the object. With respect to the illustrated example of FIG. 4 in which the object 406 is a building, a user might select and/or interact with a window included in the model of the object 406 when the user desires to view a visual indication of the contribution of the window to one or more sustainability metrics associated with the design of the object.

In response to detecting a user input that indicates the user desires to view a visual indication of the contribution of a component and/or group of components to the one or more sustainability metrics associated with the design of the object, the SI service 110 determines, in real-time, an amount by which the component and/or group of components contributes to the one or more sustainability metrics. For example, the SI service 110 determines an amount by which a component contributes to a sustainability metric associated with the design of the object based on one or more of data included in the design data 316 that is associated with the component (e.g., data indicative of one or more physical parameters of the component), data included in the material sustainability data 318 that is associated with the component (e.g., sustainability data associated with the material(s) used to construct the component), and/or data included in the material pricing data 320 that is associated with the component (e.g., data associated with the price of materials used to construct the component). Moreover, the SI service 110 generates and displays, in real-time, a sustainability widget that provides a visual indication of the contribution of the component to the one or more sustainability metrics associated with the design of the object.

Figure 19B:
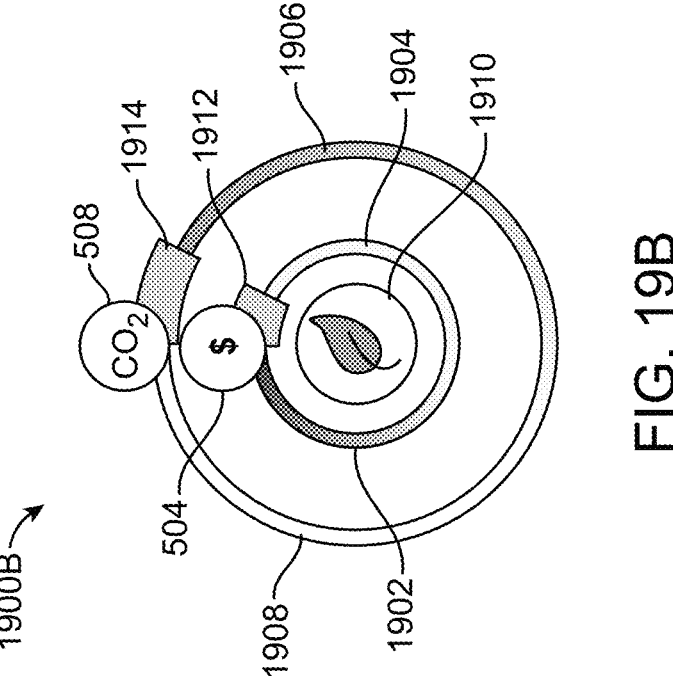
FIG. 19B illustrates an example widget that displays a visual indication of a contribution of a component to the change of one or more sustainability metrics displayed by the widget of FIG. 19A, according to various embodiments of the present disclosure.
Figure 19A:
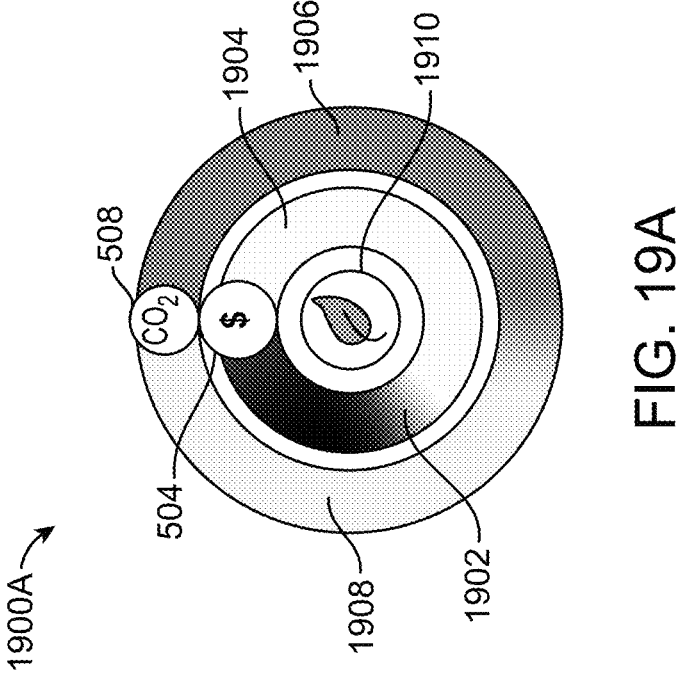
FIG. 19A illustrates an example widget that displays a visual indication of multiple sustainability metrics for a relative mode of operation, according to various embodiments of the present disclosure.

FIG. 19A illustrates an example of a sustainability widget 1900A that is displayed, for example via the GUI 400, to a user when the SI service 110 is operating in the relative operating mode. The sustainability widget 1900A is similar to the sustainability widget 700 described above and can be, for example, implemented as the sustainability widget 408 shown in FIG. 4. As shown, the sustainability widget 1900A displays visual indications of first and second sustainability metrics 504, 508 associated with the design of an object. The visual indication of the first sustainability metric 504 (e.g., price) includes a first shaded portion 1902 of a first ring 1904, which indicates an amount of progress made towards achieving a target for the first sustainability metric 504 relative to a design benchmark. Similarly, the visual indication of the second sustainability metric 508 (e.g., lifetime carbon emissions) includes a second shaded portion 1906 of a second ring 1908, which indicates an amount of progress made towards achieving a target for the second sustainability metric 508 relative to a design benchmark.

In some instances, while a user is viewing the sustainability widget 1900A, the user might desire to view additional information related to the contribution of a component included in the design of the object to the first and/or second sustainability metrics 504, 508. Accordingly, in such instances the user provides an input, for example using cursor 404, that indicates the user desires to view a visual indication of the contribution of a component included in the design of the object to the first and/or second sustainability metrics 504, 508. As described above, in some examples, the user selects or otherwise interacts with, using the cursor 404, a component included in the design of the object for which the user desires to view a visual indication of the contribution of the component to the first and/or second sustainability metrics 504, 508. In other examples, the user can additionally interact with, using the cursor 404, the sustainability icon 1910 to indicate to the SI service 110 that the user desires to view a visual indication of the contribution of a component to one or more sustainability metrics associated with the design of the object. For example, using the cursor 404, a user can interact with the sustainability icon 1910 to open a menu and/or one or more selectable options that can be interacted with by the user to indicate that the user desires to view a visual indication of the contribution of the component to one or more sustainability metrics associated with the design of the object.

In response to detecting the user input, the SI service 110 determines, in real-time, an amount by which the component and/or group of components contribute to one or more sustainability metrics associated with the design of the object. Moreover, the SI service 110 generates and displays a visual indication of the contribution by the component and/or group of components to the one or more sustainability metrics associated with the design of the object.

FIG. 19B illustrates an example of a sustainability widget 1900B that is displayed, for example via the GUI 400, to a user to provide a visual indication of the contribution of a component to a change in one or more sustainability metrics associated with the design of an object. The sustainability widget 1900B can be, for example, implemented as the sustainability widget 408 shown in FIG. 4. Furthermore, in the illustrated example, the SI service 110 generates and displays the sustainability widget 1900B in place of and/or along with the sustainability widget 1900A in response to detecting a user input that indicates the user desires to view a visual indication of the contribution of a component to the one or more sustainability metrics associated with the design of the object.

As shown, the sustainability widget 1900B displays visual indications of first and second sustainability metrics 504, 508 associated with the design of an object. The visual indication of the first sustainability metric 504 (e.g., price) includes a first shaded portion 1902 of a first ring 1904, which indicates an amount of progress made towards achieving a target for the first sustainability metric 504 relative to a design benchmark. Further, the visual indication of the second sustainability metric 508 (e.g., lifetime carbon emissions) includes a second shaded portion 1906 of a second ring 1908, which indicates an amount of progress made towards achieving a target for the second sustainability metric 508 relative to a design benchmark. The sustainability widget 1900B also includes a sustainability icon 1910, which is similar to the sustainability icon 610 described above.

Furthermore, the sustainability widget 1900B displays visual indications of the contributions of a component to the first and second sustainability metrics 504, 508 associated with the design of the object. In particular, the sustainability widget 1900B displays a visual indication of the contribution of component to a change in the sustainability metrics 504, 508 associated with the current design of the object relative to the design benchmark. The visual indication of the contribution of the component to the first sustainability metric 504 includes a first overlapping shaded portion 1912 that overlaps with the first ring 1904 to indicate an amount by which the component has contributed to the change in the first sustainability metric 504. The amount, or size, of the first overlapping shaded portion 1912 corresponds to the amount by which the component contributed to the change in the first sustainability metric 504. In the illustrated example, the first overlapping shaded portion 1912 indicates that the component contributed approximately 7% to the increase in the first sustainability metric 504 relative to the design benchmark. Similarly, the visual indication of the contribution of the component to the second sustainability metric 508 includes a second overlapping shaded portion 1914 that overlaps with the second ring 1908 to indicate an amount by which the component has contributed to the change in the second sustainability metric 508. The amount, or size, of the second overlapping shaded portion 1914 corresponds to the amount by which the component contributed to the change in the second sustainability metric 508. In the illustrated example, the second overlapping shaded portion 1914 indicates that the component contributed approximately 5% to the decrease in the second sustainability metric 508 (e.g., lifetime carbon emissions) relative to the design benchmark.

Although the sustainability widget 1900B is shown and described above as a circular bar graph, persons skilled in the art will understand that the above description of displaying a visual indication of contribution of a component to a change in a sustainability metric is also applicable to other implementations of the sustainability widgets described herein (e.g., horizontal bar graphs, arc-shaped bar graphs, etc.). Moreover, although the sustainability widget 19008 is used to display visual indications of a contribution of a component to two sustainability metrics associated with the design of the object, persons skilled in the art will understand that sustainability widget 19008 can display visual indications of a contribution of the component to more than or fewer than two sustainability metrics associated with the design of the object.

As described above, the sustainability widget 1900B displays a visual indication of the contribution of a component to a change in the sustainability metrics 504, 508 associated with the current design of the object relative to a design benchmark. However, in some instances, a user might desire to view a visual indication of an amount by which a component contributes to the value of a sustainability metric, not an amount by which a component contributes to a change in a sustainability metric. For example, a user might desire to understand what percentage of a sustainability metric associated with the design of an object can be attributed to a particular component included in the design. Accordingly, in some embodiments, the SI service 110 generates and displays a sustainability widget that provides a visual indication of the amount, or percentage, contribution of a component to the value of a sustainability metric associated with the design of the object.

Figure 20:
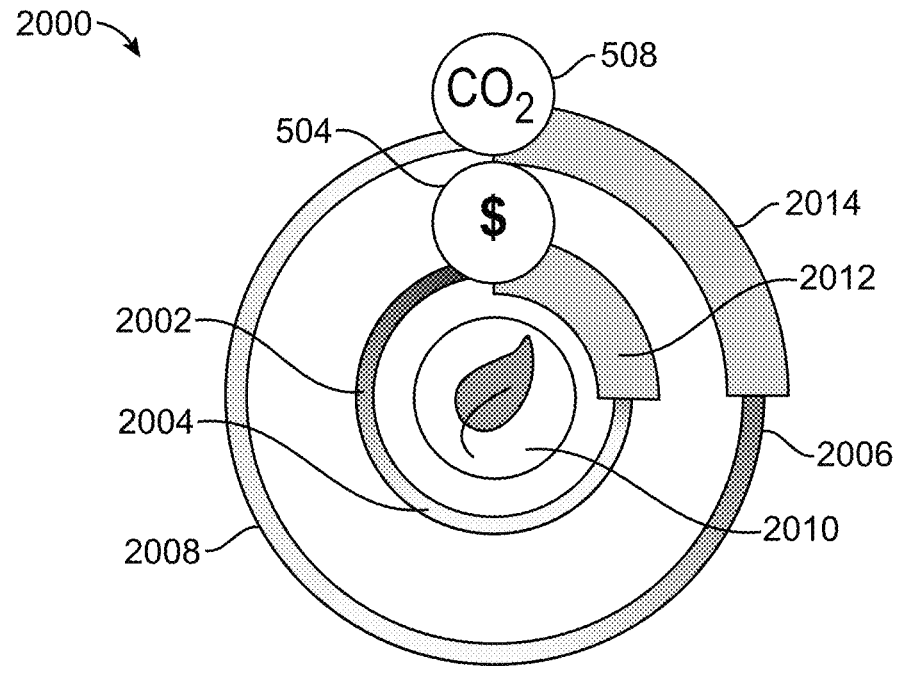
FIG. 20 illustrates an example widget that displays a visual indication of a contribution of a component to one or more sustainability metrics for a percentage mode of operation, according to various embodiments of the present disclosure.

FIG. 20 illustrates an example of a sustainability widget 2000 that is displayed, for example via the GUI 400, to a user to provide a visual indication of an amount by which a component contributes to one or more sustainability metrics associated with the design of an object. The sustainability widget 2000 can be, for example, implemented as the sustainability widget 408 shown in FIG. 4. As shown, the sustainability widget 2000 displays visual indications of first and second sustainability metrics 504, 508 associated with the design of an object. The visual indication of the first sustainability metric 504 (e.g., price) includes a first shaded portion 2002 of a first ring, 2004, which indicates an amount of progress made towards achieving a target for the first sustainability metric 504 relative to a design benchmark. The visual indication of the second sustainability metric 508 (e.g., lifetime carbon emissions) includes a second shaded portion 2006 of a second ring 2008, which indicates an amount of progress made towards achieving a target for the second sustainability metric 508 relative to a design benchmark. The sustainability widget 2000 also includes a sustainability icon 2010, which is similar to the sustainability icon 610 described above.

Furthermore, the sustainability widget 2000 displays visual indications of the contributions of a component to the first and second sustainability metrics 504, 508 associated with the design of an object. In particular, the sustainability widget 2000 displays a visual indication of the percentage contributions of a component to the sustainability metrics 504, 508 of the current design. The visual indication of the contribution of the component to the first sustainability metric 504 includes a first overlapping shaded portion 2012 that overlaps with the first ring 2004 to indicate the percentage of the first sustainability metric 504 that is attributed to the component. Moreover, the amount, or size, of the first overlapping shaded portion 2012 corresponds to the amount by which the component contributes to the first sustainability metric 504. In the illustrated example, the first overlapping shaded portion 2012 indicates that the component contributes approximately 25% of the first sustainability metric 504. In other words, 25% percent of the first sustainability metric 504 associated with the design of the object is attributed to the component. Similarly, the visual indication of the contribution of the component to the second sustainability metric 508 includes a second overlapping shaded portion 2014 that overlaps with the second ring 2008 to indicate the percentage of the second sustainability metric 508 that is attributed to the component. Moreover, the amount, or size, of the second overlapping shaded portion 2014 corresponds to the amount by which the component contributes to the second sustainability metric 508. In the illustrated example, the second overlapping shaded portion 2014 indicates that the component contributes approximately 25% of the second sustainability metric 508 (e.g., lifetime carbon emissions). In other words, 25% percent of the lifetime carbon emissions associated with the design of the object are attributed to the component.

In some instances, the SI service 110 determines whether to display the sustainability widget 19008 or the sustainability widget 2000 based on a user-selected operating mode of the SI service 110. For example, the SI service 110 generates and displays the sustainability widget 2000 instead of the sustainability widget 19008 in response to a user selection of a percentage component view mode of operation. As another example, the SI service 110 generates and displays the sustainability widget 19008 instead of the sustainability widget 2000 when the user selects a change component view mode of operation. In some embodiments, a user can toggle between viewing the sustainability widget 19008 and the sustainability widget 2000 by changing the operating mode of the SI service 110 between the change component view mode and the percentage component view mode.

Figure 21:
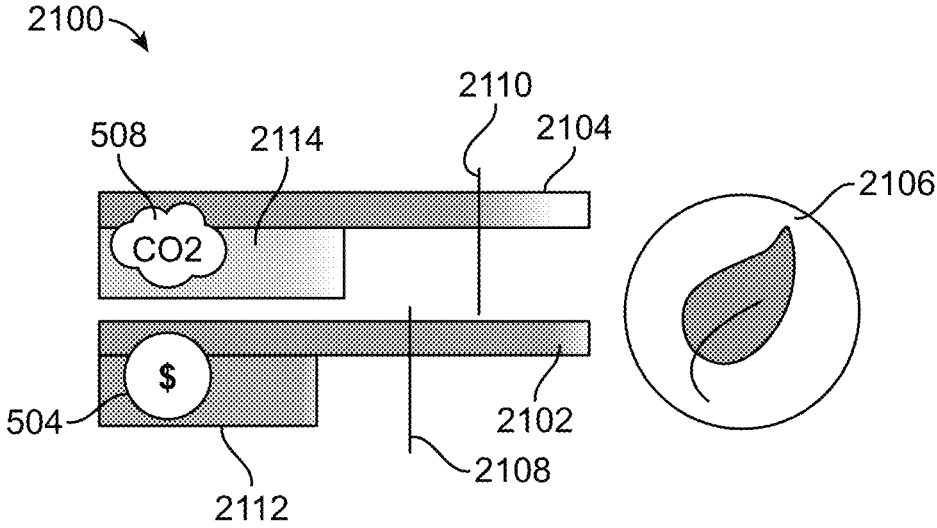
FIG. 21 illustrates an example widget that displays a visual indication of a contribution of a component to the one or more sustainability metrics for an absolute mode of operation, according to various embodiments of the present disclosure.

In some instances, a user might desire to view a visual indication of the contribution of a component to one or more sustainability metrics associated with the design of an object when the SI service 110 is operating in an absolute operating mode, which is described above with respect to FIGS. 4-6. Accordingly, FIG. 21 illustrates an example of a sustainability widget 2100 that is displayed, for example via the GUI 400, to a user to provide a visual indication of the contribution of a component to one or more sustainability metrics associated with the design of an object while the SI service 110 is operating in an absolute operating mode. The sustainability widget 2100 can be, for example, implemented as the sustainability widget 408 shown in FIG. 4.

As shown, the sustainability widget 2100 displays a first visual indication 2102 of the first sustainability metric 504 (e.g., price) associated with the design of an object, a second visual indication 2104 of the second sustainability metric 508 (e.g., lifetime carbon emissions) associated with the design of the object, and a sustainability icon 2106, which is similar to the sustainability icon 610 described above. The sustainability widget 2100 further includes a first change line 2108 that indicates a previous value of the first sustainability metric 504 before a change to the design was made and a second change line 2110 that indicates a previous value of the second sustainability metric 508 before a change to the design was made. The sustainability widget 2100 further includes a third visual indication 2112 of the contribution of a component to the first sustainability metric 504 and a fourth visual indication 2114 of a contribution of the component to the second sustainability metric 508. The size, or length, of a respective visual indication 2112, 2114 corresponds to an amount of the corresponding sustainability metric 504, 508 that is attributed to the component. For example, as the third visual indication 2112 is approximately 40% as long as the first visual indication 2102 of the first sustainability metric 504, a user viewing the sustainability widget 2100 can understand that approximately 40% of the first sustainability metric 504 is attributed to the component.

In some instances, a user might desire to understand how one or more sustainability metrics associated with the design of an object have changed over a period of time. For example, a user might desire to understand how one or more sustainability metrics associated with the design of the object have changed over the course of the design process. Accordingly, the SI service 110 can generate and display a timeline view that provides a visual indication of how one or more sustainability metrics associated with design of the object have changed over time. The SI service 110 can generate a timeline view based on stored data, such as design data 316, that includes previous values of the sustainability metrics associated with the design of the object. Moreover, the SI service 110 can update and display, in real-time, a timeline view as the user makes changes to the design of the object.

In some embodiments, the SI service 110 generates and displays the timeline view in response to receiving a user input. For example, a user of the CAD application 105 can interact, using cursor the 404 or some other input device, with the design of the object and/or a currently displayed sustainability widget to indicate to the SI service 110 that the user desires to view a timeline of changes to one or more sustainability metrics associated with design of the object. In some examples, the user selects a visual indication of a sustainability metric displayed by a sustainability widget to indicate to the SI service 110 that the user desires to view a timeline of changes for that sustainability metric. In some examples, a user selects, from a menu and/or one or more selectable options, to display a timeline view associated with a sustainability metric.

Figure 22A:
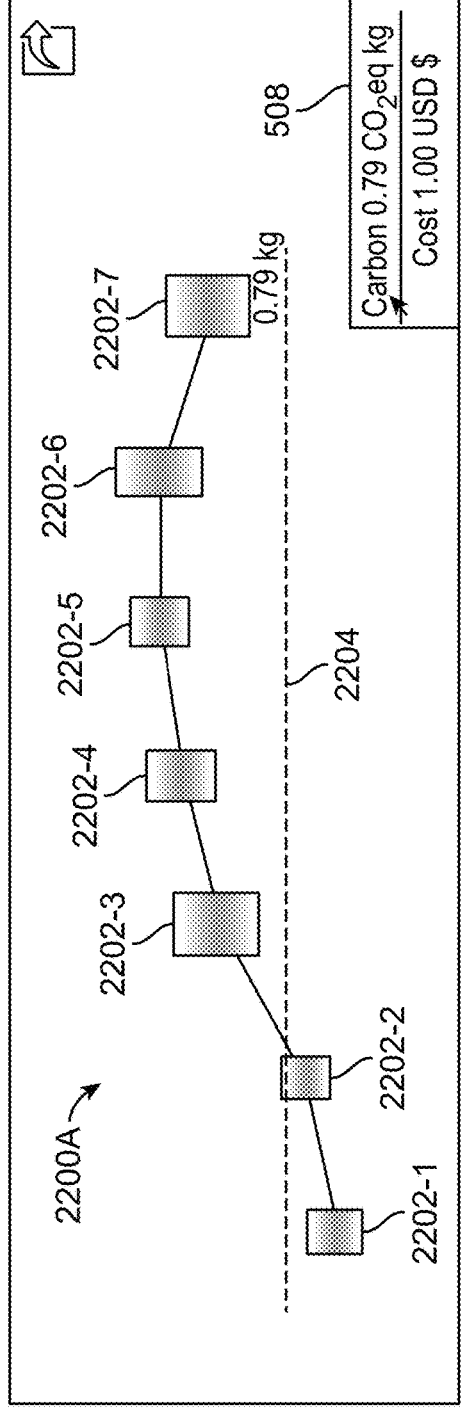
FIGS. 22A and 22B illustrate example timeline views associated with one or more sustainability metrics, according to various embodiments of the present disclosure.

FIG. 22A illustrates an example of a timeline view 2200A that the SI service 110 generates and displays, for example via the GUI 400, to a user. As shown, the timeline view 2200A provides a visual indication as to how the second sustainability metric 508 (e.g., lifetime carbon emissions) associated with the design of the object has changed over time. The timeline view 2200A includes a plurality of data points 2202-1-2202-7 that indicate respective values of the second sustainability metric 508 at various points in time. For example, the first data point 2202-1 provides a visual indication of the value of the second sustainability metric 508 associated with the design of the object at a first point in time, the second data point 2202-2 provides a visual indication of the value of the second sustainability metric 508 associated with the design of the object at a second point in time that occurred after the first point in time, etc.

The timeline view 2200A further includes a target line 2204 that indicates a target value (e.g., 0.79 kg), or design benchmark, for the second sustainability metric 508. Accordingly, when viewing the timeline view 2200A, a user can understand how the value of the second sustainability metric 508 associated with the design of the object changed relative to the target line 2204 over a time period. For example, a user can determine that the second sustainability metric 508 satisfied the target value, or design benchmark, at first and second points in time because the first and second data points 2202-1, 2202-2 are below the target line 2204. Similarly, a user can determine that the second sustainability metric 508 did not satisfy the target value, or design benchmark, at points in time after the second point in time because the third through seventh data points 2202-3-2202-7 are above the target line 2204.

Figure 22B:
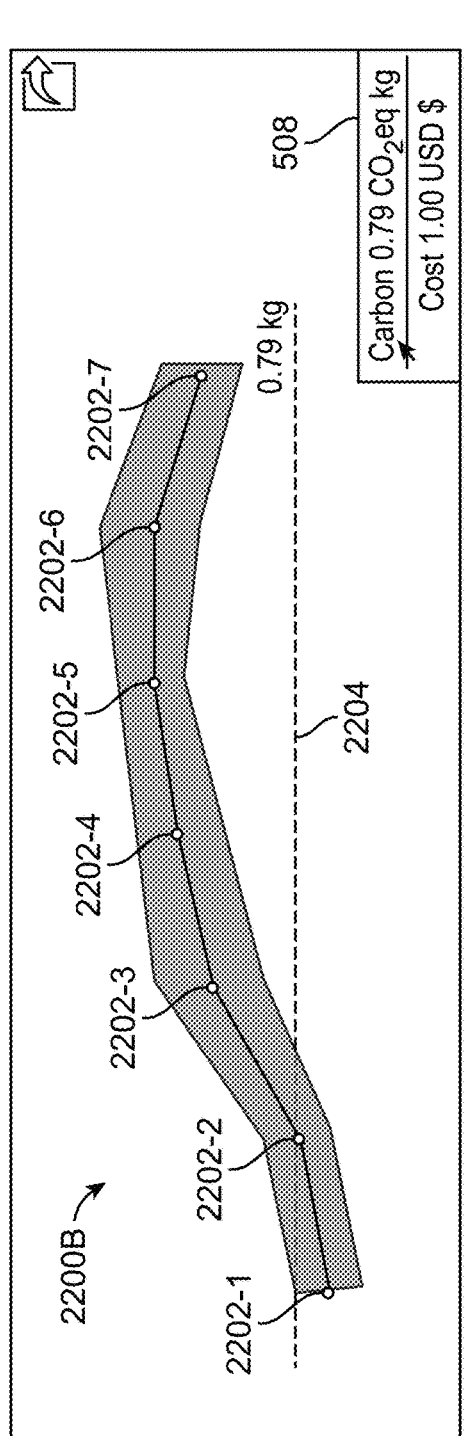

As further shown in FIG. 22A, the SI service 110 has applied visual effects to the data points 2202-1-2202-7 to indicate uncertainty associated with the determined values of the second sustainability metric 508 indicated by the data points 2202-1-2202-7. For example, when generating the timeline view 2200A, the SI service 110 might determine that a particular value of the second sustainability metric 508 at a point in time could have been any value within a range, or tolerance, of values. Accordingly, the SI service 110 applies a visual effect to a respective data point 2202 to indicate the uncertainty associated with the determined value of the data point 2202. In the illustrated example of FIG. 22A, the uncertainty visual effect applied to each data point 2202-1-2202-7 is a gradient effect. FIG. 22B illustrates another example timeline view 2200B in which the uncertainty associated with values of the data points 2202-1-2202-7 is indicated to a user by connecting minimum possible values of the data points 2202-1-2202-7, maximum possible values of the data points 2202-1-2202-7, and intermediate possible values of the data points 2202-1-2202-7.

Persons skilled in the art will understand that the information displayed by the timeline views 2200A, 2200B is provided as an example, and that additional information or details associated with the changes to a sustainability metric over time can be displayed by the timeline views 2200A, 2200B. Moreover, although the timeline views 2200A, 2200B display changes to the second sustainability metric 508 over a period of time, persons skilled in the art will understand that the above description of the timeline views 2200A, 2200B is also applicable to a timeline view that displays changes to a different sustainability metric, such as the first sustainability metric 504, associated with the design of the object. In some embodiments, a user can toggle between viewing a first timeline view that displays a visual indication of changes to a first sustainability metric over time and a second timeline view that displays a visual indication of changes to a second sustainability metric over time.

Figure 23:
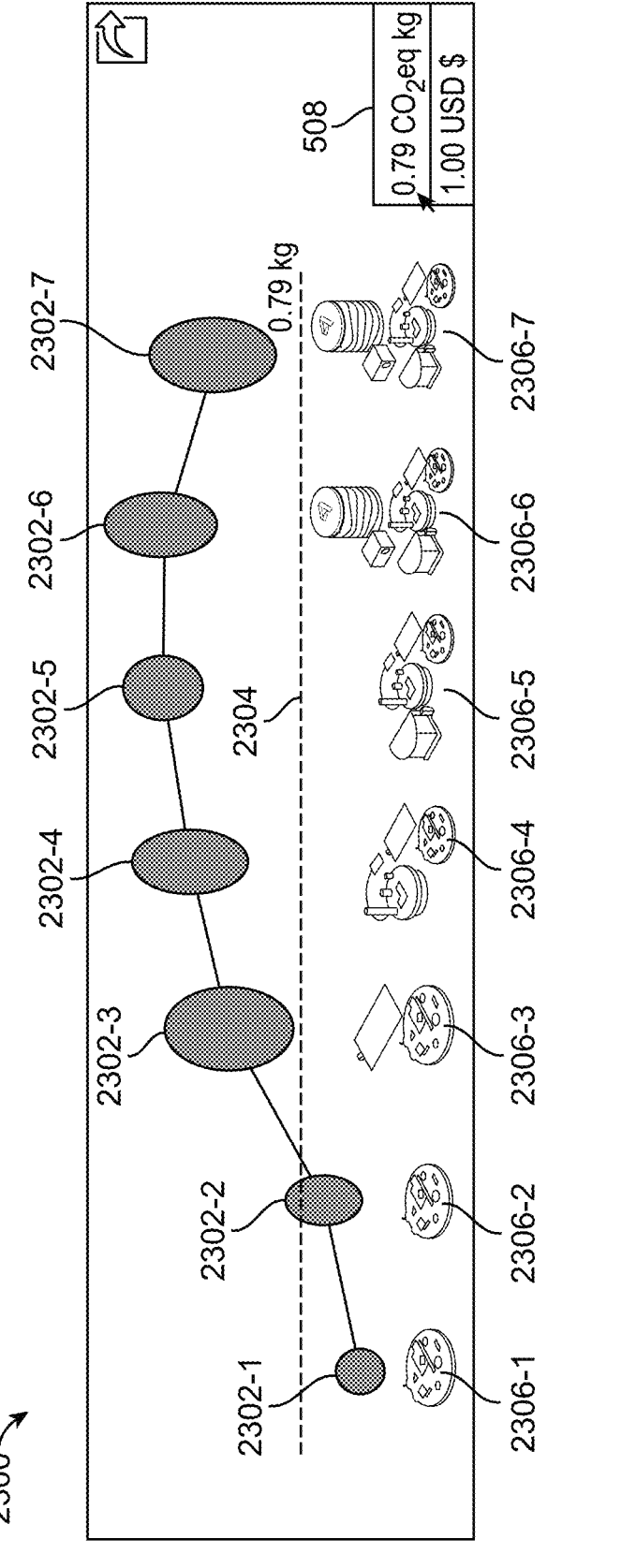
FIG. 23 illustrates an example timeline view associated with one or more sustainability metrics, according to various embodiments of the present disclosure.

In some instances, to help a user better understand the changes over time to a sustainability metric associated with the design of the object, the SI service 110 generates a timeline view that further includes respective visual indications of the state of the design at various points in time. FIG. 23 illustrates an example of a timeline view 2300 that SI service 110 generates and displays, for example via the GUI 400, to a user. As shown, the timeline view 2300 provides a visual indication as to how the second sustainability metric 508 (e.g., lifetime carbon emissions) associated with the design of the object has changed over time. In particular, the timeline view 2300 includes a plurality of data points 2302-1-2302-7 that indicate how the value of the second sustainability metric 508 has changed over time relative to a target line 2304. For example, the first data point 2302-1 provides a visual indication of the value of the second sustainability metric 508 associated with the design of the object at a first point in time, the second data point 2302-2 provides a visual indication of the value of the second sustainability metric 508 associated with the design of the object at a second point in time that occurred after the first point in time, etc.

The timeline view 2300 additionally provides a visual indication as to how the state of the design of the object changed over time in relation to the changes in the second sustainability metric 508. In particular, the timeline view 2300 includes a plurality of model renderings 2306-1-2306-7 that provide respective visual indications of the state of the design at a particular point in time. For example, the first model rendering 2306-1 provides a visual indication of the state of the design at the first point in time, the second model rendering 2306-2 provides a visual indication of the state of the design at the second point in time, etc. Moreover, a particular model rending 2306 displayed in the timeline view 2300 corresponds to a particular data point 2302. For example, the first data point 2302-1 indicates a value of the second sustainability metric 508 at the first point in time in which the state of the design resembled the first model rendering 2306-1. Accordingly, by viewing the timeline view 2300, a user can better understand how the second sustainability metric 508 associated with the design of the object changed over a period of time in view of corresponding changes to, or states, of the design, which are represented by the model renderings 2306-1-2306-7.

Persons skilled in the art will understand that the information displayed by the timeline view 2300 is provided as an example, and that additional information or details associated with the changes to a sustainability metric over time can be displayed by the timeline view 2300. Moreover, although the timeline view 2300 displays changes to the second sustainability metric 508 over a period of time, persons skilled in the art will understand that the above description of the timeline view 2300 is also applicable to a timeline view that displays changes to a different sustainability metric, such as the first sustainability metric 504, associated with the design of the object.

Figure 24:
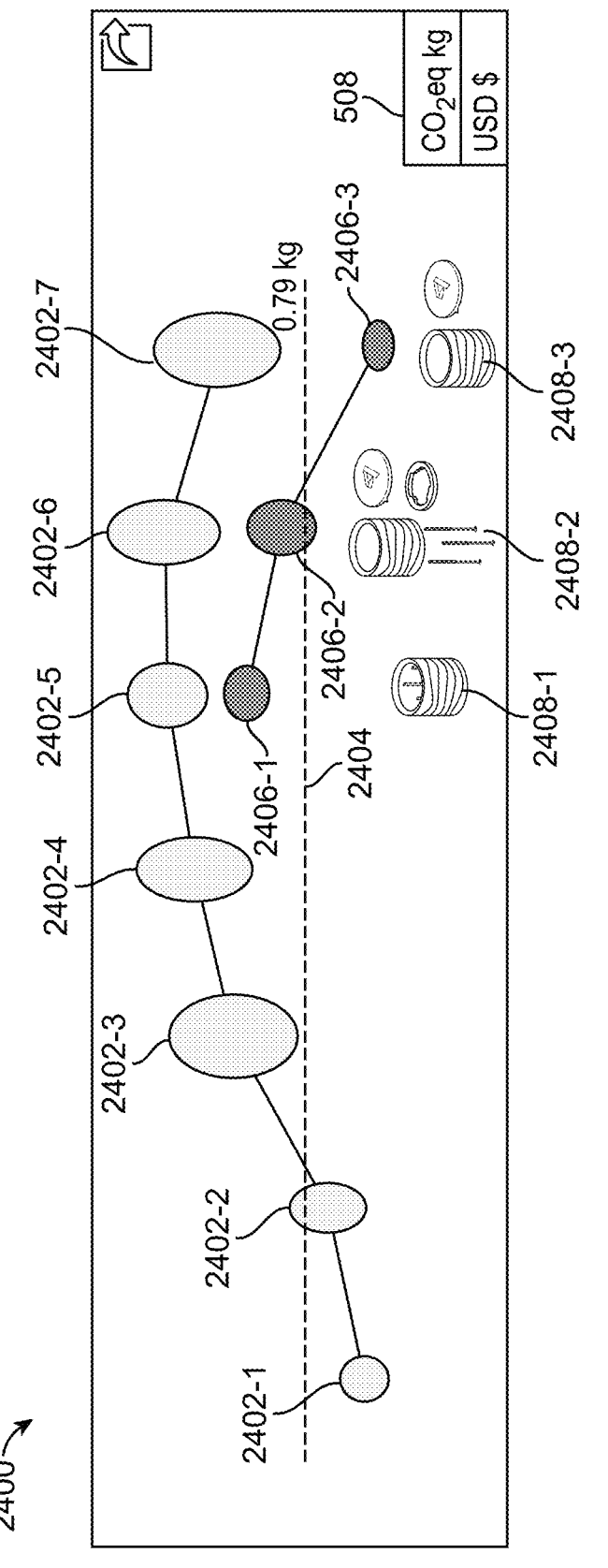
FIG. 24 illustrates an example timeline view associated with one or more sustainability metrics, according to various embodiments of the present disclosure.

In some instances, a user might desire to understand how a particular component included in the design of the object impacted one or more sustainability metrics associated with the design of the object over a period of time. Accordingly, the SI service 110 can generate and display a timeline view that further includes respective visual indications of changes over time to a sustainability metric associated with a component included in the design of the object. FIG. 24 illustrates an example of a timeline view 2400 that the SI service 110 generates and displays, for example via the GUI 400, to a user. As shown, the timeline view 2400 provides a visual indication as to how the second sustainability metric 508 (e.g., lifetime carbon emissions) associated with the design of the object has changed over time. In particular, similar to timeline views 2200A, 2200B, and 2300, the timeline view 2400 includes a plurality of data points 2402-1-2402-7 that indicate how the value of the second sustainability metric 508 has changed over time relative to a target line 2404.

The timeline view 2400 further provides a visual indication as to how the second sustainability metric 508 associated with, or attributed to, a particular component included in the design of the object has changed over time. For example, the timeline view 2400 includes a plurality of component data points 2406-1-2406-3 that indicate how the value of the second sustainability metric 508 attributed to a particular component included in the design of the object has changed over time. For example, if a user has changed the size, shape, materials, and/or other parameters of the component over a period of time, the plurality of component data points 2406-1-2406-3 indicate how those changes to the component impacted the second sustainability metric 508 associated with that component over time.

As further shown, the timeline view 2400 provides a visual indication as to how the state of the component included in the design of the object changed over time in relation to the changes in the second sustainability metric 508 associated with the component. In particular, the timeline view 2400 includes a plurality of component model renderings 2408-1-2408-3 that provide respective visual indications of the state of the component at various points in time. The state of the component can include, for example, the size, shape, materials, and/or other physical parameters of the component included in the design. Accordingly, by viewing the timeline view 2400, a user can better understand how the second sustainability metric 508 associated with the design of the object changes over a period of time in view of corresponding changes to the component, which are visually represented by the component model renderings 2408-1-2408-3.

Persons skilled in the art will understand that the information displayed by the timeline view 2400 is provided as an example, and that additional information or details associated with the changes to a sustainability metric associated with a component can be displayed by the timeline view 2400. Moreover, although the timeline view 2400 displays changes to the second sustainability metric 508 associated with a component, persons skilled in the art will understand that the above description of the timeline view 2400 is also applicable to a timeline view that displays changes to a different sustainability metric, such as the first sustainability metric 504, associated with a component.

In some instances, a user might desire to view additional information, or details, associated with a timeline view. Accordingly, the SI service 110 can generate and display a pop-up that provides additional information associated with a timeline view. In some embodiments, the SI service 110 generates and displays a pop-up associated with a timeline view in response to receiving a user request and/or detecting user interaction with timeline view that is currently displayed. For example, when a user interacts with a portion of a timeline view using the cursor 404 (e.g., hovering over portion of the timeline view, clicking on a portion of the timeline view, etc.), the SI service 110 detects the user interaction and, in response, generates and displays a pop-up view that provides additional information associated with the portion of the of the timeline view with which the user interacted.

Figure 25:
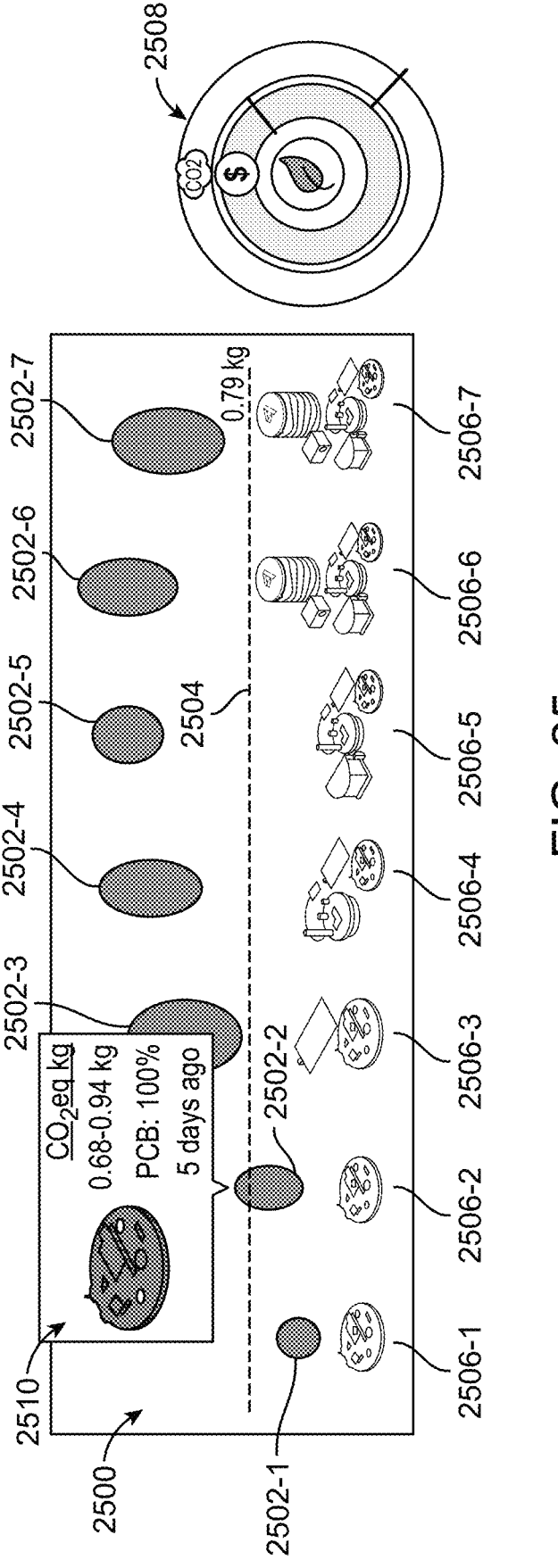
FIG. 25 illustrates an example timeline view associated with one or more sustainability metrics, according to various embodiments of the present disclosure.

FIG. 25 illustrates an example of a timeline view 2500 that the SI service 110 generates and displays, for example via the GUI 400, to a user. As shown, the timeline view 2500 provides a visual indication as to how the second sustainability metric 508 (e.g., lifetime carbon emissions) associated with the design of the object has changed over time. In particular, similar to the other timeline views described above, the timeline view 2500 includes a plurality of data points 2502-1-2502-7 that indicate how the value of the second sustainability metric 508 changed over time relative to a target line 2504. Further, similar to the timeline view 2300, the timeline view 2500 additionally provides a visual indication as to how the design of the object changed over time using a plurality of model renderings 2506-1-2506-7 that provide respective visual indications of the state of the design at various points in time. In the illustrated example, the timeline view is also displayed proximate to a sustainability widget 2508.

As further shown, a pop-up 2510 is displayed over the timeline view 2500. In particular, the pop-up 2510 is displayed above the second data point 2502-2 and provides additional information associated with the second sustainability metric 508 associated with the design of the object at the second point in time indicated by the timeline view. For example, the SI service 110 generates and displays the pop-up 2510 above the second data point 2502-2 in response to detecting user interaction with the second data point 2502-2 and or the second model rendering 2506-2. As shown, the pop-up 2510 displays information such as a numerical value of the second sustainability metric 508 at the second point in time, an indication of the second point in time (e.g., a time at which the second data point 2502-2 and/or the second model rendering 2506-2 was created), and an indication as to which component(s) included in the design of the object and by how much the component(s) contributed to the second sustainability metric 508 at the second point in time.

Persons skilled in the art will understand that the information displayed by the pop-up 2510 is provided as an example, and that more or less information associated with the second sustainability metric 508 can be displayed by the pop-up 2510. Furthermore, although the pop-up 2510 displays additional information associated with the second sustainability metric 508 at the second point in time, persons skilled in the art will understand that the above description of the pop-up 2510 is also applicable to pop-ups that display information associated with the second sustainability metric 508 at other points in time indicated by the timeline view 2500 and pop-ups that display information associated with other sustainability metrics, such as the first sustainability metric 504, associated with the design of the object.

In some instances, target values and/or design benchmarks for a sustainability metric associated with the design of an object change over the course of the design process. For example, a user might define a first target and/or design benchmark for a sustainability metric at a first point in time during the design process and define a different, second target and/or design benchmark for a sustainability metric at a second point in time during the design process. Accordingly, the SI service 110 can generate and display a timeline view that provides a visual indication as to how a sustainability metric associated with the design of an object changed over time relative to changing target values and/or design benchmarks for the sustainability metric.

Figure 26:
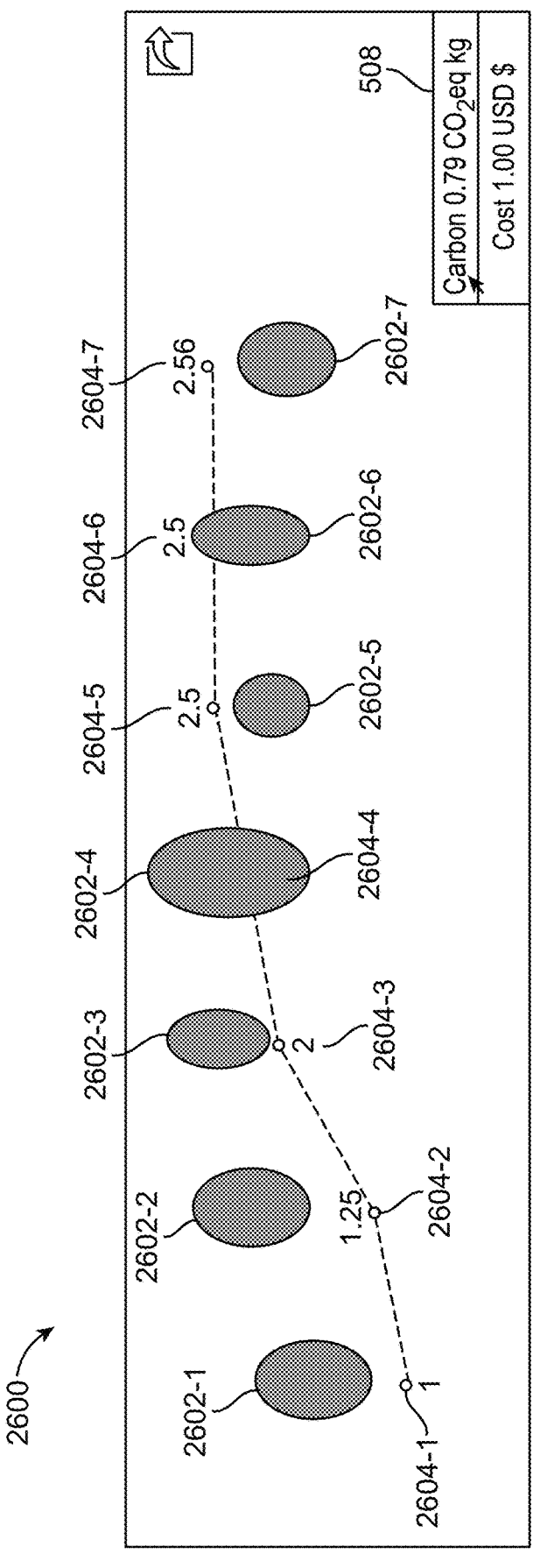
FIG. 26 illustrates an example timeline view associated with one or more sustainability metrics, according to various embodiments of the present disclosure.

FIG. 26 illustrates an example of a timeline view 2600 that the SI service 110 generates and displays, for example via the GUI 400, to a user. As shown, the timeline view 2600 provides a visual indication as to how the second sustainability metric 508 (e.g., lifetime carbon emissions) associated with the design of the object has changed over time. Similar to the other timeline views described above, the timeline view 2600 includes a plurality of data points 2602-1-2602-7 that indicate how the value of the second sustainability metric 508 changed over a period of time. For example, the first data point 2602-1 provides a visual indication of the value of the second sustainability metric 508 associated with the design at a first point in time, the second data point 2602-2 provides a visual indication of the value of the second sustainability metric 508 associated with the design at a second point in time that occurred after the first point in time, etc.

Furthermore, the timeline view 2600 provides a visual indication as to how the target for the second sustainability metric 508 has changed over time. In particular, the timeline view 2600 includes a plurality of targets 2604-1-2604-7 that indicate how the target value and/or design benchmark for the second sustainability metric 508 changed over a period of time. For example, the first target 2604-1 provides a visual indication of the target value for the second sustainability metric 508 at the first point in time, the second data point 2602-2 provides a visual indication of the target value for the second sustainability metric 508 at the second point in time, etc. Accordingly, by viewing the timeline view 2600, a user can determine how the second sustainability metric 508 associated with design of the object performed over time relative to respective targets for the second sustainability metric 508. For example, a user can determine that the second sustainability metric 508 satisfied a corresponding target value at the fifth point in time because the fifth data point 2602-5 is below the fifth target 2604-5 for the second sustainability metric 508. Similarly, a user can determine that the second sustainability metric 508 did not satisfy a corresponding target value at the first point in time because the first data point 2602-1 is above the first target 2604-1 for the second sustainability metric 508.

Persons skilled in the art will understand that the information displayed by the timeline view 2600 is provided as an example, and that additional information or details associated with the changes to a sustainability metric over time can be displayed by the timeline view 2600. Moreover, although the timeline view 2600 displays changes to the second sustainability metric 508 over a period of time, persons skilled in the art will understand that the above description of the timeline view 2600 is also applicable to a timeline view that displays changes to a different sustainability metric, such as the first sustainability metric 504, associated with the design of the object.

Figures 27A, 27B:
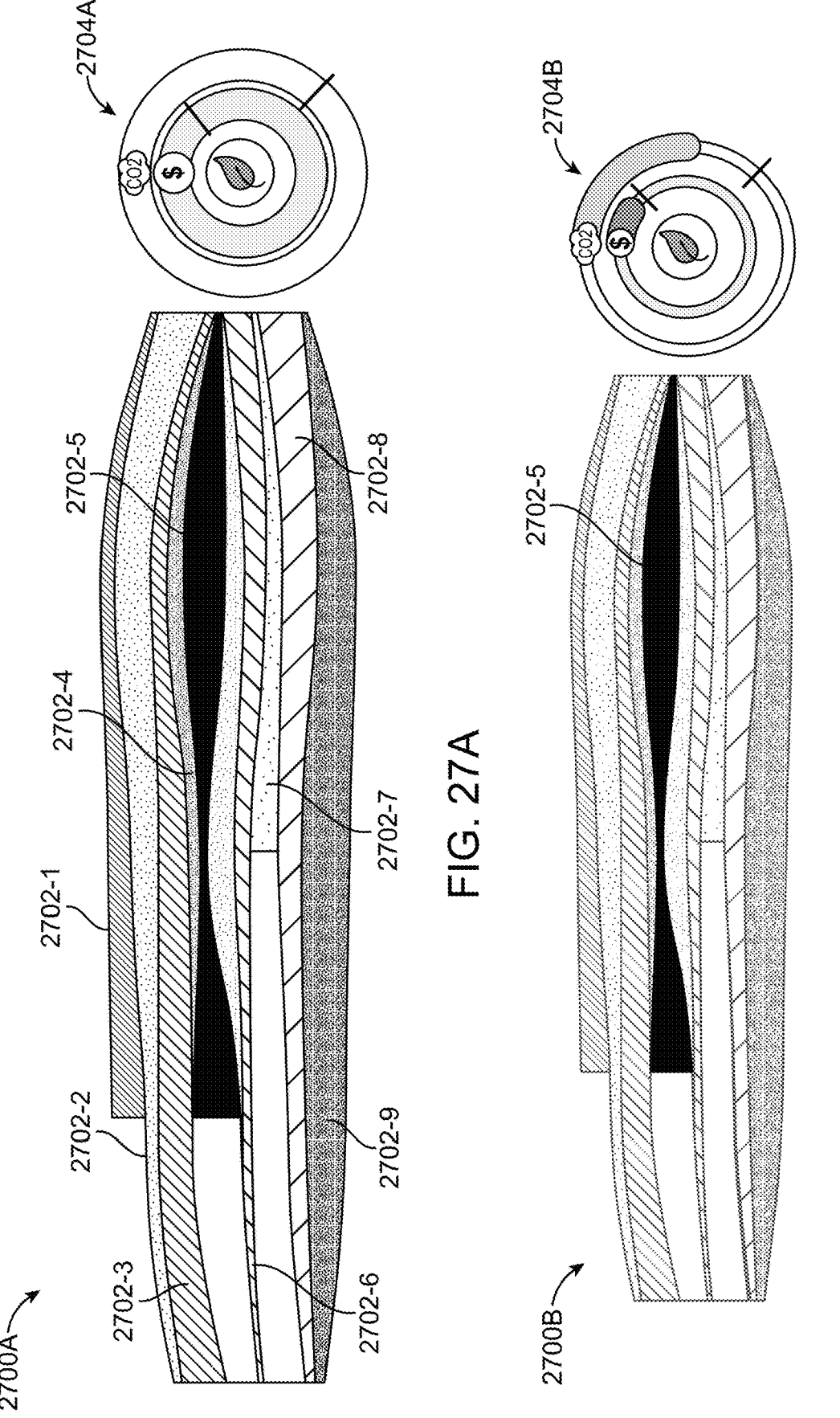
FIGS. 27A and 27B illustrate example streamgraphs associated with one or more sustainability metrics displayed by a widget, according to various embodiments of the present disclosure.

FIG. 27A illustrates an alternative embodiment of a timeline view, or streamgraph, 2700A that can be generated and displayed, for example via the GUI 400, by the SI service 110 to provide a visual indication of changes in a sustainability metric over time. In particular, the streamgraph 2700A provides a visual indication as to how the respective contributions of components included in the design of the object to the second sustainability metric 508 of the design change over time, where time increases in the left-to-right direction with respect to the streamgraph 2700A. Each component included in the design of the object is represented as a respective layer 2702 in the streamgraph 2700A. In the illustrated example, the design of the object includes ten components, and thus, the ten components included in the design of the object are represented by respective layers 2702-1-2702-10 stacked on top of each other. A layer 2702 corresponding to a component begins in the streamgraph 2700A at the point in time at which the component is added to the design of the object.

At a given point in time, which can be thought of as a vertical line drawn through the stacked layers 2702-1-2702-10 in the illustrated example, the contribution of a particular component to the second sustainability metric 508 of the design is represented by the thickness of the layer 2702 corresponding to the component included in the design of the object. For example, assuming the layer 2702-5 corresponds to a fifth component included the design of the object, the thickness of the layer 2702-5 corresponds to the amount by which the fifth component contributed to the second sustainability metric 508 associated with the design of the object at a given point in time. Thus, if the amount by which the fifth component contributes to the second sustainability metric 508 decreases, the layer 2702-5 thins out. Likewise, if the amount by which the fifth component in the design contributes to the second sustainability metric 508 increases, the layer 2702-5 thickens. By viewing streamgraph 2700A, a user can determine which components included in the design of the object contribute more to the second sustainability metric 508 than others by comparing the thicknesses of layers 2702-1-2702-10. For example, if at a first point in time the layer 2702-5 is thicker than the layer 2702-6, a user can determine that the fifth component of the design contributed more to the second sustainability metric 508 than the sixth component of the design at the first point in time. As shown, the streamgraph 2700A can be displayed next to a sustainability widget 2704A. Although the above description of the streamgraph 2700A is provided with respect to the second sustainability metric 508, persons skilled in the art will understand that the streamgraph 2700A can also display information associated with other sustainability metrics, such as the first sustainability metric 504, associated with the design of the object.

In some instances, while viewing the streamgraph 2700A, a user might desire to view additional information associated with contribution of a particular component to the second sustainability metric 508 associated with the design of the object. Accordingly, the SI service 110 can generate and display additional information associated with the contribution of a component to the second sustainability metric 508 in response to receiving a user request and/or detecting user interaction with the streamgraph 2700A. For example, when a user interacts with a particular layer 2702 of the streamgraph 2700A using the cursor 404 (e.g., hovering over a portion of the layer 2702, clicking on a portion of the layer 2702, etc.), the SI service 110 detects the user interaction and, in response, generates and displays additional information associated with the contribution to the second sustainability metric 508 of the component that corresponds to the layer 2702.

In some embodiments, the SI service 110 generates and displays the additional information associated with the contribution of a component to the second sustainability metric 508 in the form of a pop-up, such as a pop-up similar to the other pop-ups described herein. In some embodiments, the SI service 110 generates and displays the additional information associated with the contribution of a component to the second sustainability metric 508 in the form of a sustainability widget, such as one of the sustainability widgets 1900B, 2000, or 2100 described herein. FIG. 27B illustrates an example streamgraph 2700B that is generated and displayed by the SI service 110 in response to detecting user interaction with the layer 2702-5 included in the streamgraph 2700A. As shown in FIG. 27B, the SI service 110 applies a visual effect to the selected layer 2702-5 to make the selected layer 2702-5 stand out relative to the other layers 2702. Moreover, the SI service 110 generates and displays a sustainability widget 2704B that provides a visual indication of the contribution of the fifth component to the first and second sustainability metrics 504, 508 associated with the design of the object. The sustainability widget 2704B can be generated and displayed using one or more of the techniques described above with respect to the sustainability widgets 1900B, 2000, and 2100.

Figure 28:
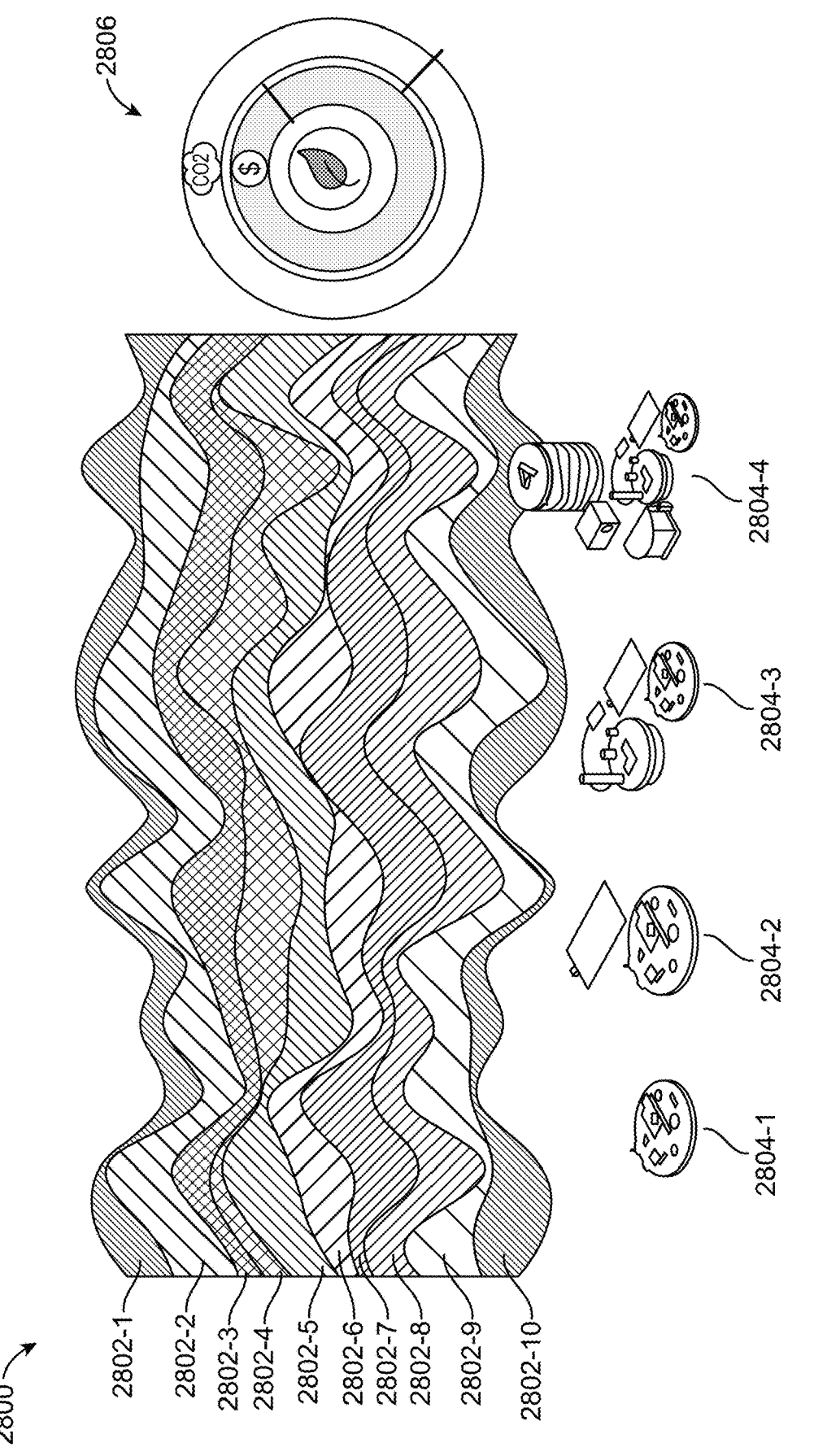
FIG. 28 illustrates an example streamgraph associated with one or more sustainability metrics, according to various embodiments of the present disclosure.

As described above, in some instances, to help a user better understand the changes over time to a sustainability metric associated with the design of an object, the SI service 110 generates a timeline view that further includes respective visual indications of the state of the design at various points in time. Accordingly, FIG. 28 illustrates an example of a streamgraph 2800 that provides a visual indication as to how the state of the design of the object changed over. The SI service 110 generates and displays, for example via the GUI 400, the streamgraph 2800 to a user. Similar to the streamgraph 2700A, the streamgraph 2800 includes a plurality of layers 2802-1-2802-10 that provide respective visual indications of the contributions of components included in the design of the object to a sustainability metric associated with the design of the object.

As further shown, similar to the timeline view 2300, the streamgraph 2800 provides a visual indication as to how the state of the design of the object changed over time. In particular, the streamgraph 2800 includes a plurality of model renderings 2804-1-2804-4 that provide respective visual indications of the state of the design of the object at various points in time. For example, the first model rendering 2804-1 provides a visual indication of the state of the design at the first point in time, the second model rendering 2804-2 provides a visual indication of the state of the design at the second point in time, etc. Accordingly, by viewing the streamgraph 2800, a user can better understand how component contributions to the second sustainability metric 508 associated with the design of the object changed over a period of time in view of corresponding changes in the state of the design of the object, which are represented by the model renderings 2804-1-2804-4. The streamgraph 2800 is also displayed proximate to a sustainability widget 2806.

In some instances, as a user makes changes to the design of the object, it would be helpful for the user to know particular ways in which a sustainability metric associated with the design of the object can be improved. For example, if a user determines by viewing a sustainability widget that one or more sustainability metrics associated with the design of the object are not satisfactory (e.g., too high, exceed targets, exceed design benchmarks, etc.), it would be helpful for the user to know a particular change to make to the design that can improve one or more sustainability metrics of the design.

Accordingly, the SI service 110 can generate and display suggestions for improving one or more sustainability metrics associated with the design of an object to a user. Moreover, the SI service 110 can generate and display suggestions for improving one or more sustainability metrics associated with the design of the object in real-time as a user edits the design of the object. A suggestion for improving a sustainability metric associated with the design of an object can include, without limitation, one or more of a suggestion to change the material of one or more components included in the design of the object, replace a first component included in the design of the object with a different component, change a manufacturing process used to create the object, change a size and/or weight of a component included in the object, and/or some other change to the geometry of the design of the object that results in an improvement in one or more sustainability metrics associated with the design of the object.

In some embodiments, the SI service 110 generates and/or displays suggestions for improving one or more sustainability metrics associated with the design of an object in response to receiving a request from the user. In such embodiments, using the cursor 404 and/or some other input device, a user can request the SI service 110 to provide a suggestion for improving one or more sustainability metrics associated with the design of the object. In response to receiving the user request, the SI service 110 generates and displays, for example via the GUI 400, a suggestion for how to improve one or more sustainability metrics associated with the design of the object. In one particular example, the user requests the SI service 110 to provide a suggestion for improving a particular sustainability metric, such as the first sustainability metric 504, associated with the object. In such an example, the SI service 110 generates and displays a suggestion for improving the particular sustainability metric associated with the design of the object in response to receiving the user request. In another particular example, the user requests the SI service 110 to provide a suggestion for improving a contribution of a particular component included in the design of the object to a sustainability metric, such as the first sustainability metric 504, associated with the object. In such an example, in response to receiving the user request, the SI service 110 generates and displays a suggestion for changing the particular component to improve the contribution of the particular component to the sustainability metric associated with the design of the object.

In some embodiments, the SI service 110 generates and displays suggestions for improving one or more sustainability metrics associated with the design of the object on a periodic basis. In some embodiments, the SI service 110 generates and displays suggestions for improving one or more sustainability metrics associated with the design of the object on an ad-hoc basis. In some embodiments, the SI service 110 generates and displays suggestions for improving one or more sustainability metrics associated with the design of the object in response to a trigger event, such as detecting a change to the design of the object, detecting an increase in a sustainability metric associated with the design of the object, detecting that a sustainability metric associated with the design of the object exceeds a target value and/or design benchmark for the sustainability metric, and/or some other trigger event.

In operation, the SI service 110 can generate suggestions for improving one or more sustainability metrics associated with the design of the object in a manner that is similar to the manner in which the SI service 110 calculates a sustainability metric associated with the design of the object. For example, as described above with respect to FIGS. 1-3, the SI service 110 includes one or more SI analysis components 130 that determine, based on design data received from the SI application component 125 and one or more of the design data 316, material sustainability data 318, and/or material pricing data 320, values of one or more sustainability metrics associated with the design of an object. Accordingly, in a similar manner, the one or more SI analysis components 130 can determine, based on design data received from the SI application component 125 and one or more of the design data 316, material sustainability data 318, and/or material pricing data 320, changes to the design of the object that would improve one or more sustainability metrics associated with the design of the object.

For example, the one or more SI analysis components 130 can simulate changes to the design of the object (e.g., change the material type of one or more component included in the design, change a size of one or more components included in the design, etc.) and then determine, based on the simulated changes to the design of the object and one or more of the design data 316, material sustainability data 318, and/or material pricing data 320, whether the simulated design changes result in an improvement in one or more sustainability metrics associated with the design of the object. When the one or more SI analysis components 130 determine that a simulated design change would result in an improvement to one or more sustainability metrics associated with the design of the object, the one or more SI analysis components 130 generates a suggestion to implement the simulated design change and transmits the suggestion to the SI application component 125, which displays the suggestion to a user. In some instances, the SI service 110 requests one or more third party services 115 to generate suggestions for improving one or more sustainability metrics associated with the design of the object. In such instances, in response to receiving a suggestion from the one or more third party services 115, the SI service 110 displays the suggestion to a user.

As described above, after generating the suggestion to improve one or more sustainability metrics associated with the design of the object, the SI service 110 displays, for example via the GUI 400, the suggestion to the user. In some instances, displaying the suggestion includes displaying an instruction to make a change to one or more components of the design. As an example, the SI service 110 can display a suggestion that states "change the material of component X to material Y." In some instances, displaying the suggestion further includes displaying details associated with the effect of enacting the suggestion. As an example, the SI service can display a suggestion that states "change the material of component X to material Y to reduce carbon emissions by Z %." The SI service 110 can display a suggestion to a user at any suitable location within the periphery of the CAD application 105. For example, the SI service 110 can display a suggestion to a user near the design of the object, such as the object 406, being edited by the user, on or near a sustainability widget, such as the sustainability widget 408, displayed to a user, and/or at any other location within the GUI, such as the GUI 400, of the CAD application 105.

In some instances, before displaying the suggestion to a user, the SI service 110 generates and displays a notification that one or more suggestions for improving a sustainability metric associated with the design of an object are available. For example, as shown in the illustrated example of FIG. 29A, the SI service 110 generates and displays a notification icon 2900 near a sustainability icon 2902 to indicate to a user that one or more suggestions for improving one or more sustainability metrics associated with the design are available. To view the suggestion(s) indicated by the notification icon 2900, the user can click and/or otherwise interact with, using the cursor 404, the notification icon 2900 and/or the sustainability icon 2902 to display the suggestion. In the illustrated example, the notification icon 2900 indicates that two suggestions are available.

In some instances, in response to receiving a user selection to view the one or more suggestions indicated by the notification icon 2900, the SI service 110 displays a single suggestion at a time. For example, in the illustrated example of FIG. 29B, the SI service 110 displays a single suggestion 2904 to a user. In other instances, in response to receiving a user selection to view the one or more suggestions indicated by the notification icon 2900, the SI service 110 displays a list of available suggestions to a user. For example, in the illustrated example of FIG. 29C, the SI service 110 displays a suggestion list 2906 to a user.

FIG. 30 is an example flow diagram of method steps for providing sustainability insights to a user designing an object, according to various embodiments. Although the method steps are described with reference to the systems and processes of FIGS. 1-29, persons skilled in the art will understand that any system configured to implement the method steps, in any order, falls within the scope of the present invention.

As shown, a method 3000 begins at step 3002, where a first value of a sustainability metric associated with a design of an object is determined. For example, the SI service 110 determines a value of a sustainability metric, such as the first sustainability metric 504, associated with an object being designed by a user in CAD application 105.

At step 3004, a visual indication of the first value of the sustainability metric associated with the design of the object is displayed. For example, the SI service 110 generates and displays a sustainability widget, such as any of the example sustainability widgets described herein, that includes a visual indication of the value of the sustainability metric. The SI service 110 displays the visual indication of the first value of the sustainability metric, for example, within the periphery of the CAD application 105.

At step 3006, a target value for the sustainability metric is received. For example, the SI service 110 receives a target value and/or design benchmark for the sustainability metric from a user via the customization window 500. At step 3008, a change to the design of the object is detected. For example, the SI service 110 detects that a user makes a change (e.g., adds a component, changes a material of a component, etc.) to the design of the object in the CAD application 105.

Responsive to detecting the change to design, at step 3010, a second value of the sustainability metric associated with the design of the object is determined. For example, the SI service 110 determines an updated value of the sustainability metric associated with the design of the object in response to detecting a change to the design of the object. At step 3012, a relationship between the second value of the sustainability metric and the target value for the sustainability metric is determined. For example, the SI service 110 determines, without limitation, one or more of whether the second value of the sustainability metric satisfies the target value for the sustainability metric, an amount of progress made towards achieving the target value for the sustainability metric based on the second value of the sustainability metric, a percentage difference between the second value of the sustainability metric and the target value for the sustainability metric, etc.

At step 3014, a visual indication of the relationship between the second value of the sustainability metric and the target value for the sustainability metric is displayed. For example, the SI service 110 generates and displays a sustainability widget, such as any of the example sustainability widgets described above with respect to the relative operating mode of the SI service 110, that includes a visual indication of the second value of the sustainability metric relative to the target value and/or design benchmark for the sustainability metric. Moreover, the SI service 110 displays the visual indication of the relationship between the second value of the sustainability metric and the target value for the sustainability metric in place of the visual indication of the first value of the sustainability metric displayed at step 3004.

Figure 31:
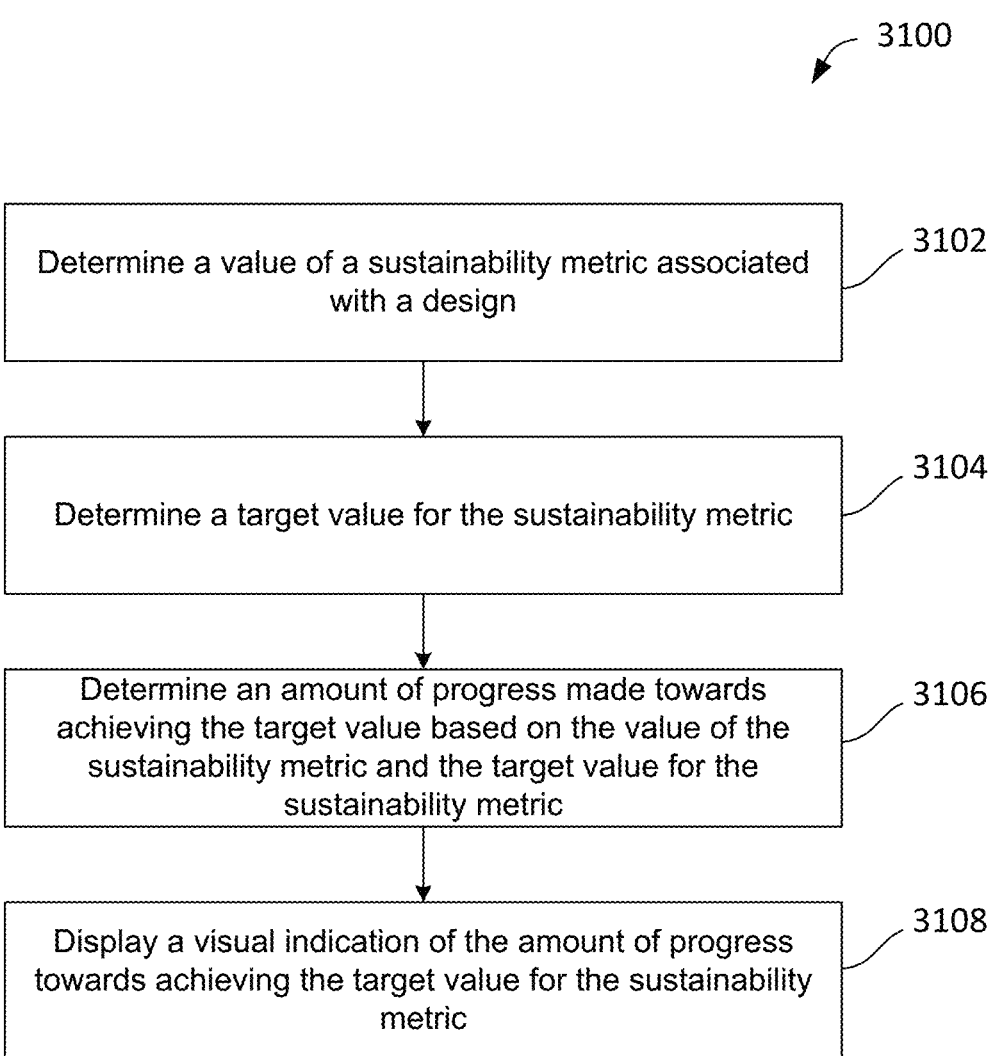
FIG. 31 illustrates an example process for generating sustainability insights, according to various embodiments of the present disclosure.

FIG. 31 is an example flow diagram of method steps for providing sustainability insights to a user designing an object, according to various embodiments. Although the method steps are described with reference to the systems and processes of FIGS. 1-29, persons skilled in the art will understand that any system configured to implement the method steps, in any order, falls within the scope of the present invention.

As shown, a method 3100 begins at step 3102, where a value of a sustainability metric associated with a design of an object is determined. For example, the SI service 110 determines a value of a sustainability metric, such as the first sustainability metric 504, associated with an object being designed by a user in CAD application 105.

At step 3104, a target value for the sustainability metric is determined. For example, the SI service 110 determines the target value based on a target value and/or a design benchmark for the sustainability metric that is input by a user via the customization window 500. As described herein, the target value can be, for example, a target value for the sustainability metric associated with the design of an object for which a user desires to achieve when designing the object, a percentage improvement of a sustainability metric relative to a design benchmark, an absolute improvement of a sustainability metric associated relative to a design benchmark, or some other target value associated with the sustainability metric.

At step 3106, an amount of progress made towards achieving the target value for the sustainability metric is determined based on the value of the sustainability metric and the target value for the sustainability metric. In one example, the SI service 110 determines an amount of progress made towards achieving the target value for the sustainability metric based on a difference between the value of the sustainability metric and the target value for the sustainability metric. In another example, the SI service 110 determines the amount of progress towards achieving the target value for the sustainability metric based on a difference between the target value for the sustainability metric and a percentage difference between the value of the sustainability metric and a design benchmark. For example, if it is assumed that the target value for the sustainability metric is a 10% decrease in the sustainability metric relative to the design benchmark, the SI service 110 determines the amount of progress made towards achieving the target value for the sustainability metric based on a percentage difference between the target value for the sustainability metric and the design benchmark. Continuing with this example, the SI service then determines the amount of progress made towards achieving the 10% decrease in the sustainability metric relative to the design benchmark based on a difference between the determined percentage difference between the value of the sustainability metric and the design benchmark and the 10% decrease target value.

At step 3108, a visual indication of the amount of progress towards achieving the target value for the sustainability metric is displayed. For example, the SI service 110 generates and displays a sustainability widget, such as any of the example sustainability widgets described above with respect to the relative operating mode of the SI service 110, that includes a visual indication of the amount of progress made towards achieving the target value for the sustainability metric.

In sum, the disclosed techniques provide sustainability insights in real-time to users that are creating new and/or changing existing object designs. In operation, a sustainability insights service determines a first value of a sustainability metric associated with a design of an object and displays a visual indication of the first value of the sustainability metric. In response to detecting a change to the design of the object, the sustainability insights service determines an updated value of the sustainability metric based on the change to the design of the object. With the disclosed techniques, the sustainability insights service further determines a relationship between the updated value of the sustainability metric and a target value for the sustainability metric. Then, the sustainability insights service displays a visual indication of the relationship between the updated and target values of the sustainability metric associated with the design of the object.

1. According to some embodiments, a computer-implemented method comprises determining a value of a sustainability metric associated with a design of an object; determining a target value for the sustainability metric; determining an amount of progress made towards achieving the target value for the sustainability metric based on the value of the sustainability metric and the target value for the sustainability metric; and displaying, via a graphical user interface (GUI), a visual indication of the amount of progress made towards achieving the target value for the sustainability metric.

2. The method according to clause 1, further comprising in response to determining that the value of the sustainability metric is improving relative to the target value, displaying, via the GUI, the visual indication of the amount of progress made towards achieving the target value for the sustainability metric with a first type of visual effect; and in response to determining that the value of the sustainability metric is worsening relative to the target value, displaying, via the GUI, the visual indication of the amount of progress made towards achieving the target value for the sustainability metric with a second type of visual effect, wherein the second type of visual effect is different than the first type of visual effect.

3. The method according to clause 1 or clause 2, wherein displaying the visual indication of the amount of progress made towards achieving the target value for the sustainability metric with the first type of visual effect further comprises increasing a size of the visual indication in a first direction; and wherein displaying the visual indication of the amount of progress made towards achieving the target value for the sustainability metric with the second type of visual effect further comprises increasing the size of the visual indication in a second direction, wherein the second direction is different than the first direction.

4. The method according to any of clauses 1-3, wherein the target value for the sustainability metric is a percentage change in the sustainability metric relative to a benchmark value.

5. The method according to any of clauses 1-4, further comprising determining an amount by which a component included in the design of the object contributes to the amount of progress made towards achieving the target value for the sustainability metric; and displaying, via the GUI, a visual indication of the amount by which the component included in the design of the object contributes to the amount of progress made towards achieving the target value for the sustainability metric.

6. The method according to any of clauses 1-5, further comprising in response to detecting a user interaction with the visual indication of the amount of progress made towards achieving the target value for the sustainability metric, displaying, via the GUI, a pop-up that includes information associated with the sustainability metric.

7. The method according to any of clauses 1-6, wherein the information associated with the sustainability metric includes at least one of: a timeline of changes in the value of the sustainability metric over a period of time, an absolute value for the value of the sustainability metric, or an indication of an amount by which a component included in the design of the object contributes to the value of the sustainability metric.

8. The method according to any of clauses 1-7, wherein displaying the visual indication of the amount of progress made towards achieving the target value for the sustainability metric further comprises applying a visual effect to indicate a degree of uncertainty associated with the value of the sustainability metric.

9. The method according to any of clauses 1-8, further comprising determining a value of a second sustainability metric associated with the design of the object, wherein the second sustainability metric is different than the sustainability metric; determining a second target value for the second sustainability metric; determining an amount of progress made towards achieving the second target value for the second sustainability metric based on the value of the second sustainability metric and the second target value for the sustainability metric; and displaying, via the GUI, a visual indication of the amount of progress made towards achieving the second target value for the second sustainability metric.

10. The method according to any of clauses 1-9, wherein the visual indication of the amount of progress made towards achieving the target value for the sustainability metric and the visual indication of the amount of progress made towards achieving the second target value for the second sustainability metric are included in a widget that is displayed within a periphery of a computer aided design workspace.

11. According to some embodiments, one or more non-transitory computer-readable storage media including instructions that, when executed by one or more processors, cause the one or more processors to perform the steps of determining a value of a sustainability metric associated with a design of an object; determining a target value for the sustainability metric; determining an amount of progress made towards achieving the target value for the sustainability metric based on the value of the sustainability metric and the target value for the sustainability metric; and displaying, via a graphical user interface (GUI), a visual indication of the amount of progress made towards achieving the target value for the sustainability metric.

12. The one or more non-transitory computer-readable storage media according to clause 11, wherein the instructions further cause the one or more processors to perform the steps of in response to determining that the value of the sustainability metric is improving relative to the target value, displaying, via the GUI, the visual indication of the amount of progress made towards achieving the target value for the sustainability metric with a first type of visual effect; and in response to determining that the value of the sustainability metric is worsening relative to the target value, displaying, via the GUI, the visual indication of the amount of progress made towards achieving the target value for the sustainability metric with a second type of visual effect, wherein the second type of visual effect is different than the first type of visual effect.

13. The one or more non-transitory computer-readable storage media according to clause 11 or clause 12, wherein displaying the visual indication of the amount of progress made towards achieving the target value for the sustainability metric with the first type of visual effect further comprises increasing a size of the visual indication in a first direction; and wherein displaying the visual indication of the amount of progress made towards achieving the target value for the sustainability metric with the second type of visual effect further comprises increasing the size of the visual indication in a second direction, wherein the second direction is different than the first direction.

14. The one or more non-transitory computer-readable storage media according to any of clauses 11-13, wherein the target value for the sustainability metric is a percentage change in the sustainability metric relative to a benchmark value.

15. The one or more non-transitory computer-readable storage media according to any of clauses 11-14, wherein the instructions further cause the one or more processors to perform the steps of determining an amount by which a component included in the design of the object contributes to the amount of progress made towards achieving the target value for the sustainability metric; and displaying, via the GUI, a visual indication of the amount by which the component included in the design of the object contributes to the amount of progress made towards achieving the target value for the sustainability metric.

16. The one or more non-transitory computer-readable storage media according to any of clauses 11-15, wherein the instructions further cause the one or more processors to perform the steps of in response to detecting a user interaction with the visual indication of the amount of progress made towards achieving the target value for the sustainability metric, displaying, via the GUI, a pop-up that includes information associated with the sustainability metric.

17. The one or more non-transitory computer-readable storage media according to any of clauses 11-16, wherein the information associated with the sustainability metric includes at least one of a timeline of changes in the value of the sustainability metric over a period of time, an absolute value for the value of the sustainability metric, or an indication of an amount by which a component included in the design of the object contributes to the value of the sustainability metric.

18. The one or more non-transitory computer-readable storage media according to any of clauses 11-17, wherein displaying the visual indication of the amount of progress made towards achieving the target value for the sustainability metric further comprises applying a visual effect to indicate a degree of uncertainty associated with the value of the sustainability metric.

19. According to some embodiments, a system comprising a memory storing a sustainability insights service; and a processor coupled to the memory. When executed by the processor, the sustainability insights service causes the processor to determine a value of a sustainability metric associated with a design of an object; determine a target value for the sustainability metric; determine an amount of progress made towards achieving the target value for the sustainability metric based on the value of the sustainability metric and the target value for the sustainability metric; and display, via a graphical user interface (GUI), a visual indication of the amount of progress made towards achieving the target value for the sustainability metric.

20. The system according to clause 19, wherein the visual indication of the amount of progress made towards achieving the target value for the sustainability metric is included in a widget that is displayed, via the GUI, within a periphery of a computer aided design workspace.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program object. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." Furthermore, aspects of the present disclosure may take the form of a computer program object embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program objects according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the figures illustrate the architecture, functionality, and operation of possible implementations of systems, methods and computer program objects according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to specific types of application data, content servers, and client devices, persons skilled in the art will appreciate that the systems and techniques described herein are applicable to other types of application data, content servers, and client devices. The foregoing description and drawings are, accordingly, to be regarded in an illustrative rather than a restrictive sense.

What is claimed is:

1. A computer-implemented method, comprising:
determining a value of a sustainability metric associated with a design of an object, wherein the design of the object comprises a three-dimensional (3D) model of the object generated using a computer-aided design application during a design phase;
determining a target value for the sustainability metric;
determining an amount of progress made towards achieving the target value for the sustainability metric based on the value of the sustainability metric and the target value for the sustainability metric; and
displaying, via a graphical user interface (GUI), a visual indication of the amount of progress made towards achieving the target value for the sustainability metric, wherein the visual indication is included in a widget that is displayed, via the GUI, within a periphery of a computer aided design workspace, wherein displaying the visual indication includes:
in response to determining that the value of the sustainability metric is improving relative to the target value, increasing a visual size of the visual indication in a first direction comprising increasing a shaded portion within a circular graph bar in the first direction; and
in response to determining that the value of the sustainability metric is worsening relative to the target value, increasing the visual size of the visual indication in a second direction comprising increasing the shaded portion within the circular graph bar in the second direction, wherein the second direction is different than the first direction; and
in response to determining that the amount of progress satisfies a predetermined target progress amount, displaying a visual indicator within the circular graph bar.

2. The method of claim 1, further comprising:
in response to determining that the value of the sustainability metric is improving relative to the target value, displaying, via the GUI, the visual indication of the amount of progress made towards achieving the target value for the sustainability metric with a first type of visual effect; and
in response to determining that the value of the sustainability metric is worsening relative to the target value, displaying, via the GUI, the visual indication of the amount of progress made towards achieving the target value for the sustainability metric with a second type of visual effect, wherein the second type of visual effect is different than the first type of visual effect.

3. The method of claim 1, wherein the target value for the sustainability metric is a percentage change in the sustainability metric relative to a benchmark value.

4. The method of claim 1, further comprising:
determining an amount by which a component included in the design of the object contributes to the amount of progress made towards achieving the target value for the sustainability metric; and
displaying, via the GUI, a visual indication of the amount by which the component included in the design of the object contributes to the amount of progress made towards achieving the target value for the sustainability metric.

5. The method of claim 1, further comprising, in response to detecting a user interaction with the visual indication of the amount of progress made towards achieving the target value for the sustainability metric, displaying, via the GUI, a pop-up that includes information associated with the sustainability metric.

6. The method of claim 5, wherein the information associated with the sustainability metric includes at least one of a timeline of changes in the value of the sustainability metric over a period of time, an absolute value for the value of the sustainability metric, or an indication of an amount by which a component included in the design of the object contributes to the value of the sustainability metric.

7. The method of claim 1, wherein displaying the visual indication of the amount of progress made towards achieving the target value for the sustainability metric further comprises applying a visual effect to indicate a degree of uncertainty associated with the value of the sustainability metric.

8. The method of claim 1, further comprising:
determining a value of a second sustainability metric associated with the design of the object, wherein the second sustainability metric is different than the sustainability metric;
determining a second target value for the second sustainability metric;
determining an amount of progress made towards achieving the second target value for the second sustainability metric based on the value of the second sustainability metric and the second target value for the sustainability metric; and
displaying, via the GUI, a visual indication of the amount of progress made towards achieving the second target value for the second sustainability metric.

9. The method of claim 8, wherein the visual indication of the amount of progress made towards achieving the second target value for the second sustainability metric is included in the widget.

10. The method of claim 1, wherein the visual indicator comprises a dot icon displayed within the circular graph bar.

11. The method of claim 1, wherein the visual indicator is displayed at one end of the circular graph bar.

12. One or more non-transitory computer-readable storage media including instructions that, when executed by one or more processors, cause the one or more processors to perform the steps of:
determining a value of a sustainability metric associated with a design of an object, wherein the design of the object comprises a three-dimensional (3D) model of the object generated using a computer-aided design application during a design phase;
determining a target value for the sustainability metric;
determining an amount of progress made towards achieving the target value for the sustainability metric based on the value of the sustainability metric and the target value for the sustainability metric; and displaying, via a graphical user interface (GUI), a visual indication of the amount of progress made towards achieving the target value for the sustainability metric, wherein the visual indication is included in a widget that is displayed, via the GUI, within a periphery of a computer aided design workspace, wherein displaying the visual indication includes:

in response to determining that the value of the sustainability metric is improving relative to the target value, increasing a visual size of the visual indication in a first direction comprising increasing a shaded portion within a circular graph bar in the first direction; and in response to determining that the value of the sustainability metric is worsening relative to the target value, increasing the visual size of the visual indication in a second direction comprising increasing the shaded portion within the circular graph bar in the second direction, wherein the second direction is different than the first direction; and in response to determining that the amount of progress satisfies a predetermined target progress amount, displaying a visual indicator within the circular graph bar.

13. The one or more non-transitory computer-readable storage media of claim 12, wherein the instructions further cause the one or more processors to perform the steps of:

in response to determining that the value of the sustainability metric is improving relative to the target value, displaying, via the GUI, the visual indication of the amount of progress made towards achieving the target value for the sustainability metric with a first type of visual effect; and in response to determining that the value of the sustainability metric is worsening relative to the target value, displaying, via the GUI, the visual indication of the amount of progress made towards achieving the target value for the sustainability metric with a second type of visual effect, wherein the second type of visual effect is different than the first type of visual effect.

14. The one or more non-transitory computer-readable storage media of claim 12, wherein the target value for the sustainability metric is a percentage change in the sustainability metric relative to a benchmark value.

15. The one or more non-transitory computer-readable storage media of claim 12, wherein the instructions further cause the one or more processors to perform the steps of:

determining an amount by which a component included in the design of the object contributes to the amount of progress made towards achieving the target value for the sustainability metric; and displaying, via the GUI, a visual indication of the amount by which the component included in the design of the object contributes to the amount of progress made towards achieving the target value for the sustainability metric.

16. The one or more non-transitory computer-readable storage media of claim 12, wherein the instructions further cause the one or more processors to perform the step of, in response to detecting a user interaction with the visual indication of the amount of progress made towards achieving the target value for the sustainability metric, displaying, via the GUI, a pop-up that includes information associated with the sustainability metric.

17. The one or more non-transitory computer-readable storage media of claim 16, wherein the information associated with the sustainability metric includes at least one of a timeline of changes in the value of the sustainability metric over a period of time, an absolute value for the value of the sustainability metric, or an indication of an amount by which a component included in the design of the object contributes to the value of the sustainability metric.

18. The one or more non-transitory computer-readable storage media of claim 12, wherein displaying the visual indication of the amount of progress made towards achieving the target value for the sustainability metric further comprises applying a visual effect to indicate a degree of uncertainty associated with the value of the sustainability metric.

19. A system comprising:

a memory storing a sustainability insights service; and a processor coupled to the memory, wherein when executed by the processor, the sustainability insights service causes the processor to:

determine a value of a sustainability metric associated with a design of an object, wherein the design of the object comprises a three-dimensional (3D) model of the object generated using a computer-aided design application during a design phase;

determine a target value for the sustainability metric;

determine an amount of progress made towards achieving the target value for the sustainability metric based on the value of the sustainability metric and the target value for the sustainability metric; and display, via a graphical user interface (GUI), a visual indication of the amount of progress made towards achieving the target value for the sustainability metric, wherein the visual indication is included in a widget that is displayed, via the GUI, within a periphery of a computer aided design workspace, wherein displaying the visual indication includes:

in response to determining that the value of the sustainability metric is improving relative to the target value, increasing a visual size of the visual indication in a first direction comprising increasing a shaded portion within a circular graph bar in the first direction; and in response to determining that the value of the sustainability metric is worsening relative to the target value, increasing the visual size of the visual indication in a second direction comprising increasing the shaded portion within the circular graph bar in the second direction, wherein the second direction is different than the first direction; and in response to determining that the amount of progress satisfies a predetermined target progress amount, display a visual indicator within the circular graph bar.

* * * * *